(12) United States Patent
Busch

(10) Patent No.: US 10,520,782 B2
(45) Date of Patent: Dec. 31, 2019

(54) DISPLAY DEVICES, SYSTEMS AND METHODS CAPABLE OF SINGLE-SIDED, DUAL-SIDED, AND TRANSPARENT MIXED REALITY APPLICATIONS

(71) Applicant: James David Busch, Tempe, AZ (US)

(72) Inventor: James David Busch, Tempe, AZ (US)

( * ) Notice: Subject to any disclaimer, the term of this patent is extended or adjusted under 35 U.S.C. 154(b) by 0 days.

(21) Appl. No.: 15/887,882

(22) Filed: Feb. 2, 2018

(65) Prior Publication Data
US 2018/0217429 A1     Aug. 2, 2018

Related U.S. Application Data

(60) Provisional application No. 62/454,020, filed on Feb. 2, 2017.

(51) Int. Cl.
| | |
|---|---|
| *G02F 1/139* | (2006.01) |
| *G02F 1/07* | (2006.01) |
| *G02B 27/00* | (2006.01) |
| *H01L 27/32* | (2006.01) |
| *G06T 19/00* | (2011.01) |

(52) U.S. Cl.
CPC .......... *G02F 1/1395* (2013.01); *G02B 27/00* (2013.01); *G02F 1/076* (2013.01); *G02F 2201/44* (2013.01); *G06T 19/006* (2013.01); *H01L 27/323* (2013.01); *H01L 27/3232* (2013.01); *H01L 27/3267* (2013.01); *H01L 2251/5323* (2013.01)

(58) Field of Classification Search
CPC .. G02F 2201/52; G02F 1/133514; G02F 1/19; G02F 2001/212; B82Y 20/00

USPC .......................................................... 359/259
See application file for complete search history.

(56) References Cited

U.S. PATENT DOCUMENTS

| | | |
|---|---|---|
| 3,037,138 A | 5/1962 | Motson |
| 5,103,328 A | 4/1992 | Numao |
| 5,357,355 A | 10/1994 | Arai |

(Continued)

FOREIGN PATENT DOCUMENTS

| | | |
|---|---|---|
| CN | 105098087 A | 11/2015 |
| DE | 102014111484 A1 | 2/2016 |

(Continued)

OTHER PUBLICATIONS

"See-through display," Wikipedia (retrieved Jan. 14, 2017).

(Continued)

*Primary Examiner* — Mohammed A Hasan
(74) *Attorney, Agent, or Firm* — James David Busch

(57) ABSTRACT

The display includes a transparent display (TD) element or layer such as at least one Transparent Organic Light Emitting Diode (TOLED) element and at least one active shutter (AS) element or layer such as a liquid crystal shutter. The AS may be opaque or transparent. The TD may be transparent or display or emit light in mixtures of color. Black may be displayed by a TD pixel by having the TD be transparent and turning an AS opaque. Each display is composed of elements that can have many states. The states can be used to create different display modes. Devices with these displays can have many form factors and configurations. These devices may change display modes based on spatial context as determined by any one of various environmental and configuration sensors.

19 Claims, 28 Drawing Sheets

(56) References Cited

U.S. PATENT DOCUMENTS

| | | |
|---|---|---|
| 5,757,139 A | 5/1998 | Forrest |
| 5,825,543 A | 10/1998 | Ouderkirk |
| 5,881,377 A | 3/1999 | Giel |
| 5,986,401 A | 11/1999 | Thompson |
| 6,088,079 A | 7/2000 | Kameyama |
| 6,288,840 B1 | 9/2001 | Perkins |
| 6,337,492 B1 | 1/2002 | Jones |
| 6,361,838 B1 | 3/2002 | Miyatake |
| 6,433,853 B1 | 8/2002 | Kameyama |
| 6,537,688 B2 | 3/2003 | Silvernail |
| 6,657,690 B2 | 12/2003 | Hashimoto |
| 6,674,504 B1 | 1/2004 | Li |
| 6,689,492 B1 | 2/2004 | Yamazaki |
| 6,831,298 B2 | 12/2004 | Park |
| 6,961,178 B2 | 11/2005 | Sugino |
| 7,030,552 B2 | 4/2006 | Chao |
| 7,034,452 B2 | 4/2006 | Kim |
| 7,106,001 B2 | 9/2006 | Kim |
| 7,164,151 B2 | 1/2007 | Yamazaki |
| 7,450,105 B2 | 11/2008 | Nakamura |
| 7,514,861 B2 | 4/2009 | Chang |
| 7,538,841 B2 | 5/2009 | Murakami |
| 7,637,648 B2 | 12/2009 | Jung |
| 7,687,983 B2 | 3/2010 | Lee |
| 7,714,904 B2 | 5/2010 | Kudoh |
| 7,772,765 B2 | 8/2010 | Park |
| 7,804,493 B2 | 9/2010 | Gettemy |
| 7,859,526 B2 | 12/2010 | Konicek |
| 7,864,270 B2 | 1/2011 | Zhuang |
| 7,916,183 B2 | 3/2011 | Kudoh |
| 8,023,080 B2 | 9/2011 | Kuo |
| 8,059,232 B2 | 11/2011 | Zhuang |
| 8,138,669 B2 | 3/2012 | Kim |
| 8,157,399 B2 | 4/2012 | Leung |
| 8,314,542 B2 | 11/2012 | Lee |
| 8,330,909 B2 | 12/2012 | Yoshida |
| 8,362,992 B2 | 1/2013 | Kuhlman |
| 8,724,304 B2 | 5/2014 | Raff |
| 8,947,627 B2 | 2/2015 | Rappoport |
| 9,282,614 B2 | 3/2016 | Yang |
| 9,316,843 B2 | 4/2016 | Ishiguro |
| 9,495,008 B2 | 11/2016 | Savastinuk |
| 9,543,364 B2 | 1/2017 | Rappoport |
| 2001/0036013 A1 | 11/2001 | Allen |
| 2002/0015120 A1 | 2/2002 | Kameyama |
| 2002/0118452 A1 | 8/2002 | Taniguchi |
| 2002/0122019 A1 | 9/2002 | Baba |
| 2003/0002296 A1 | 1/2003 | Steiner |
| 2003/0048522 A1 | 3/2003 | Liang |
| 2003/0074672 A1 | 4/2003 | Daniels |
| 2003/0189754 A1 | 10/2003 | Sugino |
| 2003/0198456 A1 | 10/2003 | Steiner |
| 2003/0210370 A1 | 11/2003 | Yano |
| 2004/0036707 A1 | 2/2004 | Willis |
| 2004/0041800 A1 | 3/2004 | Daniels |
| 2004/0043139 A1 | 3/2004 | Daniels |
| 2004/0070822 A1 | 4/2004 | Shioda |
| 2004/0108971 A1 | 6/2004 | Waldern |
| 2004/0119407 A1 | 6/2004 | Kim |
| 2004/0125430 A1* | 7/2004 | Kasajima .......... G02F 1/133536 359/247 |
| 2004/0212300 A1 | 10/2004 | Chao |
| 2004/0239243 A1 | 12/2004 | Roberts |
| 2005/0012881 A1 | 1/2005 | Liang |
| 2005/0018106 A1 | 1/2005 | Wang |
| 2005/0024339 A1 | 2/2005 | Yamazaki |
| 2005/0052342 A1 | 3/2005 | Wu |
| 2005/0146492 A1 | 7/2005 | Baba |
| 2005/0213181 A1 | 9/2005 | MacKinnon |
| 2006/0006792 A1 | 1/2006 | Strip |
| 2006/0066236 A1 | 3/2006 | Tanaka |
| 2006/0132634 A1 | 6/2006 | Kudoh |
| 2006/0152812 A1 | 7/2006 | Woodgate |
| 2006/0176541 A1 | 8/2006 | Woodgate |
| 2006/0181662 A1 | 8/2006 | Kameyama |
| 2006/0238684 A1 | 10/2006 | Kiya |
| 2006/0268208 A1 | 11/2006 | Murakami |
| 2007/0002130 A1 | 1/2007 | Hartkop |
| 2007/0080629 A1 | 4/2007 | Ko |
| 2007/0114916 A1 | 5/2007 | Chang |
| 2007/0120478 A1 | 5/2007 | Lee |
| 2007/0138941 A1 | 6/2007 | Jin |
| 2007/0159070 A1 | 7/2007 | Hu |
| 2007/0201248 A1 | 8/2007 | Jung |
| 2007/0274077 A1 | 11/2007 | MacKinnon |
| 2008/0013174 A1 | 1/2008 | Allen |
| 2008/0018732 A1 | 1/2008 | Moller |
| 2008/0062259 A1 | 3/2008 | Lipton |
| 2008/0231690 A1 | 9/2008 | Woodgate |
| 2008/0248815 A1 | 10/2008 | Busch |
| 2008/0266500 A1 | 10/2008 | Nimura |
| 2008/0297695 A1 | 12/2008 | Sekiguchi |
| 2008/0303996 A1 | 12/2008 | Morisawa |
| 2009/0091826 A1 | 4/2009 | Sugino |
| 2009/0176029 A1 | 7/2009 | Daniels |
| 2009/0201446 A1 | 8/2009 | Zhuang |
| 2009/0201447 A1 | 8/2009 | Zhuang |
| 2009/0219253 A1 | 9/2009 | Izadi |
| 2009/0273275 A1 | 11/2009 | Tyldesley |
| 2009/0278452 A1 | 11/2009 | Kim |
| 2009/0284672 A1 | 11/2009 | Baek |
| 2009/0284690 A1 | 11/2009 | Kuo |
| 2010/0013380 A1 | 1/2010 | Kim |
| 2010/0026934 A1 | 2/2010 | Sun |
| 2010/0033461 A1 | 2/2010 | Hasegawa |
| 2010/0033462 A1 | 2/2010 | Hasegawa |
| 2010/0085207 A1 | 4/2010 | Leung |
| 2010/0091207 A1 | 4/2010 | Hasegawa |
| 2010/0115407 A1 | 5/2010 | Kim |
| 2010/0125816 A1 | 5/2010 | Bezos |
| 2010/0165267 A1 | 7/2010 | Yoshida |
| 2010/0188605 A1 | 7/2010 | Hasegawa |
| 2010/0208110 A1 | 8/2010 | Kudoh |
| 2010/0233601 A1 | 9/2010 | Takimoto |
| 2010/0252825 A1 | 10/2010 | Yamazaki |
| 2010/0271394 A1 | 10/2010 | Howard |
| 2010/0277439 A1 | 11/2010 | Charlier |
| 2011/0001805 A1 | 1/2011 | Mentz |
| 2011/0001808 A1 | 1/2011 | Mentz |
| 2011/0038045 A1 | 2/2011 | Zhou |
| 2011/0057866 A1 | 3/2011 | Konicek |
| 2011/0090324 A1 | 4/2011 | Mentz |
| 2011/0096156 A1 | 4/2011 | Kim |
| 2011/0157708 A1 | 6/2011 | Kuo |
| 2011/0195354 A1 | 8/2011 | Nukada |
| 2011/0195758 A1 | 8/2011 | Damale |
| 2011/0227487 A1 | 9/2011 | Nichol |
| 2011/0255303 A1 | 10/2011 | Nichol |
| 2011/0273906 A1 | 11/2011 | Nichol |
| 2012/0049723 A1 | 3/2012 | Lee |
| 2012/0057006 A1 | 3/2012 | Joseph |
| 2012/0081524 A1 | 4/2012 | Joseph |
| 2012/0099033 A1 | 4/2012 | Ishiguro |
| 2012/0163021 A1* | 6/2012 | Bohn ................ G02F 1/133615 362/608 |
| 2012/0188637 A1 | 7/2012 | Joseph |
| 2012/0320287 A1 | 12/2012 | Kim |
| 2014/0362429 A1* | 12/2014 | Yokozeki ............ H01L 27/3232 359/267 |
| 2015/0077323 A1 | 3/2015 | Ramaswamy |
| 2015/0155344 A1 | 6/2015 | Lee |
| 2015/0295015 A1 | 10/2015 | Yu |
| 2015/0349293 A1 | 12/2015 | Park |
| 2016/0027859 A1 | 1/2016 | Kim |

FOREIGN PATENT DOCUMENTS

| | | |
|---|---|---|
| EP | 2211397 A3 | 6/2014 |
| JP | 2000098386 A | 4/2000 |
| WO | 2009100055 A3 | 8/2009 |
| WO | 2009125918 A2 | 10/2009 |
| WO | 2009125918 A3 | 10/2011 |

(56) References Cited

FOREIGN PATENT DOCUMENTS

| WO | 2015032901 A3 | 6/2015 |
|---|---|---|
| WO | 2016164184 A1 | 10/2016 |

OTHER PUBLICATIONS

"Active shutter 3D system," Wikipedia (retrieved Jan. 14, 2017).
"StereoGraphics," Wikipedia (retrieved Jan. 14, 2017).
"Crystal EYES User's Manual," StereoGraphics Corporation (2000).
Alissa Wilkinson, "Passengers is 3 movies in one, each creepier than the last," Vox (Dec. 24, 2016).
"HUD applications," Won Motors Korea Co., Ltd (retrieved Jan. 14, 2017).
Ron Mertens, "Hands on with 4D Systems 2" transparent PMOLED panel," OLED-Info (Apr. 28, 2013).
Ron Mertens, "Lenovo's S-800 uses a transparent PMOLED, probably made by TDK," OLED-Info (Apr. 21, 2011).
Vlad Savov, "Lenovo teases S800 phone with translucent color display, won't let anyone touch it," Engadget (Nov. 29, 2010).
Ron Mertens, "Indonesia's Nexian launches a mobile phone with a 2.4" transparent OLED," OLED-Info (Jul. 7, 2012).
Ron Mertens, "NeoView Kolon now offers transparent PMOLED displays and lighting panels," OLED-Info (Aug. 9, 2012).
"Samsung IceTouch," OLED-Info (Jan. 27, 2010).
Transcript of "Samsung MP3 player Ice Touch debuts at CES," YouTube Video by operationna (Jan. 8, 2010).
Screenshots from "Transparent AMOLED Display," YouTube Video by Did You Know? (Jan. 10, 2013).
Rick Martin, "TDK unveils flexible OLED display at CEATEC," New Atlas (Oct. 5, 2010).
Jeff Engelhardt, "LiM," Coroflot.com, Archive Copy from Feb. 17, 2014, as retrieved from the Internet Archive.
Jeff Engelhardt, "HP LiM—Desktop Computer with Transparent Monitor," Coroflot.com, Archive Copy from Sep. 13, 2010, as retrieved from The Internet Archive.
Beauhd, "Apple Patent Paves Way for iPhone With Full-Face Display HUD Windows," Slashdot (Jan. 10, 2017).
Robert Scoble, "Apple Strategy 2017. Very important change to iPhone Coming," VirturalRealityPop.com (Oct. 22, 2016).
Rob Waugh, "Staring death in the face: Nuclear explosion captured one ten-millionth of a second after detonation is a warped, 100ft skull," Daily Mail (Dec. 14, 2011).
"Rapitronic camera," Wikipedia (retrieved Jan. 16, 2017).
"Kerr cell shutter," Wikipedia (retrieved Jan. 16, 2017).
"Fast optical shutters," LCTec (retrieved on Jan. 18, 2017).
"FOS series model overview," LCTec (2016).
Jamy Baulan, "Choosing an Auto-Darkening Welding Helmet," Lincoln Electric (retrieved Jan. 26, 2017).
"uTOLED-20-G2 2.0" Intelligent Transparent OLED module," 4DSystems (retrieved Jan. 17, 2017).
Kiyoshi Kiyokawa, "An optical see-through display for mutual occlusion with a real-time stereovision system," Computer & Graphics 25 (2001) 765-779.
Stewart Miles, "The Samsung Transparent Smart Window makes sci-fi movies a reality," Pocket-lint (Jan. 12, 2012).
Taptl Shop (retrieved Jan. 26, 2017).
Taptl Shop Digital Glass Cooler (retrieved Jan. 26, 2017).
Transcript of "4DS transparent OLED hands on review," YouTube Video by oledinfo (Apr. 28, 2013).
TOLED (transparent OLED), ITWissen.info (retrieved Jan. 26, 2017).
OLED, Wikipedia (retrieved Jan. 26, 2017).
Organic Light Emitting Diodes (OLEDS), Universal Display Corporation (retrieved Jan. 26, 2017).
Flexible OLEDS (FOLEDS), Universal Display Corporation (retrieved Jan. 26, 2017).
Transparent OLEDS (TOLEDS), Universal Display Corporation (retrieved Jan. 26, 2017).
"White OLEDs (WOLEDs)," Universal Display Corporation (retrieved Jan. 26, 2017).
"Augmented reality," Wikipedia (retrieved Jan. 26, 2017).
"Transparent Display," Kent Optoronics (retrieved Jan. 26, 2017).
"InfoGlazing Transparent Display," Kent Optronics (retrieved on Feb. 2, 2017).
"Custom Solutions," Kent Optronics (retrieved Jan. 26, 2017).
"AMOLED," Wikipedia (retrieved Jan. 26, 2017).
"OLED: Felxible devices, transparent screens and organic lamps," Venturing Mind (retrieved Jan. 26, 2017).
"Transparent OLED Display Module," Nuts and Volts (retrieved Jan. 26, 2017).
"PMOLED (Passive Matrix OLED): introduction and basics," OLED-Info (retrieved Jan. 26, 2017).
"TDK starts mass production of a transparent 2.4" QVGA PMOLEDs," OLED-Info (retrieved Jan. 26, 2017).
"Flexible OLEDs: introduction, applications and market status," OLED-Info (retrieved Jan. 26, 2017).
"Transparent OLEDs: introduction and market status," OLED-Info (retrieved Jan. 26, 2017).
"OLED technology: introduction and basics," OLED-Info (retrieved Jan. 26, 2017).
"OLED introduction and basic OLED information," OLED-Info (retrieved Jan. 26, 2017).
"Technology," Visionox OLED (retrieved Jan. 26, 2017).
"OLED Technology," Visionox OLED (retrieved Jan. 26, 2017).
"OLED Process," Visionox OLED (retrieved Jan. 26, 2017).
"Future Display," Visionox OLED (retrieved Jan. 26, 2017).
"Liquid-crystal display," Wikipedia (retrieved Jan. 26, 2017).
"Active-matrix liquid-crystal display," Wikipedia (retrieved Jan. 26, 2017).
"Thin-film-transistor liquid-crystal display," Wikipedia (retrieved Jan. 26, 2017).
"LCD Shutters," Liquid Crystal Technologies (retrieved Jan. 26, 2017).
"Active Domain LCD Shutter," Liquid Crystal Technologies (retrieved Jan. 26, 2017).
"Driving a Liquid Crystal Shutter," Liquid Crystal Technologies (retrieved Jan. 26, 2017).
"LCD Shutters Frequently Asked Questions," Liquid Crystal Technologies (retrieved Jan. 26, 2017).
Dejan Karadaglic, "Single LED Takes on Both Light-Emitting and Detecting Duties," Electronic Design (Jul. 19, 2007).
"Screenshots of Selected Portions of Passengers—Official Trailer (HD)," YouTube 7BWWWQzTpNU (Sep. 20, 2016).
Tracy Wilson et al., "How the iPhone Works," HowStuffWorks (retreived Jan. 27, 2017).
Mario, Aguilar, "How Amazon's Fire Phone Cameras Know Where Your Face Is Even at Night," Gizmodo (Jun. 19, 2014).
"PenTile matrix family," Wikipedia (retrieved Jan. 26, 2017).
Heo, Joon et al., "Fast-switching initially-transparent liquid crystal light shutter with crossed patterned electrodes," AIP Advances 5, 047118 (Apr. 2015).
"iPhone," Wikipedia (retrieved Jan. 27, 2017).
"Accelerometer," Wikipedia (retrieved Jan. 27, 2017).
"Gyroscope," Wikipedia (retrieved Jan. 27, 2017).
"Magnetometer," Wikipedia (retrieved Jan. 27, 2017).
"Inertial measurement unit," Wikipedia (retrieved Jan. 27, 2017).
"Quaternion," Wikipedia (retrieved Jan. 27, 2017).
"Kalman filter," Wikipedia (retrieved Jan. 27, 2017).
"Proximity sensor," Wikipedia (retrieved Jan. 27, 2017).
"Photodetector," Wikipedia (retrieved Jan. 27, 2017).
"Fingerprint recognition," Wikipedia (retrieved Jan. 27, 2017).
"Broadcast automation," Wikipedia (retrieved Jan. 27, 2017).
"Audience measurement," Wikipedia (retrieved Jan. 27, 2017).
"Subaudible tone," Wikipedia (retrieved Jan. 27, 2017).
"QR code," Wikipedia (retrieved Jan. 27, 2017).
"Touchscreen," Wikipedia (retrieved Jan. 27, 2017).
"Resistive touchscreen," Wikipedia (retrieved Jan. 27, 2017).
"Capacitive sensing," Wikipedia (retrieved Jan. 27, 2017).
"Cellular network," Wikipedia (retrieved Jan. 27, 2017).
"Wi-Fi," Wikipedia (retrieved Jan. 27, 2017).
"Bluetooth," Wikipedia (retrieved Jan. 27, 2017).

(56) References Cited

OTHER PUBLICATIONS

"Bluetooth low energy," Wikipedia (retrieved Jan. 27, 2017).
"ISM band," Wikipedia (retrieved Jan. 27, 2017).
"Near field communication," Wikipedia (retrieved Jan. 27, 2017).
"Radio-frequency identification," Wikipedia (retrieved Jan. 27, 2017).
"Mesh networking," Wikipedia (retrieved Jan. 27, 2017).
"Microphone," Wikipedia (retrieved Jan. 27, 2017).
"Microphone array," Wikipedia (retrieved Jan. 27, 2017).
"Active nosie control," Wikipedia (retrieved Jan. 27, 2017).
"Sound localization," Wikipedia (retrieved Jan. 27, 2017).
"Acoustic location," Wikipedia (retrieved Jan. 27, 2017).
"Acoustic source localization," Wikipedia (retrieved Jan. 27, 2017).
"Speech recognition," Wikipedia (retrieved Jan. 27, 2017).
"Computer speaker," Wikipedia (retrieved Jan. 27, 2017).
"Speech synthesis," Wikipedia (retrieved Jan. 27, 2017).
"Artificial intelligence," Wikipedia (retrieved Jan. 27, 2017).
"OpenAI," Wikipedia (retrieved Jan. 27, 2017).
"Documentation," OpenAI Gym (retrieved Jan. 27, 2017).
"Computer vision," Wikipedia (retrieved Jan. 27, 2017).
"OpenCV," Wikipedia (retrieved Jan. 27, 2017).
"The OpenCV Reference Manual Release 2.4.13.2," OpenCV (Jan. 27, 2017).
"The OpenCV Tutorials Release 2.4.13.2," OpenCV (Jan. 27, 2017).
"The OpenCV User Guide Release 2.4.13.2," OpenCV (Jan. 27, 2017).
"Apple motion coprocessors," Wikipedia (retrieved Jan. 27, 2017).
"Barometer," Wikipedia (retrieved Jan. 27, 2017).
"Compass" Wikipedia (retrieved Jan. 27, 2017).
"Tango (platform)," Wikipedia (retrieved Jan. 27, 2017).
"Duty cycle," (retrieved Jan. 27, 2017).
"Global Positioning System," Wikipedia (retrieved Jan. 27, 2017).
"Galileo (satellite navigation)," Wikipedia (retrieved Jan. 27, 2017).
"GLONASS," Wikipedia (retrieved Jan. 27, 2017).
"BeiDou Navigation Satellite System," Wikipedia (retrieved Jan. 27, 2017).
"Assisted GPS," Wikipedia (retrieved Jan. 27, 2017).
"Hybrid positioning system," Wikipedia (retrieved Jan. 27, 2017).
"GPS navigation device," Wikipedia (retrieved Jan. 27, 2017).
"Satellite navigation," Wikipedia (retrieved Jan. 27, 2017).
"Indoor positioning system," Wikipedia (retrieved Jan. 27, 2017).
"Bluetooth low energy beacon," Wikipedia (retrieved Jan. 27, 2017).
"IBeacon," Wikipedia (retrieved Jan. 27, 2017).
"Mobile phone tracking," Wikipedia (retrieved Jan. 27, 2017).
"Positioning system," Wikipedia (retrieved Jan. 27, 2017).
"Wi-Fi positioning system," Wikipedia (retrieved Jan. 27, 2017).
"Proximity marketing," Wikipedia (retrieved Jan. 27, 2017).
"Multilateration," Wikipedia (retrieved Jan. 27, 2017).
"Optical head-mounted display," Wikipedia (retrieved Jan. 27, 2017).
"Smartglasses," Wikipedia (retrieved Jan. 27, 2017).
"Smart Glasses MOVERIO BT-300 User's Guide," Seiko Epson Corporation (Nov. 2016).
"Microsoft HoloLens," Wikipedia (retrieved Jan. 27, 2017).
"List of all pages in the Windows Holographic documentation as of May 31, 2016," Microsoft Windows Dev Center (retrieved Jan. 27, 2017).
"App model," Microsoft Windows Dev Center (retrieved Jan. 27, 2017).
"App views on HoloLens," Microsoft Windows Dev Center (retrieved Jan. 27, 2017).
"Coordinate systems," Microsoft Windows Dev Center (retrieved Jan. 27, 2017).
"Designing for mixed reality," Microsoft Windows Dev Center (retrieved Jan. 27, 2017).
"Gesture design," Microsoft Windows Dev Center (retrieved Jan. 27, 2017).
"Gaze targeting," Microsoft Windows Dev Center (retrieved Jan. 27, 2017).
"Gaze," Microsoft Windows Dev Center (retrieved Jan. 27, 2017).
"Getting a HolographicSpace," Microsoft Windows Dev Center (retrieved Jan. 27, 2017).
"HoloLens Hardware details," Microsoft Windows Dev Center (retrieved Jan. 27, 2017).
"Hologram," Microsoft Windows Dev Center (retrieved Jan. 27, 2017).
"Mixed reality capture for developers," Microsoft Windows Dev Center (retrieved Jan. 27, 2017).
"Spatial mapping," Microsoft Windows Dev Center (retrieved Jan. 27, 2017).
"Working with holograms," Microsoft Windows Dev Center (retrieved Jan. 27, 2017).
"What can I do with HoloLens offline," Microsoft Windows Dev Center (retrieved Jan. 27, 2017).
"Holograms 101," Microsoft Windows Dev Center (retrieved Jan. 27, 2017).
Ron Mertens, "Re: [Website feedback] 4DS transparent OLED," OLED-Info (Feb. 2, 2017).
"Layar," Wikipedia (retrieved Jan. 30, 2017).
"PARk Version 1.0.2," Apple (Jun. 26, 2012).
"BRSunTracker 1.0.1," CocoaPods (retrieved Jan. 30, 2017).
"SunPos.h," psa.es/sdg/archive (retrieved Jan. 30, 2017).
Broco, "Compare device 3D prientation with the sun position," Stack Overflow (Jan. 21, 2014).
"Outline of object recognition," Wikipedia (retrieved Jan. 30, 2017).
"Text messaging," Wikipedia (retrieved Jan. 30, 2017).
"Camera phone," Wikipedia (retrieved Jan. 30, 2017).
"HTC Vive," Wikipedia (retrieved Jan. 30, 2017).
"Oculus Rift," Wikipedia (retrieved Jan. 30, 2017).
"Encryption," Wikipedia (retrieved Jan. 30, 2017).
"Symmetric-key algorithm," Wikipedia (retrieved Jan. 30, 2017).
"Public key cryptography," Wikipedia (retrieved Jan. 30, 2017).
"Hypertext Transfer Protocol," Wikipedia (retrieved Jan. 30, 2017).
"Database," Wikipedia (retrieved Jan. 30, 2017).
"Create, read, update and delete," Wikipedia (retrieved Jan. 30, 2017).
"Representational state transfer," Wikipedia (retrieved Jan. 30, 2017).
"JSON," Wikipedia (retrieved Jan. 30, 2017).
"GeoJSON," Wikipedia (retrieved Jan. 30, 2017).
"Eye tracking," Wikipedia (retrieved Jan. 31, 2017).
"Basics of LCD Operation," Liquid Crystal Technologies (retrieved Jan. 30, 2017).
"Twisted nematic field effect," Wikipedia (retrieved Jan. 30, 2017).
"Pi Cell," Liquid Crystal Technologies (retrieved Jan. 30, 2017).
"Kerr effect," Wikipedia (retrieved Jan. 30, 2017).
"Samsung Display reportedly decided to halt transparent OLED production," OLED-Info (Jul. 27, 2016).
"LucidVue—Transparent OLED," Crystal Display Solutions (retrieved Jan. 18, 2017).
Terri Bassitt, "Futaba exhibits Transparent OLED Displays at this year's CEATEC (Combined Exhibition of Advanced Technologies)," LinkedIn (Oct. 26, 2016).
"2.0" Transparent OLED Display microOLED GOLDELOX Module uTOLED-20-G2 Revision 1.2," 4D Systems (May 22, 2013).
"Product Brief 2.0" microTOLED Intelligent GOLDELOX Display Module uTOLED-20-G2 Revision 1.0," 4D Systems (2012).
"SwitchLite Privacy Glass," Pulp Studio (retrieved Jan. 26, 2017).
Chris Ziegler, "Sony Ericsson Xperia Pureness hands-on," Engadget (Dec. 30, 2009).
Transcript and Selected Screenshots of "Transparent Displays at MIT," YouTube Video (Jan. 21, 2014).
Anirudh Sharma, "Augmenting a traditional ruler with digital functionality," anirudh.me (2013).
"Smart glass," Wikipedia (retrieved Feb. 1, 2017).
"Setup for All Unity Tango Apps," Tango Unity SDK Google Developers (Jan. 13, 2017).
"Unity How-to Guide: Simple Augmented Reality," Tango Unity SDK Google Developers (Jan. 12, 2017).
"Unity How-to Guide: Placing Virtual Objects in Augmented Reality," Tango Unity SDK Google Developers (Jan. 12, 2017).

(56) References Cited

OTHER PUBLICATIONS

"Unity How-to Guide: Meshing with Color," Tango Unity SDK Google Developers (Jan. 14, 2017).
"Tango with Cardboard," Tango Unity SDK Google Developers (Jun. 9, 2016).
"Unity How-to Guide: Depth Perception," Tango Unity SDK Google Developers (Jan. 12, 2017).
"Unity How-to Guide: Motion Tracking," Tango Unity SDK Google Developers (Jan. 12, 2017).
"Unity How-to Guide: Area Learning," Tango Unity SDK Google Developers (Jan. 12, 2017).
"ZenFone AR (ZS571KL) Phone," ASUS Global (retrieved Feb. 2, 2017).
Ron Amadeo, "Amazon's 3D Kindle Phone to use Omron face-tracking," Ars Technica (Jun. 6, 2014).
"Retrieving Head-Tracking Data Using Native Code," Amazon Apps & Services Developer Portal (retrieved Feb. 2, 2017).
"Understanding the Native-Code HeadTracking API," Amazon Apps & Services Developer Portal (retrieved Feb. 2, 2017).
"3D camera," Wikipedia (retrieved Feb. 2, 2017).
"Range imaging," Wikipedia (retrieved Feb. 2, 2017).
"Stereo camera," Wikipedia (retrieved Feb. 2, 2017).
"Time-of-flight camera," Wikipedia (retrieved Feb. 2, 2017).
"Depth perception," Wikipedia (retrieved Feb. 2, 2017).
Jean-Pierre Distler, "Augmented Reality iOS Tutorial: Location Based," Ray Wenderlich (Jan. 23, 2017).
"Core Location," Apple Developer Documentation (Mar. 21, 2016).
Nate Cook, "CMDeviceMotion," NSHipster (Oct. 28, 2014).
"Core Motion," Apple Developer Documentation (retrieved Feb. 2, 2017).
"Motion Events," Apple Developer Documentation (Mar. 21, 2016).
"3D projection," Wikipedia (retrieved Feb. 2, 2017).
"Vector projection," Wikipedia (retrieved Feb. 2, 2017).
Andrejs Treibergs, "The Geometry of Perspective Drawing on the Computer," University of Utah Department of Mathematics (retrieved Feb. 2, 2017).
Allan Jepson, "CSC420: Image Projection (Slides)," University of Toronto Department of Computer Science (Sep. 2011).
"Transformation matrix," Wikipedia (retrieved Feb. 2, 2017).
"Camera matrix," Wikipedia (retrieved Feb. 2, 2017).
Robert Collins, "Lecture 12: Camera Projection," CSE486, Penn. State (retrieved Feb. 2, 2017).
Jason McKessen, "Chapter 4 of Learning Modern Graphics Programming; Objects at Rest, Perspective Projection" Paroj.Github.io (2012).
"HeadTrackingConfiguration Class Reference," Native HeadTracking API for Fire Phone, Amazon Apps & Services Developer Portal (retrieved Feb. 2, 2017).
"HeadTrackingEvent Class Reference," Native HeadTracking API for Fire Phone, Amazon Apps & Services Developer Portal (retrieved Feb. 2, 2017).
"HeadTrackingManager Class Reference," Native HeadTracking API for Fire Phone, Amazon Apps & Services Developer Portal (retrieved Feb. 2, 2017).
"HeadTrackingPoller Class Reference," Native HeadTracking API for Fire Phone, Amazon Apps & Services Developer Portal (retrieved Feb. 2, 2017).
"Light field," Wikipedia (retrieved Feb. 2, 2017).
"Light field camera," field camera (retrieved Feb. 2, 2017).
"Lytro," Wikipedia (retrieved Feb. 2, 2017).
Osian Haines, "An Introduction to Simultaneous Localisation and Mapping," Kudan Conputer Vision (May 13, 2016).

* cited by examiner

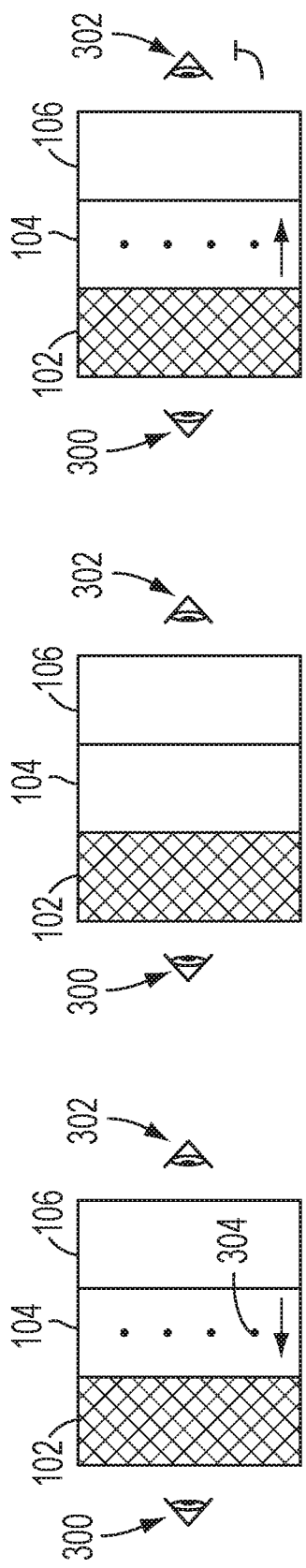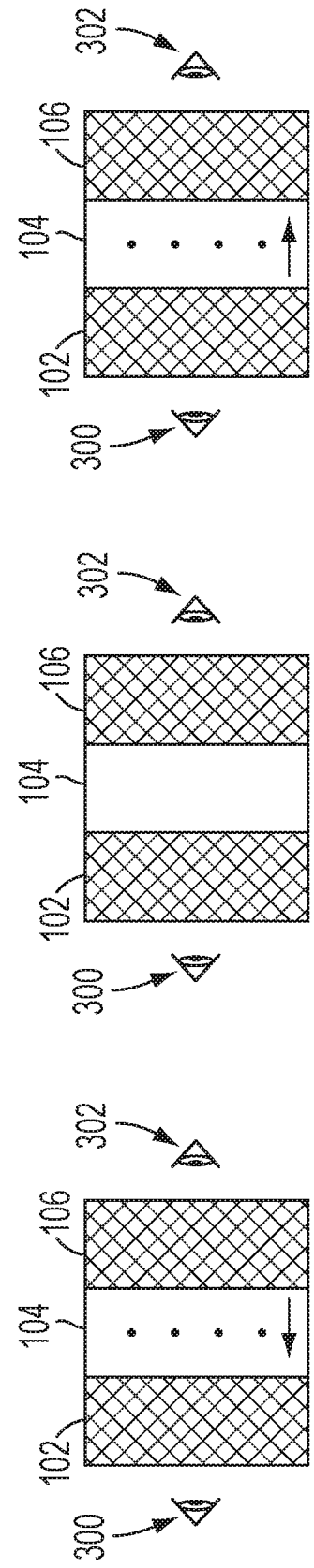

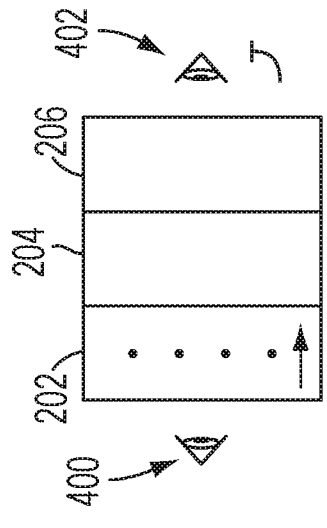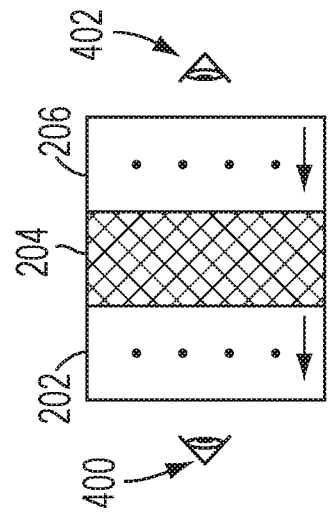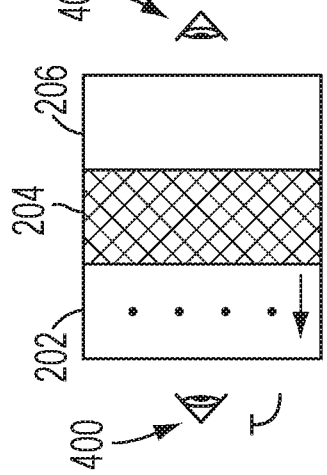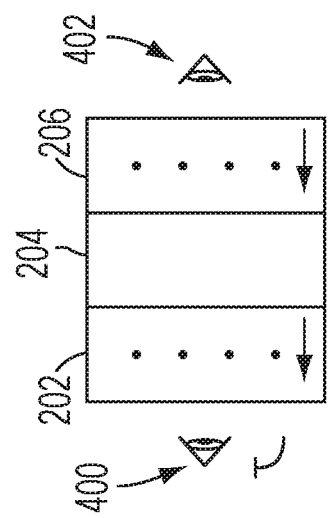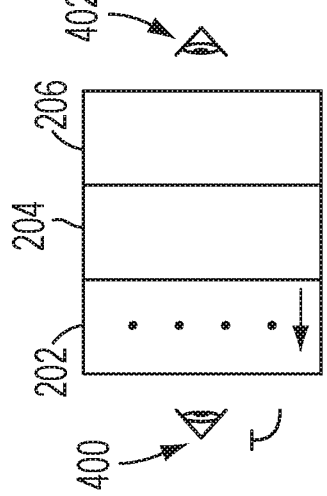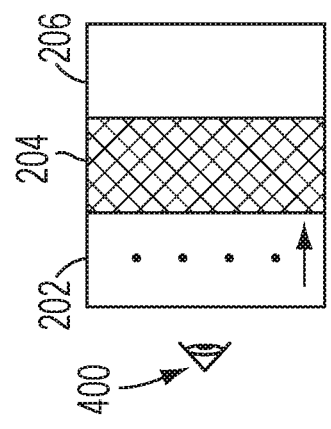

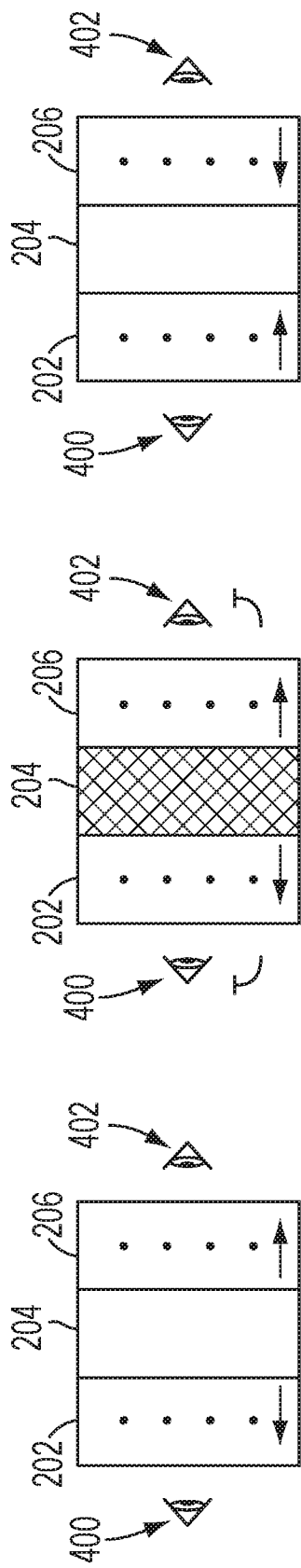
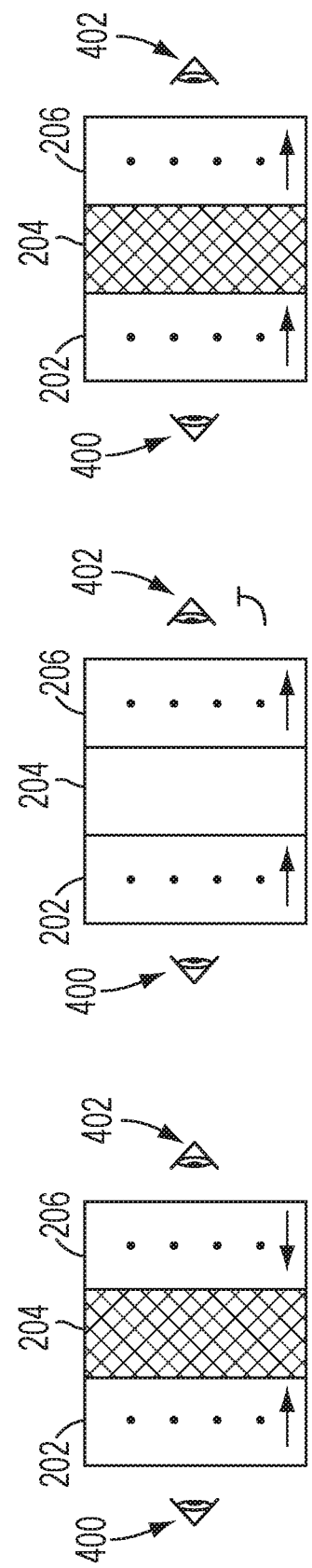

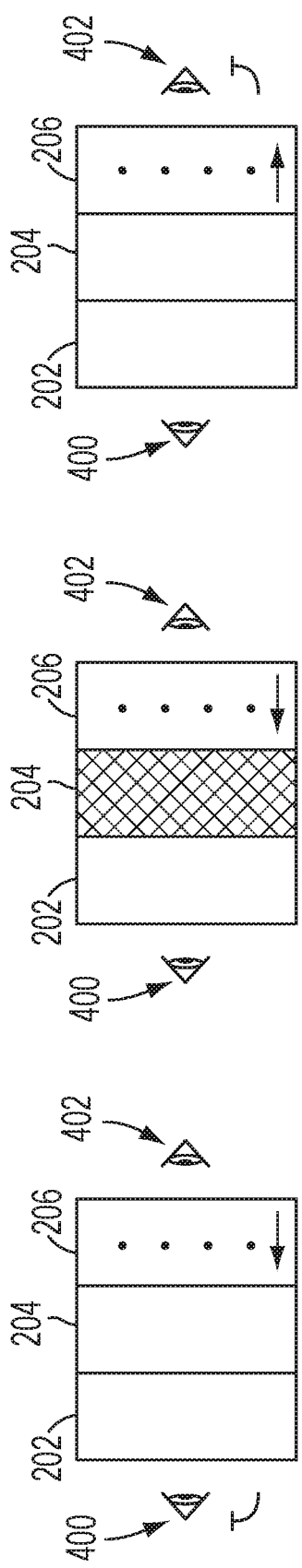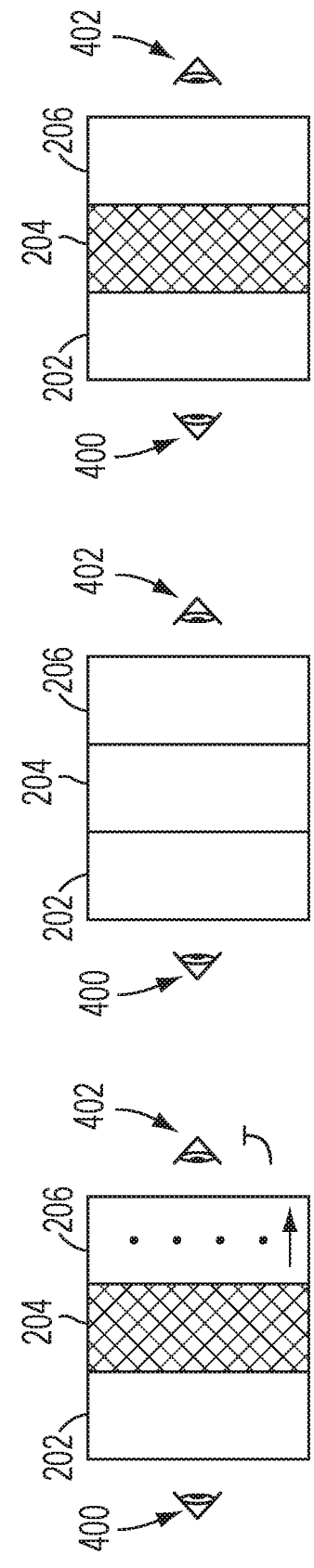

| Screen Orientation Based on User's Eye Orientation and Device Orientation | Horizontal Up 1304 | Vertical Left 1304 | Horizontal Down 1306 | Vertical Right 1308 |
|---|---|---|---|---|
| Bottom Down 1310 | Portrait Up to Top of Device 1312 | Landscape Up to Left of Device 1314 | Portrait Up to Bottom of Device 1316 | Landscape Up to Right of Device 1318 |
| Left Down 1320 | Landscape Up to Right of Device 1322 | Portrait Up to Top of Device -OR- Landscape Up to Right of Device 1324 | Landscape Up to Left of Device 1326 | Portrait Up to Bottom of Device -OR- Landscape Up to Right of Device 1328 |
| Top Down 1330 | Portrait Up to Bottom of Device 1332 | Landscape Up to Right of Device 1334 | Portrait Up to Top of Device 1336 | Landscape Up to Left of Device 1338 |
| Right Down 1340 | Landscape Up to Left of Device 1342 | Portrait Up to Bottom of Device -OR- Landscape Up to Left of Device 1344 | Landscape Up to Right of Device 1346 | Portrait Up to Top of Device -OR- Landscape Up to Left of Device 1348 |

FIG. 13

DISPLAY DEVICES, SYSTEMS AND METHODS CAPABLE OF SINGLE-SIDED, DUAL-SIDED, AND TRANSPARENT MIXED REALITY APPLICATIONS

CROSS REFERENCE TO RELATED APPLICATIONS

This application claims the benefit of U.S. Provisional Application 62/454,020, filed Feb. 2, 2017, which is herein incorporated by reference in its entirety.

BACKGROUND

1. Field of the Invention

The invention generally relates to displays and electronic devices that may appear to be translucent or transparent (e.g., see-through) and/or display an image or augmented or mixed reality annotation. These devices can display the same or different images on one or both sides of a display and maintain user privacy on occasions where it is not desirable to show images on one side of a display. The display may appear to become opaque, or may appear to remain transparent or translucent and only show an image on one side of the screen. The devices may also be used for augmented or mixed reality applications.

Some forms of the invention are achieved by, for example, placing a transparent display device (e.g., such as a Transparent Organic Light Emitting Diode (TOLED) or other display element (such as any other type of emissive element)) directly or indirectly adjacent to an active shutter (e.g., an electronically actuated element that can block light transmission or pass light (e.g., a liquid crystal shutter)), by placing a transparent display between two active shutters, or by placing an active shutter substantially between two transparent displays.

The electronically actuated elements are operate in conjunction with one another to provide a transparent view, display light, or block light appropriate image for viewers on each side of the device as desired.

2. Description of Related Materials

To reduce the complexity and length of the Detailed Specification, and to fully establish the state of the art in certain areas of technology, Applicant herein expressly incorporates by reference all the following materials identified in each numbered paragraph below. The Cite Numbers referred to herein are set forth in the Information Disclosure Statement (IDS) filed contemporaneously with this application and incorporated by reference herein.

The related art shows the novel and non-obvious nature of the present invention including secondary considerations of non-obviousness such as the long-felt need and failure of others to achieve the present invention. All referenced materials are herein incorporated by reference in its entirety.

2.A. Display Technology Including See-Through Displays.

"A see-through [or transparent] display is an electronic display that allows the user to see what is shown on the glass screen while still being able to see through it." See Cite. No. D001. A transparent display may be made using LCD or LED technology. Id.

In retail applications, transparent displays are used in shopping windows to show the product inside as well as to show text or advertisements on the glass. For example, the Samsung Smart Window is a transparent LCD meant to act as both a window and smart device capable of using apps and widgets, as well as connecting to the internet. See Cite No. D038. To prevent people outside the window from seeing what a user of the screen is doing, Samsung attached a privacy screen to the reverse side that acts like a one-way mirror. See Cite No. D028. Thus, the see-through display is only able to be viewed from one side, while the other side is permanently masked by a one-way mirror.

Other devices incorporating see-through display elements are discussed in Cite Nos. D029, D030, D001, D027, and U.S. Publication 20110157708.

Example See-Through Display Elements.

See-through displays may be made of many types of display technologies including: Liquid-crystal Display (Cite No. D055), Active Matrix LCD (AMLCD) (Cite No. D056), TFT LCD (Cite No. D057), OLED Technology (Cite Nos. D034, D049, D050, and D037), Flexible OLED (FOLED) (Cite Nos. D035 and D047), Active-Matrix Organic Light-Emitting Diode (AMOLED) (Cite Nos. D042, D066), Passive-Matrix Organic Light-Emitting Diode (PMOLED) (Cite Nos. D045, D015, and D046), and Transparent Organic Light Emitting Diode/Display (TOLED) (Cite Nos. D032, D033, D036, D044, D048), and Quantum Dot Organic Light Emitting Diodes (QLEDs).

Unlike standard OLEDs, TOLEDs are transparent when all layers—the substrate, the anode, the hole-transporting layer, the emissive polymer layer and the cathode are transparent in the inactive state. A transparent OLED in the active state emits light in both directions and exits at the front and the back of the screen. The viewers can observe the display on both sides. However, the image on one side will be the mirror of the image on the other side. Such TOLED can be used as active matrix OLED (AMOLED) and as a passive matrix OLED be constructed (PMOLED). The TOLED technique can be used for head-up displays and large format OLED displays. See Cite No. D032.

Transparent OLEDs use transparent or semi-transparent contacts on both sides of the device to create displays that can be made to be both top and bottom emitting (transparent). TOLEDs can greatly improve contrast, making it much easier to view displays in bright sunlight. This technology can be used in Head-up displays, smart windows or augmented reality applications and has purportedly been used (with a black, light absorbing backing). See Cite No. D033. Other aspects of OLED display devices are discussed in Cite No. D067 and U.S. Pat. No. 5,986,401.

Example See-Through Display Devices.

Many other concepts companies have developed products utilizing transparent displays as well.

Concept and other fictional devices in television and movies illustrate the shortcomings of the current technology, and the failure of others to develop solutions to the problems described and solved by Applicant herein. See Cite Nos. D043, D016, D017, D005, D063 (showing mirror image of display on back), D183, D014, and D184.

There have also been several concept or commercially available devices incorporating see-through displays. See Cite Nos. D006, D008. D009 (Lenovo announced the S-800 in November 2010 and utilized a transparent PMOLED screen), D010 ("Indonesian phone maker Nexian launched a new phone called the Nexian Glaze M-9090 which sports a 2.4 inch transparent OLED."), and D011 ("NeoView offers four different transparent PMOLEDs: 2.41 in 240×342, 16M-colors panels, a 1.98 in 128×160 panel (262K colors) and monochrome (blue or white) 1.3 in panels.")

In 2010, the Samsung IceTouch MP3 Player was allegedly the world's first product with a Transparent OLED Display. See Cite No. D012. A video of the Samsung IceTouch shows that the transparent display shows an image on both sides of the screen, and that the touch screen interface is accessible from both sides of the screen. However, the display on the back side of the screen is reversed so that text and images are displayed backward. See Cite No. D013 at 0:21 (showing the front of the screen displaying the word "Pictures") and D031 at 0:22 (showing the back of the screen displaying the mirror image of the word "Pictures"). See also D013 at 1:09 (showing "Maroon 5 If I Never") and D013 at 1:13 (showing the mirror image of the Maroon 5 album art and text). The Samsung IceTouch was discontinued and no substitute product was made available.

Sony Ericsson's Xperia Purness phone included a transparent display. D182. Reviews of the phone are illustrative of its problems: "Occasionally, a phone exists simply because it can. Not because it's powerful; not because it offers amazing bang for the buck; not because the manufacturer negotiated some lucrative exclusivity agreement with a major carrier, and certainly not because it's introducing some groundbreaking new smartphone operating system. Yeah—not even Sony Ericsson is attempting to frame or formulate a legitimate business case for the sinfully hedonistic Xperia Pureness, because they don't have to. One look at that wild transparent display and you'll either be smitten or confused and dismayed by the $1,000 sticker price. It's that simple. Anyhow, we've just taken delivery of a Pureness today and have had a few fleeting moments to check it out. If it weren't for the screen, you'd be looking at a $30 prepaid candybar here—you don't have a camera, a high-res display, or any sexy metal or soft-touch bits to give the phone a premium feel. The UI is about the simplest possible incarnation of Sony Ericsson's typical dumbphone platform, owing largely to the fact that the display's just grayscale; you've got an FM radio (with a headset attached) and a basic music player and browser, but if you're in North America, don't expect any 3G." See Cite No. D182. Again, the product was discontinued, and no substitute product made available.

Samsung also recently discontinued larger transparent displays it planned to produce citing lack of demand. See Cite No. D176. ("Samsung Display announced its 55" mirror and transparent OLED displays back in June 2015, and later announced that it will start shipping those displays in Q2 2016. TechRadar today claims that Samsung decided not to produce these transparent displays after all, because there was not enough demand to justify the investment. This is not confirmed yet, but it may be that Samsung could not make these displays at attractive enough prices due to low yields and high production costs.")

To date there has been little commercial demand for transparent or OLED display panels, because the applications have been frivolous. "While a transparent OLEDs is very cool and innovative, it's not clear what are the real applications for this. Having a novelty phone or MP3 player with a transparent display is nice, but it's not really useful, is it? One possible application is embedding such panels in transparent glass used in windows. I'm not sure if this particular OLED is useful for this, but maybe. In any case I'm pretty sure some creative designers will find great and fun applications for transparent OLEDs." See Cite No. D007. As noted in an industry article regarding the Sony Ericsson Xperia Purness, many applications have been frivolous by not improving the usefulness of a device but have significantly increased the price.

Historically, there have been various suppliers of display elements discussed above as discussed in the following references. See Cite Nos. D051, D052, D053, D054, D177, D178, D015, D026, D179, D180, D031, and D007. However, due to the above and similar market failures, there is no current supply of transparent OLED panels available for prototyping. According to Ron Mertens, CEO and Editor-In-Chief of OLED-Info.com, as of Feb. 2, 2017, "4D5 is not making [uTOLED-20] panels any more, and we do not have any to offer." See, e.g., Cite No. D007. Mr. Mertens also stated "as far as I know currently there are no comparable displays on offer." Cite No. D151.

There is a need for a better use transparent display technology.

2.B Active Shutters.

Active shutters are elements which has the property of becoming opaque when voltage or other control signal is applied (or removed), being otherwise transparent. Active Shutters may be made using liquid crystal technology. Some types of active shutter elements are discussed in the following references: Cite Nos. D059, D060, D061, D172, D173, and D174.

AS elements have been used to make various things such as: Camera shutters (See Cite Nos. D020, D021, D022, D175), Auto-Darkening Welding Helmets (See Cite No. D025), Privacy Windows/Smart Glass/Privacy Glass/Switchable Glass/Smart Windows/Switchable Windows (See Cite Nos. D181, D185), Black & White Transparent Displays (See Cite No. D040), and Active Shutter Glasses for 3D Television and Computer Games (See Cite Nos. D002, D003, and D004).

Regarding active shutter glasses, "[a]n active shutter 3D system (a.k.a. alternate frame sequencing, alternate image, AI, alternating field, field sequential or eclipse method) is a technique of displaying stereoscopic 3D images. It works by only presenting the image intended for the left eye while blocking the right eye's view, then presenting the righteye image while blocking the left eye and repeating this so rapidly that the interruptions do not interfere with the perceived fusion of the two images into a single 3D image." Cite No. D002.

There are several suppliers of Active Shutter elements. Liquid Crystal Technologies (See Cite No. D058), LCTech (See Cite Nos. D023, D024), and Kent Optoelectronics Liquid Crystal Display LCS (See Cite Nos. D039, and D041).

There is a need to use active shutters in new ways that enable more beneficial use of transparent displays.

It would be beneficial to have a device that utilized a transparent display in conjunction with an active shutter that could achieve, for example, any one or combination of the following exemplary benefits:

(1) maintain user privacy so that an image is not displayed on the back of the device when the user wants to prevent others from seeing what is being done on the device, and also be configured to utilize the back of the display when desirable;

(2) display any color state including white, black in any state of opacity including opaque and transparent;

(3) display on an image on one side of the screen in a proper orientation while obtaining the benefits of increased contrast of such displays with a dark backing, while also enabling the display to be used in a transparent mode for mixed reality and other similar applications;

(4) display an image on both sides of the screen in a proper orientation so that two users can view the device simultaneously from different sides; or, (5) any other benefit.

It would also be beneficial to further combine the transparent display and active shutter device with other technologies to improve utility and functionality based on this physical context of the device, usage patterns of the device, and other information.

2.0 Other Technologies

Any type of the below technologies, substitutions for those technologies, or new types of technologies with similar functionality may be used with any form of the invention.

Touch Sensing and Multi-Touch Sensing are discussed in Cite Nos. D082, D083 (resistive sensing), D064 and D084 (capacitive sensing), D062 (using emissive elements to sense light or touch input instead of emit light), See also, e.g., U.S. Patent Publication 20110057866 (use the emissive elements to sense touch input, or to digitize data). Edge sensors around the phone may also be used to detect hand position, or hand position may also be detected using touch screen with any form of the invention.

Determining a user's face or eye position relative to a screen, and gaze tracking, are discussed in Cite Nos. D065, D195, D196, D197, D216, D217, D218, D219, D171, and U.S. Patents and Publications U.S. Pat. No. 9,495,008, 20150077323, and 20100125816.

Various sensors and related units, algorithms, measurements and technologies are discussed in Cite Nos. D068, D069 (accelerometer), D070 (gyroscope), D071 (magnetometer), D072 (IMU), D073 (quaternion), D074 (Kalman filter), D075 (proximity sensor), D076 (photodetector), D077 (fingerprint recognition), D110 (motion coprocessor), D111 (barometer), D112 (compass), D198 (stereo or 3D camera), D199 (range imaging), D200 (stereo camera), D201 (time-of-flight camera), D202 (depth perception), D220 (light field), D221 (light field camera), D222 (Lytro), D223 (simultaneous localization and mapping) and D113 (Tango platform). In particular, the Tango augmented reality computing platform incorporates (1) Motion Tracking using visual data based on a fisheye camera to identify visual features (feature tracking), inertial data based on an IMU; (2) Area Learning by maintaining an area description file so that a device can recall if it has been in an area before; and (3) Depth Perception using infra-red structured light, time of flight, and a stereo camera.

Orientation and motion detection are discussed Cite Nos. D205, D206, D207.

Position tracking is discussed in Cite Nos. D115 (Global Positioning System), D116 (Galileo Positioning System), D117 (GLONASS), D118 (BeiDou navigation), D119 (assisted GPS), D120 (hybrid positioning system), D121 (GPS navigation), D122 (satellite navigation), D123 (indoor positioning system), D124 (Bluetooth low energy beacon), D125 (iBeacon), D126 (mobile phone tracking), D127 (positioning), D128 (Wi-Fi positioning), D129 (proximity marketing), D130 (multilateration), D204 (Apple Core Location), See also Applicant's prior patents in the family starting with the U.S. Patent Publication 20080248815.

Technology related generally to augmented reality is discussed in Cite Nos. D038 (augmented reality), D131 (optical head mounted display), D132 (smartglasses), D133 (EPSON-BT300 AR Glasses user guide), D152 (Layar). Any type of the above technologies, substitutions for those technologies, or new types of technologies may be used with any form of the invention.

Microsoft's HoloLens is discussed in Cite Nos. D134 (HoloLens), D135 (Windows Holographic), D136 (App Model), D137 (App Views), D138 (Coordinate systems), D139 (designing for mixed reality), D140 (gesture design), D141 (gaze targeting), D142 (gaze), D143 (getting a holographic space), D144 (hardware details), D145 (hologram), D146 (mixed reality capture), D147 (spatial mapping), D148 (working with holograms), D149 (offline applications), D150 (hologram).

Google's Project Tango is discussed in Cite Nos. D186 (setup for all Unity Tango apps), D187 (simple augmented reality), D188 (placing virtual objects in augmented reality), D189 (meshing with color), D190 (Tango with cardboard), D191 (depth perception), D192 (motion tracking), D193 (area learning), and D194 (ASUS ZenFone AR).

Augmented Reality on Apple devices is discussed Cite Nos. D153 (Apple pARk Code), D203 (AR iOS Tutorial), D154 (BRSunTracker), D155 (sun position code), D156 (3D orientation sun position). Any type of the above technologies, substitutions for those technologies, or new types of technologies may be used with any form of the invention.

Graphics processing and 3D Projection is discussed in Cite Nos. D208 (3D projection), D209 (vector projection), D210 (mathematics of perspective drawing), D211 (image projection), D212 (transformation matrix), D213 (camera matrix), D214, D215 (perspective projection).

Virtual reality is discussed in Cite Nos. D161 (Oculus Rift), D160 (HTC Vive).

Computer vision is discussed in Cite Nos. D105 (computer vision), D106 (OpenCV), D107 (OpenCV reference manual), D108 (OpenCV tutorials), D109 (OpenCV user guide), D157 (object recognition).

Artificial intelligence and machine learning are discussed in Cite Nos. D102 (artificial intelligence), D103 (OpenAI), D104 (OpenAI Gym). See also Tensorflow and Keras, two popular libraries for the Python programming language that facilitate the creation and training of deep neural networks.

Communications technologies are discussed in Cite Nos. D085 (cellular network), D086 (Wi-Fi), D087 (Bluetooth), D088 (Bluetooth low energy), D089 (ISM band), D090 (Near field communication), D091 (Radio-frequency identification), D092 (Mesh networking). Radio communication techniques are also discussed in "The ARRL 2015 Handbook for Radio Communication."

Sound and voice recognition and synthesis are discussed in Cite Nos. D093 (microphone), D094 (microphone array), D095 (active noise control), D096 (sound localization), D097 (acoustic location), D098 (acoustic source localization), D099 (speech recognition), D100 (computer speaker), and D101 (speech synthesis).

Sub-audible Tones and QR Codes are discussed in Cite Nos. D078 (broadcast automation), D079 (audience measurement), D080 (subaudible tone), D081 (QR code).

Phone applications are discussed in Cite Nos. D158 (text messaging), D159 (camera phone).

Encryption is discussed in Cite Nos. D162 (encryption), D163 (symmetric key algorithm), D164 (public key cryptography).

Web services and APIs are discussed in Cite Nos. D165 (HTTP), D166 (database), D167 (CRUD), D168 (REST), D169 (JSON), D170 (GeoJSON).

Information relating to circuit design and electrical engineering are discussed in Cite No. D114 (duty cycle), and in the Books "The Art of Electronics 3rd Edition," "Learning the Art of Electronics: A Hands-On Lab Course, 1st Edition," and "Make Your Own PCBs with EAGLE: From Schematic Designs to Finished Boards, 1st Edition."

Programming is generally discussed in the Books "The Definitive Guide to Django: Web Development Done Right," "Pro Django (Expert's Voice in Web Development)," "Beginning Django E-Commerce," "Django Design Patterns," "Code Complete: A Practical Handbook of Software Construction, Second Edition," "Design Patterns: Elements of Reusable Object-Oriented Software Elements of Reusable Object-Oriented Software," "Python Geospatial Development," "Machine Learning: An Algorithmic Perspective (Chapman & Hall/Crc Machine Learning & Pattern Recognition)."

In addition, the following documents provide additional background: U.S. Pat. Nos. 3,037,138, 5,103,328, 5,357,355, 5,757,139, 5,825,543, 5,881,377, 5,986,401, 6,088,079, 6,288,840, 6,337,492, 6,361,838, 6,433,853, 6,537,688, 6,657,690, 6,674,504, 6,689,492, 6,831,298, 6,961,178, 7,030,552, 7,034,452, 7,106,001, 7,164,151, 7,450,105, 7,514,861, 7,538,841, 7,637,648, 7,687,983, 7,714,904, 7,772,765, 7,804,493, 7,859,526, 7,864,270, 7,916,183, 8,023,080, 8,059,232, 8,138,669, 8,157,399, 8,314,542, 8,330,909, 8,362,992, 8,724,304, 8,947,627, 9,282,614, 9,316,843, 9,495,008, and 9,543,364; U.S. Publications 20010036013, 20020015120, 20020118452, 20020122019, 20030002296, 20030048522, 20030074672, 20030189754, 20030198456, 20030210370, 20040036707, 20040041800, 20040043139, 20040070822, 20040108971, 20040119407, 20040212300, 20040239243, 20050012881, 20050018106, 20050024339, 20050052342, 20050146492, 20050213181, 20060006792, 20060066236, 20060132634, 20060152812, 20060176541, 20060181662, 20060238684, 20060268208, 20070002130, 20070080629, 20070114916, 20070120478, 20070138941, 20070159070, 20070201248, 20070274077, 20080013174, 20080018732, 20080062259, 20080231690, 20080248815, 20080266500, 20080297695, 20080303996, 20090091826, 20090176029, 20090201446, 20090201447, 20090219253, 20090273275, 20090278452, 20090284672, 20090284690, 20100013380, 20100026934, 20100033461, 20100033462, 20100085207, 20100091207, 20100115407, 20100125816, 20100165267, 20100188605, 20100208110, 20100233601, 20100252825, 20100271394, 20100277439, 20110001805, 20110001808, 20110038045, 20110057866, 20110090324, 20110096156, 20110157708, 20110195354, 20110195758, 20110227487, 20110255303, 20110273906, 20120049723, 20120057006, 20120081524, 20120099033, 20120188637, 20120320287, 20150077323, 20150155344, 20150295015, 20150349293, and 20160027859; and Foreign References CN105098087A, DE102014111484A1, EP2211397A3, JP2000098386A, WO2009100055A2, WO2009100055A3, WO2009125918A2, WO2009125918A3, WO2015032901A3, and WO2016164184A1.

Applicant believes that the material incorporated above is "non-essential" in accordance with 37 CFR 1.57, because it is referred to for purposes of indicating the background of the invention or illustrating the state of the art. However, if the Examiner believes that any of the above-incorporated material constitutes "essential material" within the meaning of 37 CFR 1.57(c)(1)-(3), Applicant will amend the specification to expressly recite the essential material that is incorporated by reference as allowed by the applicable rules.

SUMMARY OF THE INVENTION

Aspects and applications of the invention presented here are described below in the drawings and detailed description of the invention. Unless specifically noted, it is intended that the words and phrases in the specification and the claims be given their plain, ordinary, and accustomed meaning to those of ordinary skill in the applicable arts. The inventor is fully aware that he can be his own lexicographer if desired. The inventor expressly elects, as his own lexicographers, to use only the plain and ordinary meaning of terms in the specification and claims unless he clearly states otherwise and then further, expressly sets forth the "special" definition of that term and explains how it differs from the plain and ordinary meaning. Absent such clear statements of intent to apply a "special" definition, it is the inventor's intent and desire that the simple, plain and ordinary meaning to the terms be applied to the interpretation of the specification and claims.

The inventor is also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

In that regard, the use of the word "coupled" or "connected" implies that the elements may be directly connected or may be indirectly connected or coupled through one or more intervening elements unless it is specifically noted that there must be a direct connection.

Further, the inventor is fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for, and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventor not to invoke the provisions of 35 U.S.C. § 112(f). Moreover, even if the provisions of 35 U.S.C. § 112(f) are invoked to define the claimed inventions, it is intended that the inventions not be limited only to the specific structure, material or acts that are described in the preferred embodiments, but in addition, include any and all structures, materials or acts that perform the claimed function as described in alternative embodiments or forms of the invention, or that are well known present or later-developed, equivalent structures, material or acts for performing the claimed function.

Headings, sections, and other similar designations are provided for the convenience of the reader, and should not be used to limit, divide, or partition the teachings of the variously claimed aspects of the inventions.

The aspects, features, and advantages will be apparent to those artisans of ordinary skill in the art from the DETAILED DESCRIPTION and DRAWINGS, and from the CLAIMS.

However, without attempting to characterize or limit the scope of inventions as they are described and claimed, some of the advantages of the various inventions are summarized below.

It is an object of the invention to implement transparent display technology.

It is yet another (and optionally independent) object of the invention to maintain information privacy for users of transparent displays when desired.

It is yet another (and optionally independent) object of the invention to allow transparent displays to have a black state in addition to a transparent or translucent "clear" state.

It is yet another (and optionally independent) object of the invention to use transparent displays to display information in ways that appear in the correct orientation to users on both sides of the screen.

It is yet another (and optionally independent) object of the invention to utilize active shutters in conjunction with transparent display elements.

It is yet another (and optionally independent) object of the invention to create a display from a combination of active shutter elements and transparent display elements.

It is yet another (and optionally independent) object of the invention to active shutter devices to be either transparent or opaque as necessary to achieve the visual effects described herein.

It is yet another (and optionally independent) object of the invention to have active shutters with multiple elements so that different areas of an emissive display can be driven on one side, the other side, or the display can appear transparent for augmented reality or HUD-like features.

It is yet another (and optionally independent) object of the invention to provide touch sensing on one side of the screen.

It is yet another (and optionally independent) object of the invention to provide touch sensing on both sides of the screen for input to one user interface.

It is yet another (and optionally independent) object of the invention to provide touch sensing on both sides of the screen for input to two separate user interfaces that are displayed on different sides of the screen.

It is yet another (and optionally independent) object of the invention to utilize the emissive display elements to sense user input on the screen.

It is yet another (and optionally independent) object of the invention to utilize the emissive display elements in combination with the active shutter elements to sense user input from one side of the screen but not the other.

It is yet another (and optionally independent) object of the invention to utilize the emissive display elements alone or in combination with the active shutter elements to digitize physical information that is placed adjacent to the screen (i.e. "scan" a document).

It is yet another (and optionally independent) object of the invention to implement the transparent display elements with active shutter elements and touch sensing technology.

It is yet another (and optionally independent) object of the invention to implement different display modes on a screen capable of single-sided, dual-sided, or transparent display.

It is yet another (and optionally independent) object of the invention to operate in a normal mode by operating a transparent display with at least one active shutter in an opaque state such that it appears as a single sided display.

It is yet another (and optionally independent) object of the invention to operate a display in a sharing mode such that the same or similar information appears on both sides of a display in the correct orientation for each respective user.

It is yet another (and optionally independent) object of the invention to operate a display in a presentation mode such that a presentation view is displayed on one side of the screen in the correct orientation for observers, and a presenter view is shown on the other side of the screen.

It is yet another (and optionally independent) object of the invention to operate the display in an augmented reality state or mode or mixed reality state or mode so that annotations may appear to be placed over real-world objects.

It is yet another (and optionally independent) object of the invention to operate the display in virtual reality state or mode.

It is yet another (and optionally independent) object of the invention to operate the display in an unobstructed state or mode so that the screen displays information to at least one user but also appears translucent to at least a user on the other side of the screen.

It is yet another (and optionally independent) object of the invention to operate the display in tracing mode such that a user may be able to use a pen or stylus to trace an object underneath the display onto the display.

It is yet another (and optionally independent) object of the invention to operate the display in scanning mode such that an object placed adjacent to the display can be scanned or digitized.

It is yet another (and optionally independent) object of the invention to operate the display according to any other state or mode.

It is yet another (and optionally independent) object of the invention to create devices utilizing the display technology in any one of many form factors.

It is yet another (and optionally independent) object of the invention to utilize the display in a single screen device.

It is yet another (and optionally independent) object of the invention to utilize a display in a hinged device such that there is a display on one side of the hinge, and optionally another display on the other side of the hinge.

It is yet another (and optionally independent) object of the invention to operate a hinged device in a normal display mode such that it behaves as a traditional laptop.

It is yet another (and optionally independent) object of the invention to operate the hinged device in stand mode such that one side of the hinge acts as a stand while the other side is angled upward.

It is yet another (and optionally independent) object of the invention to operate the device in tent mode such that the hinge of the device is off the table.

Etc. It is yet another (and optionally independent) object of the invention to operate a hinged device in any other mode such as dual display mode, presentation mode, or any other mode described herein.

It is yet another (and optionally independent) object of the invention to determine face position relative to the screen.

It is yet another (and optionally independent) object of the invention to determine the user's eye position or gaze relative to the screen.

It is yet another (and optionally independent) object of the invention to utilize sensors to determine the physical state of the device and select the display screen orientation and display mode.

It is yet another (and optionally independent) object of the invention to determine the position of the device incorporating the display to determine the display mode and content to be display.

It is yet another (and optionally independent) object of the invention to utilize computer vision techniques in conjunction with the display.

It is yet another (and optionally independent) object of the invention to utilize artificial intelligence and machine learning in conjunction with the display.

It is yet another (and optionally independent) object of the invention to use of any type of neural network including but not limited to: feed forward, recurrent, convolutional, long short-term memory (LSTM) in conjunction with the display.

It is yet another (and optionally independent) object of the invention to utilize behavioral cloning neural network techniques in conjunction with the display.

It is yet another (and optionally independent) object of the invention to utilize the display for augmented reality applications.

It is another (and optionally independent) object of the invention to create displays and devices that can be used for augmented reality (or mixed reality) applications without a user needing to wear a special device on their head.

It is another (and optionally independent) object of the invention to create displays and devices that can be used for augmented reality (or mixed reality) applications when the user looks through the device, but change physical visual states to be opaque or translucent for applications where the user is looking at the device.

It is yet another (and optionally independent) object of the invention to track the user's head position relative to the display, to track the physical location and orientation of the display, and to place an augmented reality annotation on the display based on both pieces of information.

It is yet another (and optionally independent) object of the invention to utilize a dual-sided multi-mode display to create applications that show relevant information to users on both sides of a device.

It is yet another (and optionally independent) object of the invention to utilize a multi-mode display to create applications that show relevant augmented reality annotations users of a device.

It is yet another (and optionally independent) object of the invention to utilize a multi-mode display to create applications that utilize multiple display modes based on the context of the use of the device.

It is yet another (and optionally independent) object of the invention to utilize a multi-mode display to create applications that switch between a normal display mode and a virtual reality display mode.

It is yet another (and optionally independent) object of the invention to utilize a multi-mode display to create applications that are able to block the sun from the perspective of a user using active shutters.

It is yet another (and optionally independent) object of the invention to utilize a multi-mode display to create applications that are able to block the sun from the perspective of a user using active shutters while showing augmented reality annotations.

It is yet another (and optionally independent) object of the invention to utilize the display in virtual reality applications.

It is another (and optionally independent) object of the invention to create displays and devices that can be used for virtual reality applications by making the screen opaque and displaying an appropriate image based on the position and other sensed or known information about the device state.

It is yet another (and optionally independent) object of the invention to facilitate sharing and viewing of specialized sensor data sent via messaging applications.

It is yet another (and optionally independent) object of the invention to improve the relevance of notifications presented by messaging applications.

It is yet another (and optionally independent) object of the invention to improve the ability to share references to real world content in messaging applications.

At least one of the above listed, unlisted, and other objects of the invention may be achieved by a display element that includes an active shutter and a transparent display pixel wherein the active shutter is independently electrically operable to transition from a substantially transparent state to a substantially opaque state, wherein the transparent display pixel substantially transparent and is independently electrically operable to emit light, and wherein the active shutter is placed substantially adjacent to one side of the transparent display pixel.

At least one of the above listed, unlisted, and other objects of the invention may be achieved by display element that includes a first active shutter, a transparent display pixel, and a second active shutter, wherein the first and second active shutters are independently electrically operable to transition from a substantially transparent state to a substantially opaque state, wherein the transparent display pixel is substantially transparent and is independently electrically operable to emit light, and wherein the first active shutter is placed on one side of the transparent display pixel and the second active shutter is placed on the opposite side of the transparent display pixel.

At least one of the above listed, unlisted, and other objects of the invention may be achieved by display element including a first transparent display pixel; an active shutter; and, a second transparent display pixel; wherein the active shutter is independently electrically operable to transition from a substantially transparent state to a substantially opaque state, wherein the first and second transparent display pixels are substantially transparent and are independently electrically operable to emit light, and wherein the active shutter is placed between the first and second transparent display pixels.

BRIEF DESCRIPTION OF THE SEVERAL VIEWS OF THE DRAWINGS

A more complete understanding of the present invention may be derived by referring to the detailed description when considered in connection with the following illustrative figures. In the figures, like reference numbers refer to like elements or acts throughout the figures.

Screen Element Structure for a Shutter-Display-Shutter (SDS) Display Element.

Screen Element Structure for a Display-Shutter-Display (DSD) Display Element.

Figure 2A:
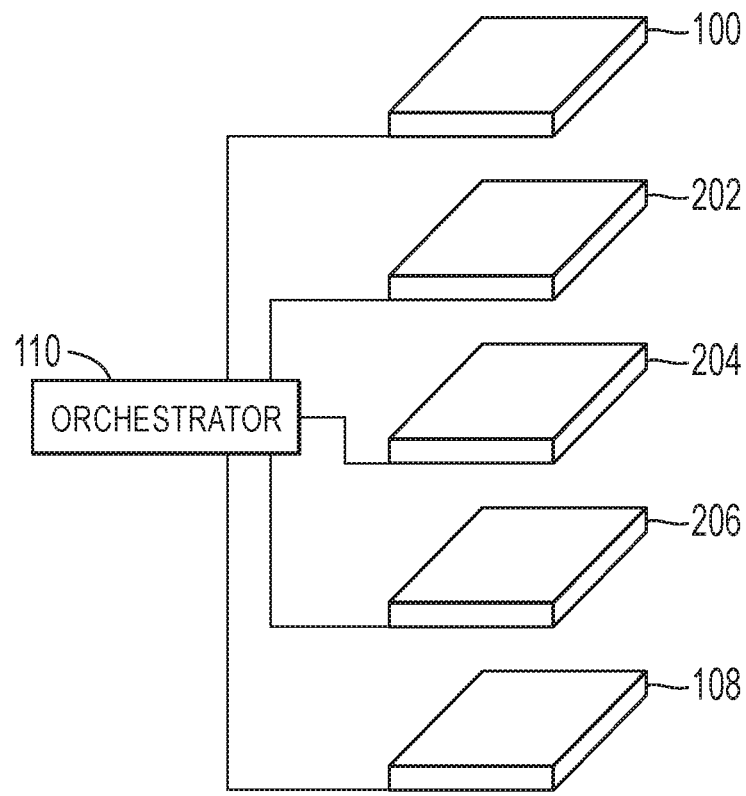

FIG. 2A depicts a separated block diagram of hardware used by some forms of the invention including two transparent display screens, one active shutter, and two touch sensing panels.

Figure 2B:
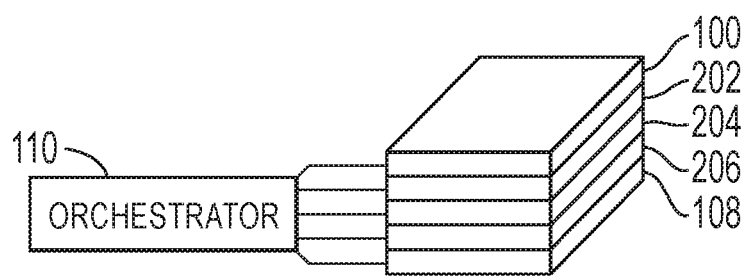

FIG. 2B depicts a joined block diagram of hardware used by some forms of the invention including two transparent display screens, one active shutter, and two touch sensing panels.

Figure 2C:
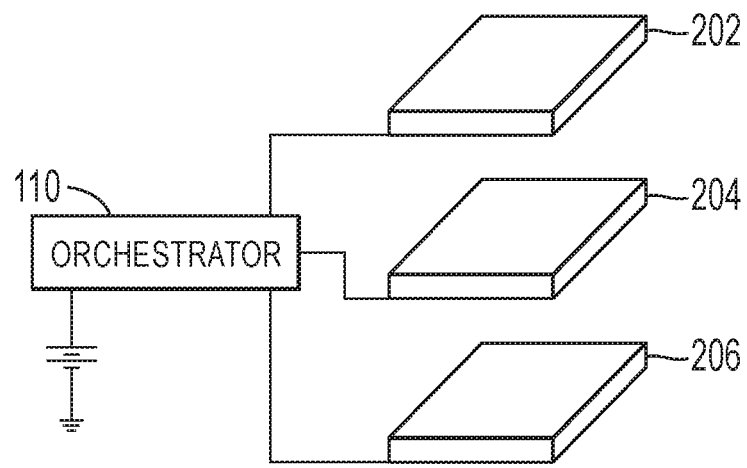

FIG. 2C depicts a separated block diagram of hardware used by some forms of the invention including two transparent display screens, and one active shutter.

Figure 2D:
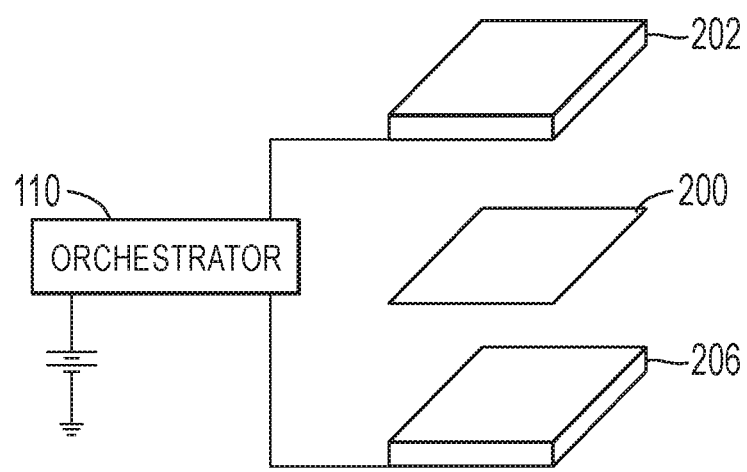

FIG. 2D depicts a separated block diagram of hardware used by some forms of the invention including two display screens.

Screen Element States for a SDS Display Element.

FIG. 3A depicts a simplified side view illustration of a shutter-display-shutter element used by some forms of the invention when the left active shutter is opaque (L:AS.O), the elements of the transparent display are illuminated with an image that is properly oriented to an observer attempting to view the screen from the left (←TD.ONL), and the right active shutter is transparent (R:AS.T).

FIG. 3B depicts a simplified side view illustration of a shutter-display-shutter element used by some forms of the invention when the left active shutter is opaque (L:AS.O), the elements of the transparent display are off (TD.OFF), and the right active shutter is transparent.

FIG. 3C depicts a simplified side view illustration of a shutter-display-shutter element used by some forms of the invention when the left active shutter is opaque (L:AS.O), the elements of the transparent display are illuminated with an image that is properly oriented to an observer attempting to view the screen from the right (TD.ONR→), and the right active shutter is transparent (R:AS.T).

FIG. 3D depicts a simplified side view illustration of a shutter-display-shutter element used by some forms of the invention when the left active shutter is opaque (L:AS.O), the elements of the transparent display are illuminated with an image that is properly oriented to an observer attempting to view the screen from the left (←TD.ONL), and the right active shutter is opaque (R:AS.O).

FIG. 3E depicts a simplified side view illustration of a shutter-display-shutter element used by some forms of the invention when the left active shutter is opaque (L:AS.O), the elements of the transparent display are off (TD.OFF), and the right active shutter is opaque (R:AS.O).

FIG. 3F depicts a simplified side view illustration of a shutter-display-shutter element used by some forms of the invention when the left active shutter is opaque (L:AS.O), the elements of the transparent display are illuminated with an image that is properly oriented to an observer attempting to view the screen from the right (TD.ONL→), and the right active shutter is opaque (R:AS.O).

Figure 3G:
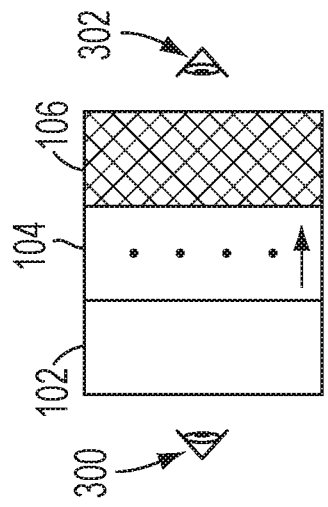

FIG. 3G depicts a simplified side view illustration of a shutter-display-shutter element used by some forms of the invention when the left active shutter is transparent (L:AS.T), the elements of the transparent display are illuminated with an image that is properly oriented to an observer attempting to view the screen from the left (←TD.ONL), and the right active shutter is opaque (R:AS.O).

Figure 3H:
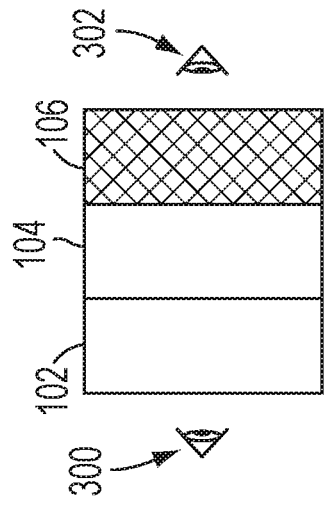

FIG. 3H depicts a simplified side view illustration of a shutter-display-shutter element used by some forms of the invention when the left active shutter is transparent (L:AS.T), the elements of the transparent display are off (TD.OFF), and the right active shutter is opaque (R:AS.O).

Figure 3I:
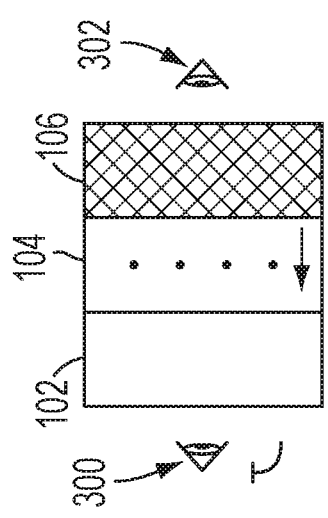

FIG. 3I depicts a simplified side view illustration of a shutter-display-shutter element used by some forms of the invention when the left active shutter is transparent (L:AS.T), the elements of the transparent display are illuminated with an image that is properly oriented to an observer attempting to view the screen from the right (TD.ONR→), and the right active shutter is opaque (R:AS.O).

Figure 3J:
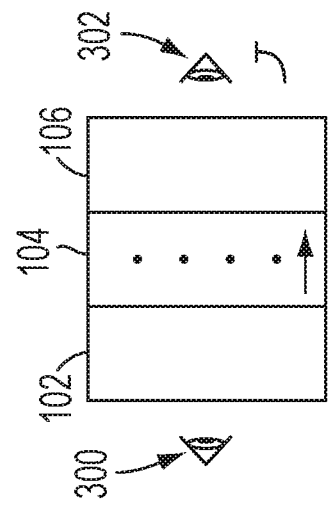

FIG. 3J depicts a simplified side view illustration of a shutter-display-shutter element used by some forms of the invention when the left active shutter is transparent (L:AS.T), the elements of the transparent display are illuminated with an image that is properly oriented to an observer attempting to view the screen from the left (←TD.ONL), and the right active shutter is transparent (R:AS.T).

Figure 3K:
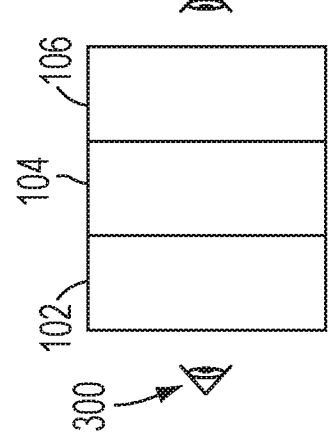

FIG. 3K depicts a simplified side view illustration of a shutter-display-shutter element used by some forms of the invention when the left active shutter is transparent (L:AS.T), the elements of the transparent display are off (TD.OFF), and the right active shutter is transparent (R:AS.T).

Figure 3L:
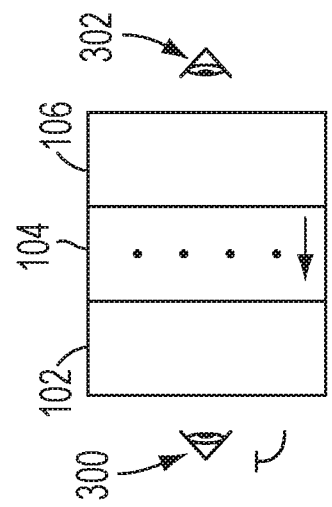

FIG. 3L depicts a simplified side view illustration of a shutter-display-shutter element used by some forms of the invention when the left active shutter is transparent (L:AS.T), the elements of the transparent display are illuminated with an image that is properly oriented to an observer attempting to view the screen from the right (TD.ONR→), and the right active shutter is transparent (R:AS.T).

Screen Element States for DSD Display Elements.

FIG. 4A depicts a simplified side view illustration of a display-shutter-display element used by some forms of the invention when the elements of the left transparent display are illuminated with an image that is properly oriented to an observer attempting to view the screen from the left (L:←TD.ONL), the active shutter is transparent (AS.T), and the elements of the transparent display are off (R:TD.OFF).

FIG. 4B depicts a simplified side view illustration of a display-shutter-display element used by some forms of the invention when the elements of the left transparent display are illuminated with an image that is properly oriented to an observer attempting to view the screen from the left (L:←TD.ONL), the active shutter is opaque (AS.O), and the elements of the transparent display are off (R:TD.OFF).

FIG. 4C depicts a simplified side view illustration of a display-shutter-display element used by some forms of the invention when the elements of the left transparent display are illuminated with an image that is properly oriented to an observer attempting to view the screen from the right (L:TD.ONR→), the active shutter is transparent (AS.T), and the elements of the transparent display are off (R:TD.OFF).

FIG. 4D depicts a simplified side view illustration of a display-shutter-display element used by some forms of the invention when the elements of the left transparent display are illuminated with an image that is properly oriented to an observer attempting to view the screen from the right (L:TD.ONR→), the active shutter is opaque (AS.O), and the elements of the transparent display are off (R: TD.OFF).

FIG. 4E depicts a simplified side view illustration of a display-shutter-display element used by some forms of the invention when the elements of the left transparent display are illuminated with an image that is properly oriented to an observer attempting to view the screen from the left (L:←TD.ONL), the active shutter is transparent (AS.T), and the elements of the transparent display are illuminated with an image that is properly oriented to an observer attempting to view the screen from the left (R:←TD.ONL).

FIG. 4F depicts a simplified side view illustration of a display-shutter-display element used by some forms of the invention when the elements of the left transparent display are illuminated with an image that is properly oriented to an observer attempting to view the screen from the left (L:←TD.ONL), the active shutter is opaque (AS.O), and the elements of the transparent display are illuminated with an image that is properly oriented to an observer attempting to view the screen from the left (R:←TD.ONL).

FIG. 4G depicts a simplified side view illustration of a display-shutter-display element used by some forms of the invention when the elements of the left transparent display are illuminated with an image that is properly oriented to an observer attempting to view the screen from the left (L:←TD.ONL), the active shutter is transparent (AS.T), and the elements of the transparent display are illuminated with an image that is properly oriented to an observer attempting to view the screen from the right (R:TD.ONR→).

FIG. 4H depicts a simplified side view illustration of a display-shutter-display element used by some forms of the invention when the elements of the left transparent display are illuminated with an image that is properly oriented to an observer attempting to view the screen from the left (L:←TD.ONL), the active shutter is opaque (AS.O), and the elements of the transparent display are illuminated with an image that is properly oriented to an observer attempting to view the screen from the right (R:TD.ONR→).

FIG. 4I depicts a simplified side view illustration of a display-shutter-display element used by some forms of the invention when the elements of the left transparent display are illuminated with an image that is properly oriented to an observer attempting to view the screen from the right (L:TD.ONR→), the active shutter is transparent (AS.T), and the elements of the transparent display are illuminated with an image that is properly oriented to an observer attempting to view the screen from the left (R:←TD.ONL).

FIG. 4J depicts a simplified side view illustration of a display-shutter-display element used by some forms of the invention when the elements of the left transparent display are illuminated with an image that is properly oriented to an observer attempting to view the screen from the right (L:TD.ONR→), the active shutter is opaque (AS.O), and the elements of the transparent display are illuminated with an image that is properly oriented to an observer attempting to view the screen from the left (R:←TD.ONL).

FIG. 4K depicts a simplified side view illustration of a display-shutter-display element used by some forms of the invention when the elements of the left transparent display are illuminated with an image that is properly oriented to an observer attempting to view the screen from the right (L:TD.ONR→), the active shutter is transparent (AS.T), and the elements of the transparent display are illuminated with an image that is properly oriented to an observer attempting to view the screen from the right (R:TD.ONR→).

FIG. 4L depicts a simplified side view illustration of a display-shutter-display element used by some forms of the invention when the elements of the left transparent display are illuminated with an image that is properly oriented to an observer attempting to view the screen from the right (L:TD.ONR→), the active shutter is opaque (AS.O), and the elements of the transparent display are illuminated with an image that is properly oriented to an observer attempting to view the screen from the right (R:TD.ONR→).

FIG. 4M depicts a simplified side view illustration of a display-shutter-display element used by some forms of the invention when the elements of the left transparent display are off (L:TD.OFF), the active shutter is transparent (AS.T), and the elements of the transparent display are illuminated with an image that is properly oriented to an observer attempting to view the screen from the left (R:←TD.ONL).

FIG. 4N depicts a simplified side view illustration of a display-shutter-display element used by some forms of the invention when the elements of the left transparent display are off (L:TD.OFF), the active shutter is opaque (AS.O), and the elements of the transparent display are illuminated with an image that is properly oriented to an observer attempting to view the screen from the left (R:←TD.ONL).

FIG. 4O depicts a simplified side view illustration of a display-shutter-display element used by some forms of the invention when the elements of the left transparent display are off (L:TD.OFF), the active shutter is transparent (AS.T), and the elements of the transparent display are illuminated with an image that is properly oriented to an observer attempting to view the screen from the right (R:TD.ONR→).

FIG. 4P depicts a simplified side view illustration of a display-shutter-display element used by some forms of the invention when the elements of the left transparent display are off (L:TD.OFF), the active shutter is opaque (AS.O), and the elements of the transparent display are illuminated with an image that is properly oriented to an observer attempting to view the screen from the right (R:TD.ONR→).

FIG. 4Q depicts a simplified side view illustration of a display-shutter-display element used by some forms of the invention when the elements of the left transparent display are off (L:TD.OFF), the active shutter is transparent (AS.T), and the elements of the transparent display are off (R:TD.OFF).

FIG. 4R depicts a simplified side view illustration of a display-shutter-display element used by some forms of the invention when the elements of the left transparent display are off (L:TD.OFF), the active shutter is opaque (AS.O), and the elements of the transparent display are off (R:TD.OFF).

Display Modes Using the Various Display Element States.

Figure 5A:
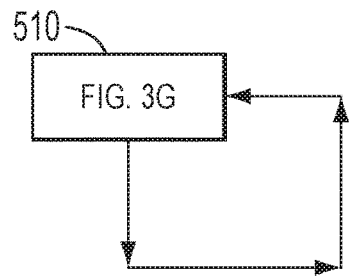

FIG. 5A depicts an exemplary simplified flow diagram of a display control loop used with some forms of the invention incorporating a shutter-display-shutter element when the element is configured to operate in a normal mode for an observer to the left as depicted.

Figure 5B:
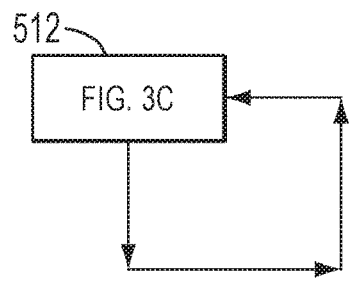

FIG. 5B depicts an exemplary simplified flow diagram of a display control loop used with some forms of the invention incorporating a shutter-display-shutter element when the element is configured to operate in a normal mode for an observer to the right as depicted.

Figure 5C:
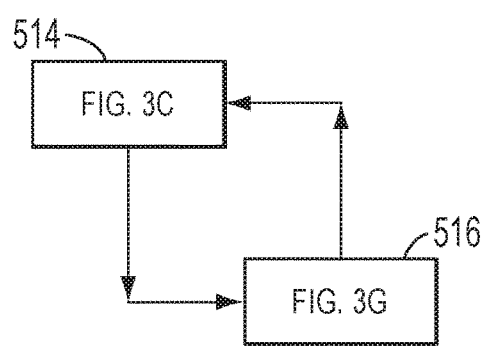

FIG. 5C depicts an exemplary simplified flow diagram of a display control loop used with some forms of the invention incorporating a shutter-display-shutter element when the element is configured to operate in a presentation mode or sharing mode.

Figure 5D:
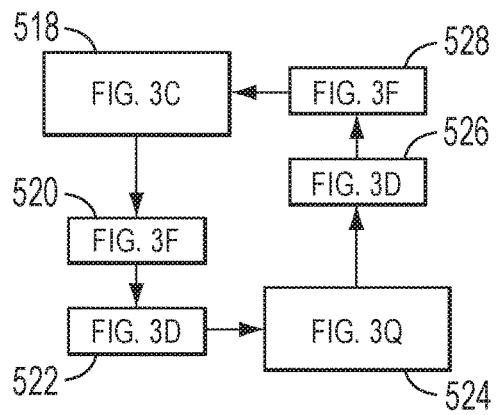

FIG. 5D depicts another exemplary simplified flow diagram of a display control loop used with some forms of the invention incorporating a shutter-display-shutter element when the element is configured to operate in a presentation mode or a sharing mode.

Figure 5E:
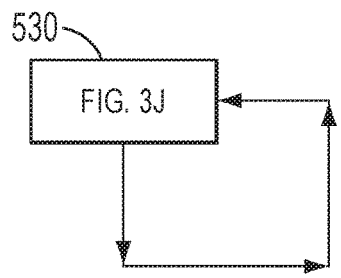

FIG. 5E depicts an exemplary simplified flow diagram of a display control loop used with some forms of the invention incorporating a shutter-display-shutter element when the element is configured to operate in augmented reality mode for an observer to the left as depicted.

Figure 5F:
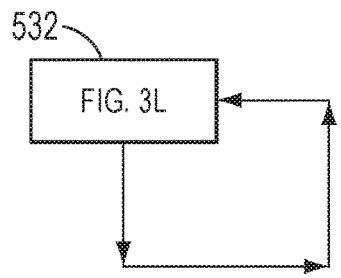

FIG. 5F depicts an exemplary simplified flow diagram of a display control loop used with some forms of the invention incorporating a shutter-display-shutter element when the element is configured to operate in an augmented reality mode for an observer to the right as depicted.

Figure 5G:
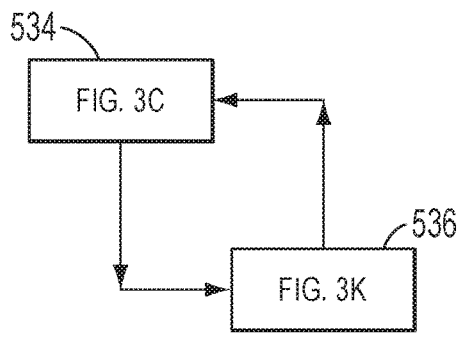

FIG. 5G depicts an exemplary simplified flow diagram of a display control loop used with some forms of the invention incorporating a shutter-display-shutter element when the element is configured to operate in a first unobstructed mode for an observer to the right as depicted.

Figure 5H:
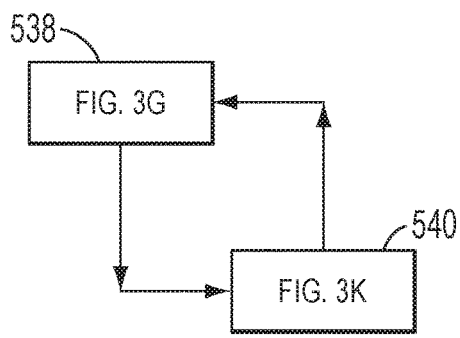

FIG. 5H depicts an exemplary simplified flow diagram of a display control loop used with some forms of the invention incorporating a shutter-display-shutter element when the element is configured to operate in an unobstructed mode for an observer to the left as depicted.

Figure 5I:
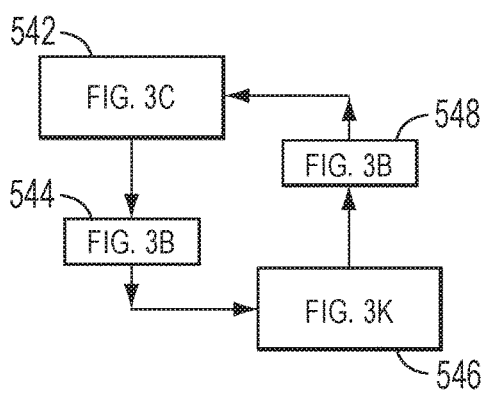

FIG. 5I depicts another exemplary simplified flow diagram of a display control loop used with some forms of the invention incorporating a shutter-display-shutter element when the element is configured to operate in an unobstructed mode for an observer to the right as depicted.

Figure 5J:
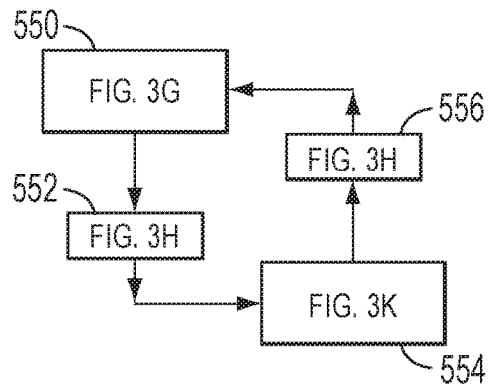

FIG. 5J depicts another exemplary simplified flow diagram of a display control loop used with some forms of the invention incorporating a shutter-display-shutter element when the element is configured to operate in an unobstructed mode for an observer to the left as depicted.

Figure 5K:
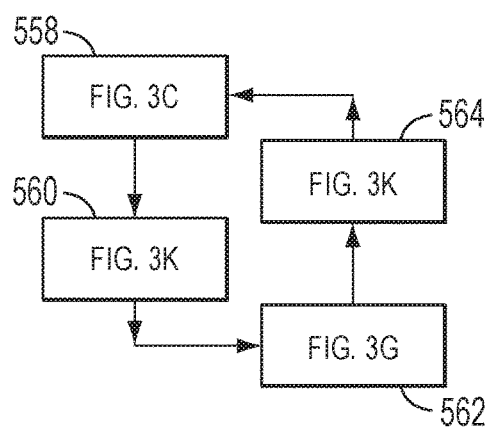

FIG. 5K depicts an exemplary simplified flow diagram of a display control loop used with some forms of the invention incorporating a shutter-display-shutter element when the element is configured to operate in an unobstructed mode.

Figure 6A:
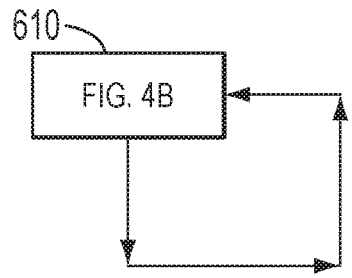

FIG. 6A depicts an exemplary simplified flow diagram of a display control loop used with some forms of the invention incorporating a display-shutter-display element when the element is configured to operate in a normal mode for an observer to the left as depicted.

Figure 6B:
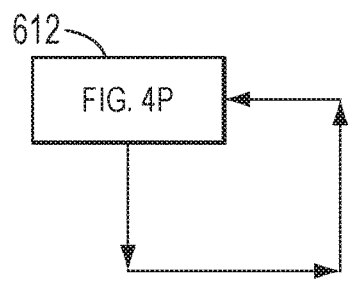

FIG. 6B depicts an exemplary simplified flow diagram of a display control loop used with some forms of the invention incorporating a display-shutter-display element when the element is configured to operate in a normal mode for an observer to the right as depicted.

Figure 6C:
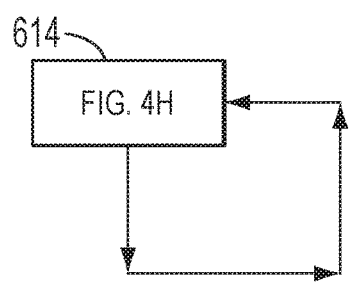

FIG. 6C depicts an exemplary simplified flow diagram of a display control loop used with some forms of the invention incorporating a display-shutter-display element when the element is configured to operate in a presentation mode or a sharing mode.

Figure 6D:
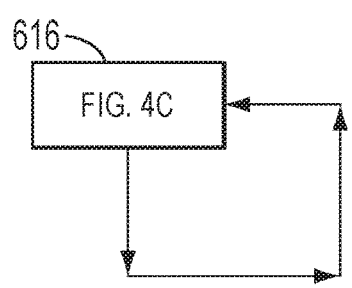

FIG. 6D depicts an exemplary simplified flow diagram of a display control loop used with some forms of the invention incorporating a display-shutter-display element when the element is configured to operate in an augmented reality mode for an observer to the right as depicted.

Figure 6E:
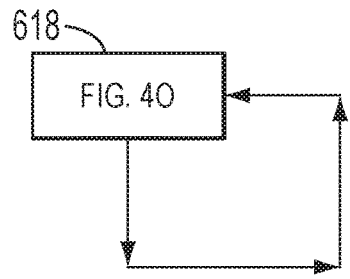

FIG. 6E depicts another exemplary simplified flow diagram of a display control loop used with some forms of the invention incorporating a display-shutter-display element when the element is configured to operate in an augmented reality mode for an observer to the right as depicted.

Figure 6F:
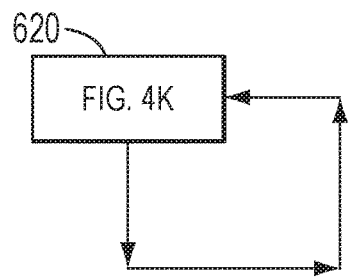

FIG. 6F depicts an exemplary simplified flow diagram of a display control loop used with some forms of the invention incorporating a display-shutter-display element when the element is configured to operate in a two-and-a-half dimensional augmented reality mode for an observer to the right as depicted.

Figure 6G:
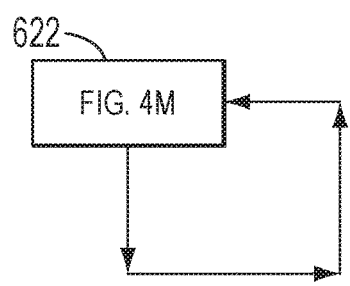

FIG. 6G depicts an exemplary simplified flow diagram of a display control loop used with some forms of the invention incorporating a display-shutter-display element when the element is configured to operate in an augmented reality mode for an observer to the left as depicted.

Figure 6H:
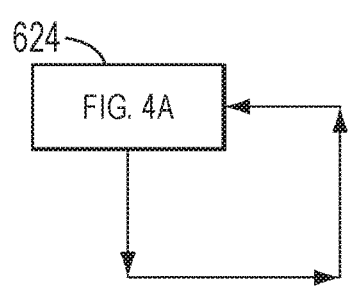

FIG. 6H depicts another exemplary simplified flow diagram of a display control loop used with some forms of the invention incorporating a display-shutter-display element when the element is configured to operate in an augmented reality mode for an observer to the left as depicted.

Figure 6I:
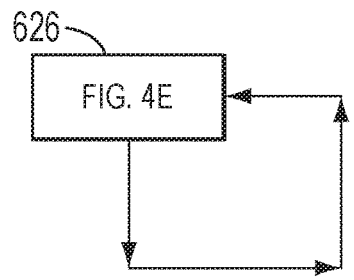

FIG. 6I depicts an exemplary simplified flow diagram of a display control loop used with some forms of the invention incorporating a display-shutter-display element when the element is configured to operate in a two-and-a-half dimensional augmented reality mode for an observer to the left as depicted.

Figure 6J:
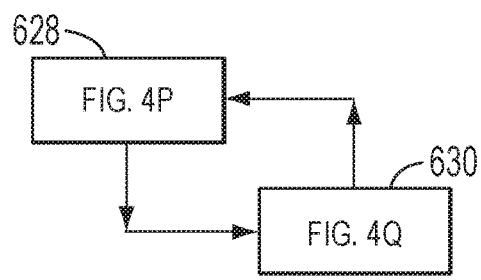

FIG. 6J depicts an exemplary simplified flow diagram of a display control loop used with some forms of the invention incorporating a display-shutter-display element when the element is configured to operate in an unobstructed mode for an observer to the right as depicted.

Figure 6K:
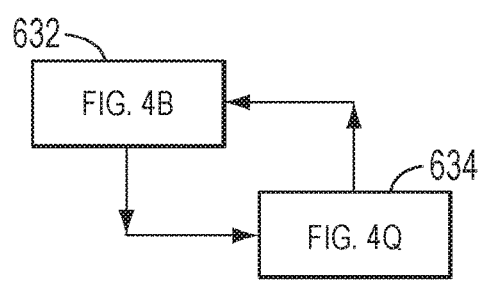

FIG. 6K depicts an exemplary simplified flow diagram of a display control loop used with some forms of the invention incorporating a display-shutter-display element when the element is configured to operate in an unobstructed mode for an observer to the left as depicted.

Figure 6L:
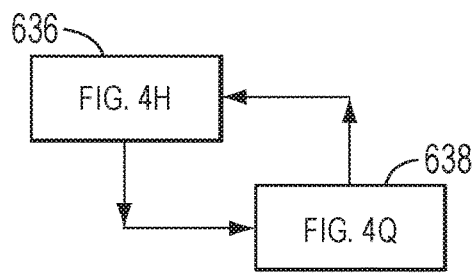

FIG. 6L depicts an exemplary simplified flow diagram of a display control loop used with some forms of the invention incorporating a display-shutter-display element when the element is configured to operate in an unobstructed mode.

Figure 6M:
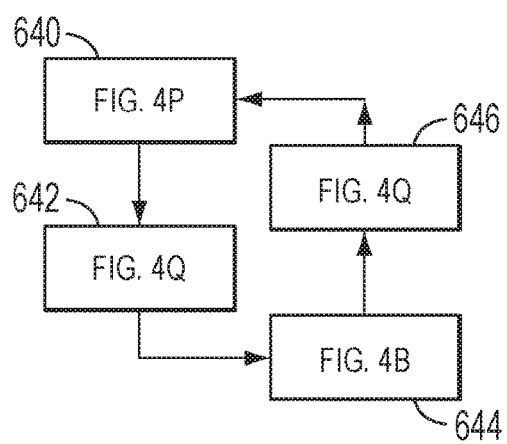

FIG. 6M depicts another exemplary simplified flow diagram of a display control loop used with some forms of the invention incorporating a display-shutter-display element when the element is configured to operate in an unobstructed mode.

Figure 7A:
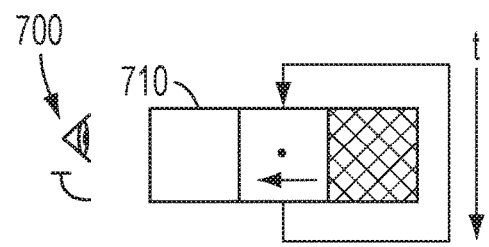

FIG. 7A depicts an exemplary simplified vertical time series illustration of a display control loop used with some forms of the invention incorporating a shutter-display-shutter element when the element is configured to operate in a normal mode for an observer to the left as depicted.

Figure 7B:
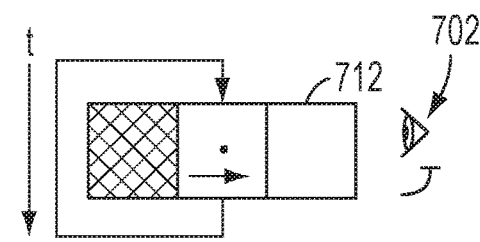

FIG. 7B depicts an exemplary simplified vertical time series illustration of a display control loop used with some forms of the invention incorporating a shutter-display-shutter element when the element is configured to operate in a normal mode for an observer to the right as depicted.

Figure 7C:
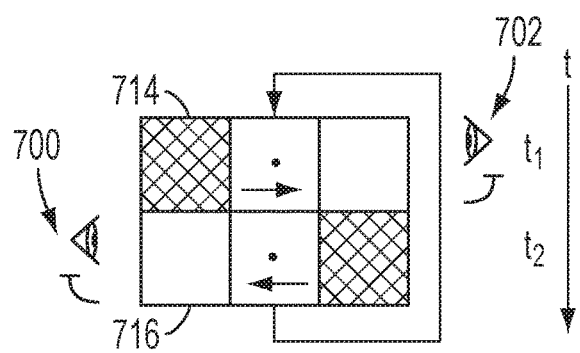

FIG. 7C depicts an exemplary simplified vertical time series illustration of a display control loop used with some forms of the invention incorporating a shutter-display-shutter element when the element is configured to operate in a presentation mode or a sharing mode.

Figure 7D:
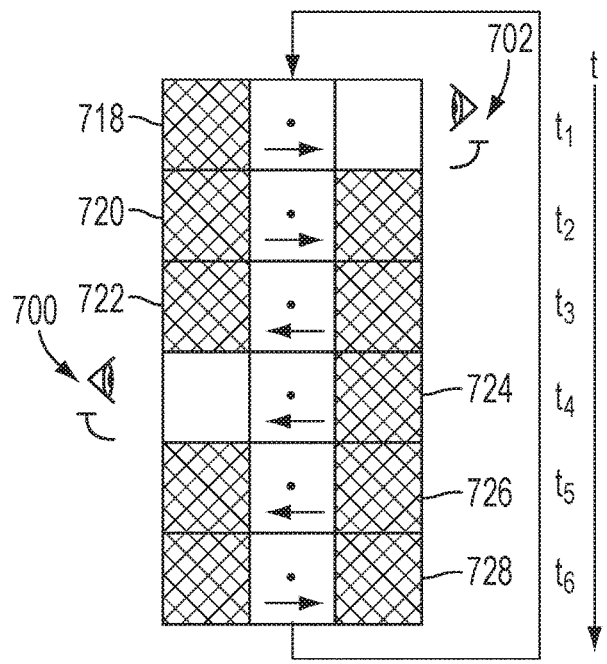

FIG. 7D depicts another exemplary simplified vertical time series illustration of a display control loop used with some forms of the invention incorporating a shutter-display-shutter element when the element is configured to operate in a presentation mode or a sharing mode.

Figure 7E:
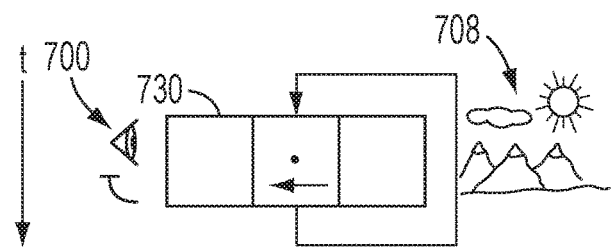

FIG. 7E depicts an exemplary simplified vertical time series illustration of a display control loop used with some forms of the invention incorporating a shutter-display-shutter element when the element is configured to operate in an augmented reality mode for an observer to the left as depicted.

Figure 7F:
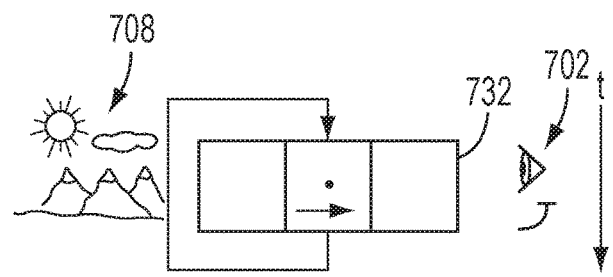

FIG. 7F depicts an exemplary simplified vertical time series illustration of a display control loop used with some forms of the invention incorporating a shutter-display-shutter element when the element is configured to operate in an augmented reality mode for an observer to the right as depicted.

Figure 7G:
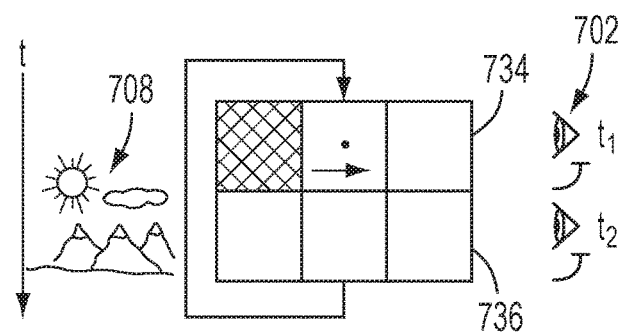

FIG. 7G depicts an exemplary simplified vertical time series illustration of a display control loop used with some forms of the invention incorporating a shutter-display-shutter element when the element is configured to operate in an unobstructed mode for an observer to the right as depicted.

Figure 7H:
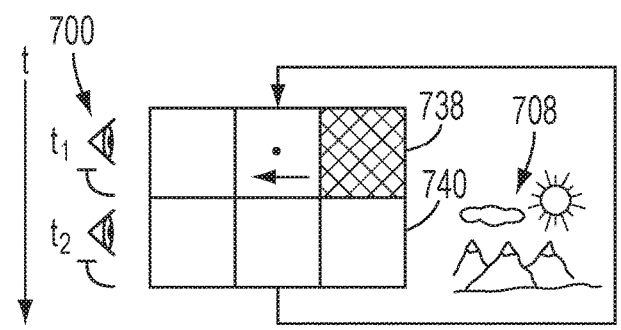

FIG. 7H depicts an exemplary simplified vertical time series illustration of a display control loop used with some forms of the invention incorporating a shutter-display-shutter element when the element is configured to operate in an unobstructed mode for an observer to the left as depicted.

Figure 7I:
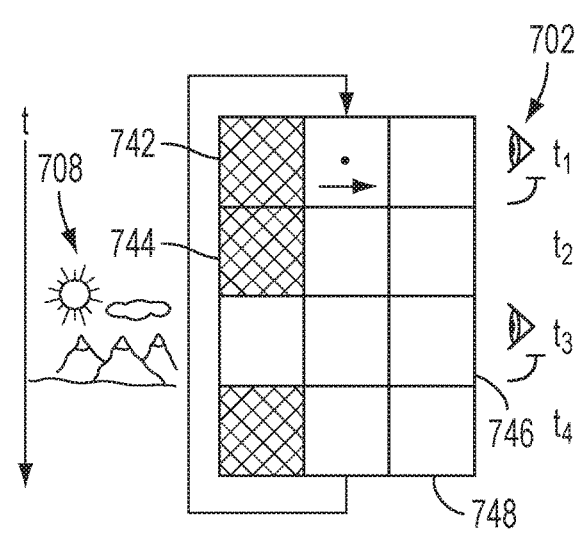

FIG. 7I depicts another exemplary simplified vertical time series illustration of a display control loop used with some forms of the invention incorporating a shutter-display-shutter element when the element is configured to operate in an unobstructed mode for an observer to the right as depicted.

Figure 7J:
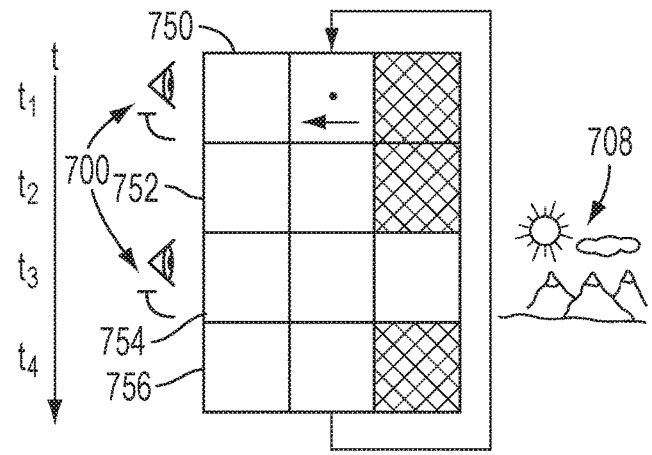

FIG. 7J depicts another exemplary simplified vertical time series illustration of a display control loop used with some forms of the invention incorporating a shutter-display-shutter element when the element is configured to operate in an unobstructed mode for an observer to the left as depicted.

Figure 7K:
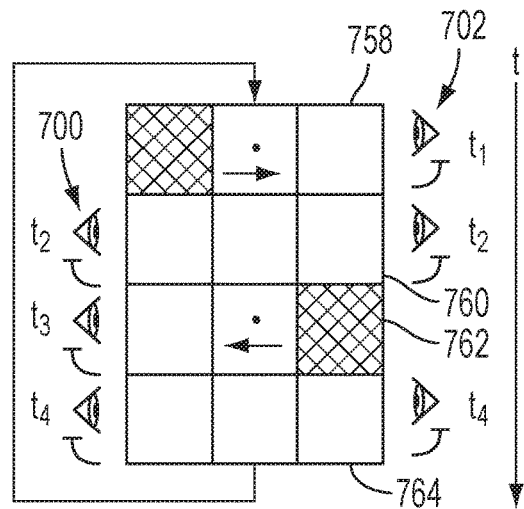

FIG. 7K depicts an exemplary simplified vertical time series illustration of a display control loop used with some forms of the invention incorporating a shutter-display-shutter element when the element is configured to operate in an unobstructed mode.

Figure 8A:
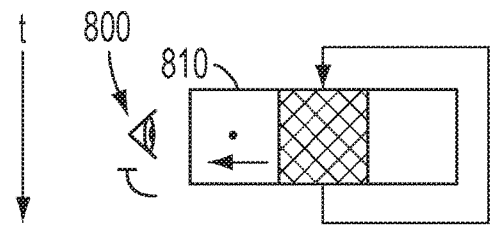

FIG. 8A depicts an exemplary simplified vertical time series illustration of a display control loop used with some forms of the invention incorporating a display-shutter-display element when the element is configured to operate in a normal mode for an observer to the left as depicted.

Figure 8B:
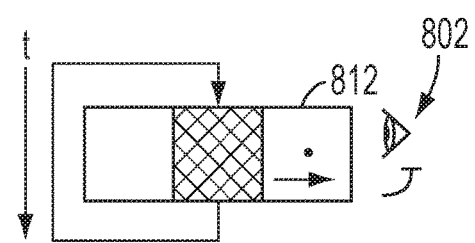

FIG. 8B depicts an exemplary simplified vertical time series illustration of a display control loop used with some forms of the invention incorporating a display-shutter-display element when the element is configured to operate in a normal mode for an observer to the right as depicted.

Figure 8C:
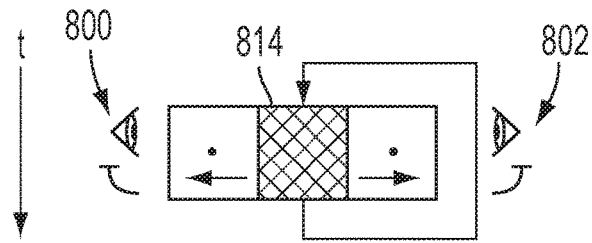

FIG. 8C depicts an exemplary simplified vertical time series illustration of a display control loop used with some forms of the invention incorporating a display-shutter-display element when the element is configured to operate in a presentation mode or a sharing mode.

Figure 8D:
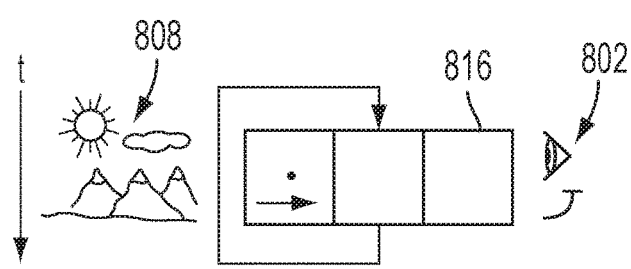

FIG. 8D depicts an exemplary simplified vertical time series illustration of a display control loop used with some forms of the invention incorporating a display-shutter-display element when the element is configured to operate in an augmented reality mode for an observer to the right as depicted.

Figure 8E:
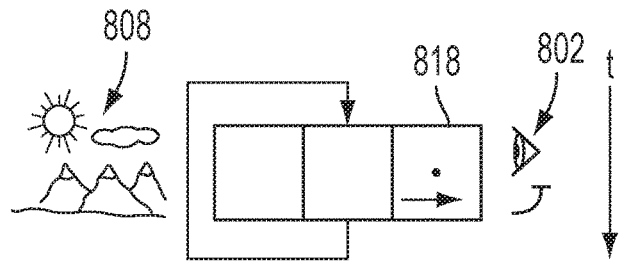

FIG. 8E depicts another exemplary simplified vertical time series illustration of a display control loop used with some forms of the invention incorporating a display-shutter-display element when the element is configured to operate in an augmented reality mode for an observer to the right as depicted.

Figure 8F:
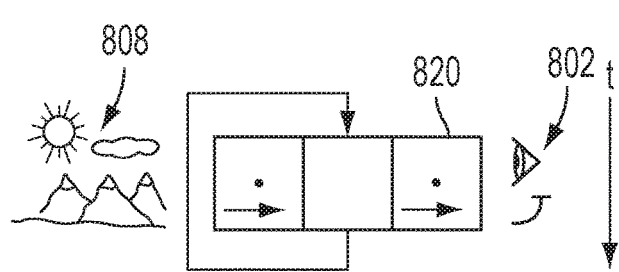

FIG. 8F depicts an exemplary simplified vertical time series illustration of a display control loop used with some forms of the invention incorporating a display-shutter-display element when the element is configured to operate in a two-and-a-half dimensional augmented reality mode for an observer to the right as depicted.

Figure 8G:
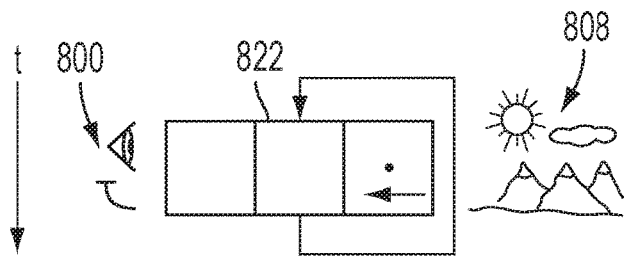

FIG. 8G depicts an exemplary simplified vertical time series illustration of a display control loop used with some forms of the invention incorporating a display-shutter-display element when the element is configured to operate in an augmented reality mode for an observer to the left as depicted.

Figure 8H:
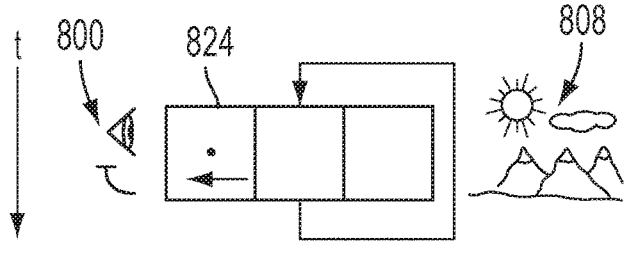

FIG. 8H depicts another exemplary simplified vertical time series illustration of a display control loop used with some forms of the invention incorporating a display-shutter-display element when the element is configured to operate in an augmented reality mode for an observer to the left as depicted.

Figure 8I:
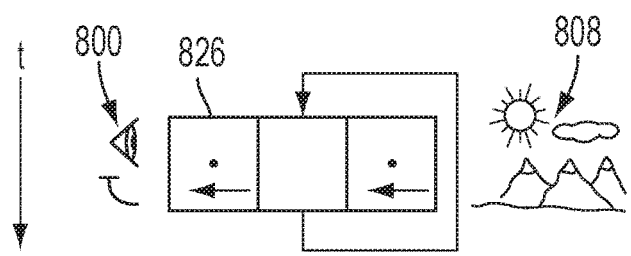

FIG. 8I depicts an exemplary simplified vertical time series illustration of a display control loop used with some forms of the invention incorporating a display-shutter-display element when the element is configured to operate in a two-and-a-half dimensional augmented reality mode for an observer to the left as depicted.

Figure 8J:
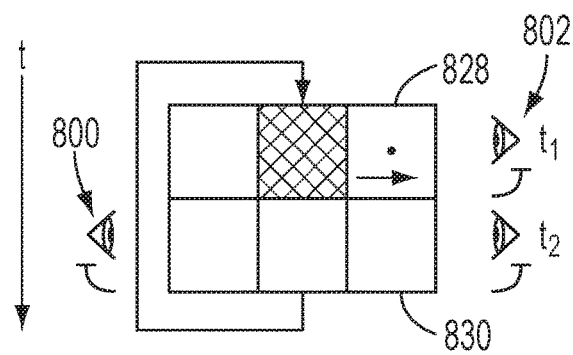

FIG. 8J depicts an exemplary simplified vertical time series illustration of a display control loop used with some forms of the invention incorporating a display-shutter-display element when the element is configured to operate in an unobstructed mode for an observer to the right as depicted.

Figure 8K:
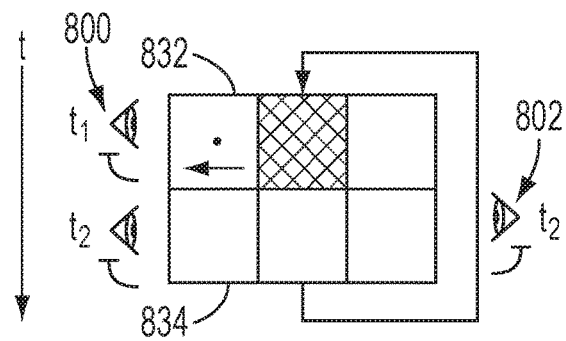

FIG. 8K depicts an exemplary simplified vertical time series illustration of a display control loop used with some forms of the invention incorporating a display-shutter-display element when the element is configured to operate in an unobstructed mode for an observer to the left as depicted.

Figure 8L:
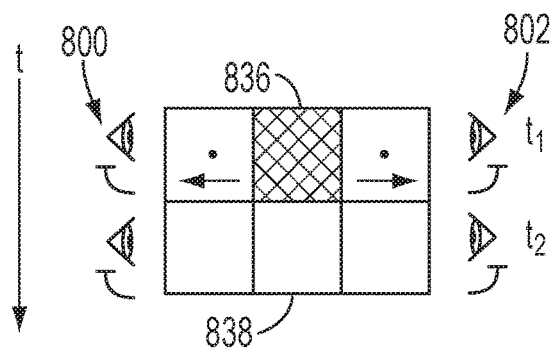

FIG. 8L depicts an exemplary simplified vertical time series illustration of a display control loop used with some forms of the invention incorporating a display-shutter-display element when the element is configured to operate in an unobstructed mode.

Figure 8M:
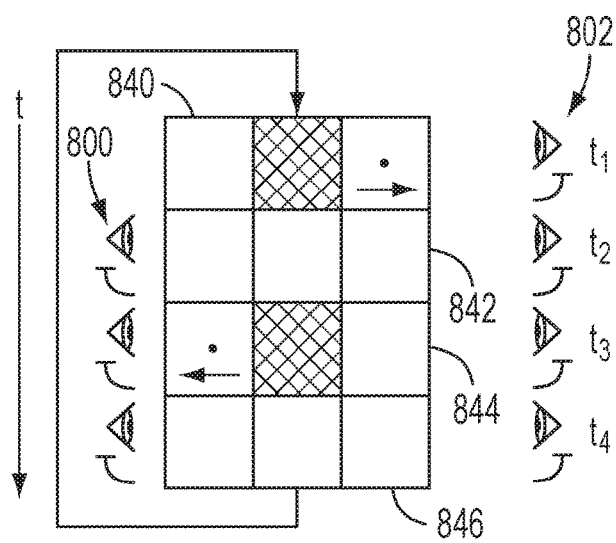

FIG. 8M depicts another exemplary simplified vertical time series illustration of a display control loop used with some forms of the invention incorporating a display-shutter-display element when the element is configured to operate in an unobstructed mode.

Single SDS Screen Form Factor Configurations.

Figure 9A:
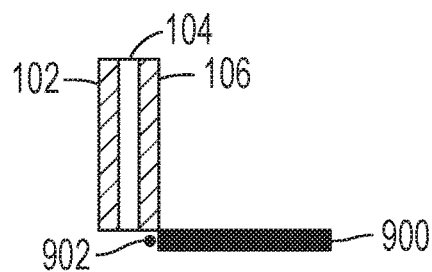

FIG. 9A depicts an exemplary simplified illustration used with some forms of the invention incorporating a shutter-display-shutter screen movably connected to an opaque object such as a computer housing or keyboard in an upright laptop configuration.

Figure 9B:
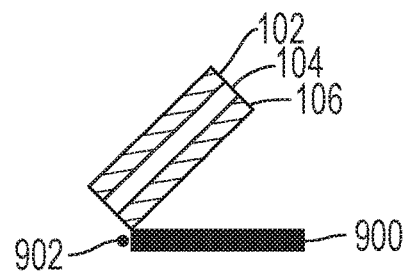

FIG. 9B depicts an exemplary simplified illustration used with some forms of the invention incorporating a shutter-display-shutter screen movably connected to an opaque object such as a computer housing or keyboard in a stand position laptop configuration.

Figure 9C:
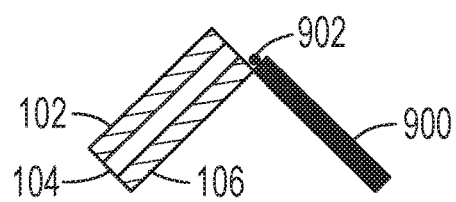

FIG. 9C depicts an exemplary simplified illustration used with some forms of the invention incorporating a shutter-display-shutter screen movably connected to an opaque object such as a computer housing or keyboard in a tent position laptop configuration.

Figure 9D:
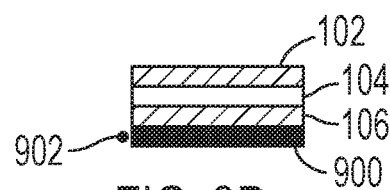

FIG. 9D depicts an exemplary simplified illustration used with some forms of the invention incorporating a shutter-display-shutter screen movably connected to an opaque object such as a computer housing or keyboard in a tablet position laptop configuration.

Figure 9E:
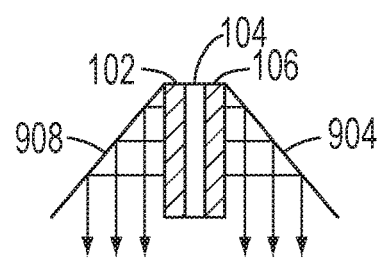

FIG. 9E depicts an exemplary simplified illustration used with some forms of the invention incorporating a shutter-display-shutter screen positioned relative to two reflecting surfaces in an extra wide display configuration.

Figure 9F:
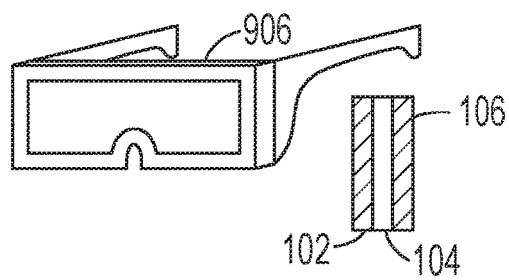

FIG. 9F depicts an exemplary simplified illustration used with some forms of the invention incorporating a single shutter-display-shutter screen in a glasses or goggles configuration.

Single SD (or DS) Screen Form Factor Configurations.

Figure 9G:
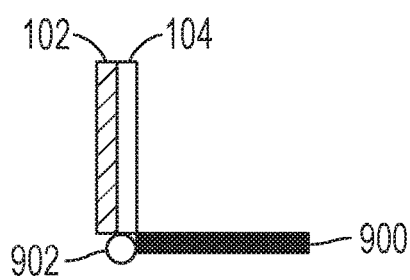

FIG. 9G depicts an exemplary simplified illustration used with some forms of the invention incorporating a single shutter-display screen connected to an object via a hinge in an upright laptop configuration.

Figure 9H:
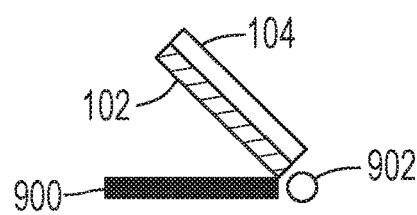

FIG. 9H depicts an exemplary simplified illustration used with some forms of the invention incorporating a shutter-display screen movably connected to an opaque object such as a computer housing or keyboard in a stand position laptop configuration.

Figure 9I:
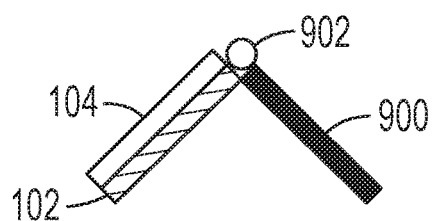

FIG. 9I depicts an exemplary simplified illustration used with some forms of the invention incorporating a shutter-display screen movably connected to an opaque object such as a computer housing or keyboard in a tent position laptop configuration.

Figure 9J:
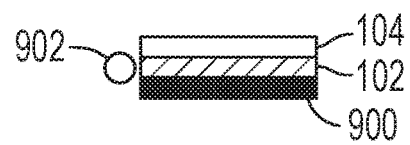

FIG. 9J depicts an exemplary simplified illustration used with some forms of the invention incorporating a shutter-display screen movably connected to an opaque object such as a computer housing or keyboard in a tablet configuration.

Single DSD Screen Form Factor Configurations.

Figure 10A:
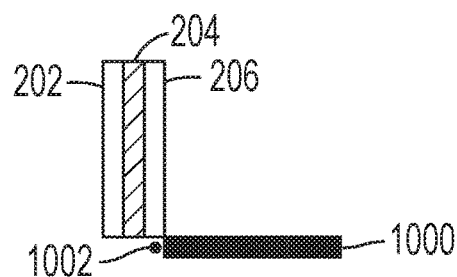

FIG. 10A depicts an exemplary simplified illustration used with some forms of the invention incorporating a display-shutter-display screen movably connected to an opaque object such as a computer housing or keyboard in an upright laptop configuration.

Figure 10B:
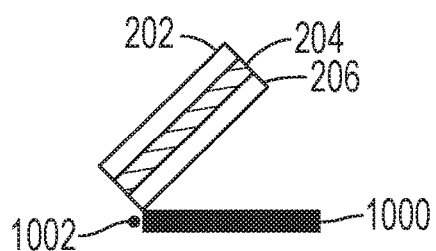

FIG. 10B depicts an exemplary simplified illustration used with some forms of the invention incorporating a display-shutter-display screen movably connected to an opaque object such as a computer housing or keyboard in a stand position laptop configuration.

Figure 10C:
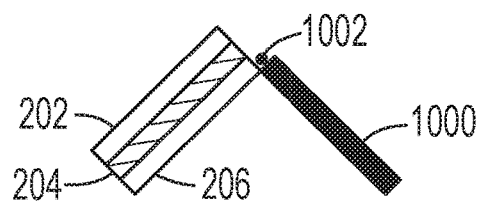

FIG. 10C depicts an exemplary simplified illustration used with some forms of the invention incorporating a display-shutter-display screen movably connected to an opaque object such as a computer housing or keyboard in a tent position laptop configuration.

Figure 10D:
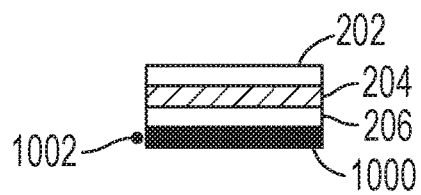

FIG. 10D depicts an exemplary simplified illustration used with some forms of the invention incorporating a display-shutter-display screen movably connected to an opaque object such as a computer housing or keyboard in a tablet position laptop configuration.

Figure 10E:
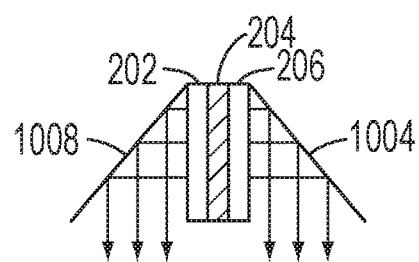

FIG. 10E depicts an exemplary simplified illustration used with some forms of the invention incorporating a display-shutter-display screen positioned relative to two reflecting surfaces in an extra wide display configuration.

Figure 10F:
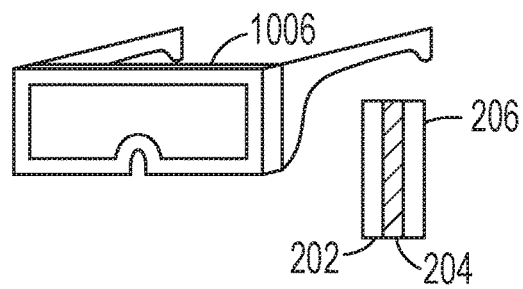

FIG. 10F depicts an exemplary simplified illustration used with some forms of the invention incorporating a single display-shutter-display screen in a glasses or goggles configuration.

Dual SDS Screen Form Factor Configurations.

Figure 11A:
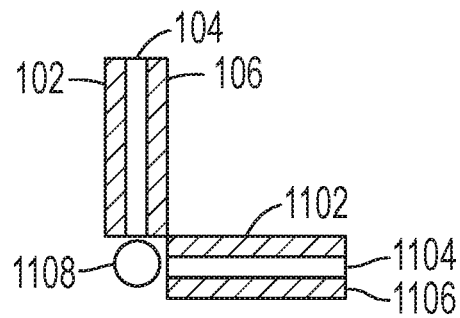

FIG. 11A depicts an exemplary simplified illustration used with some forms of the invention incorporating dual shutter-display-shutter screens movably connected in an upright laptop configuration.

Figure 11B:
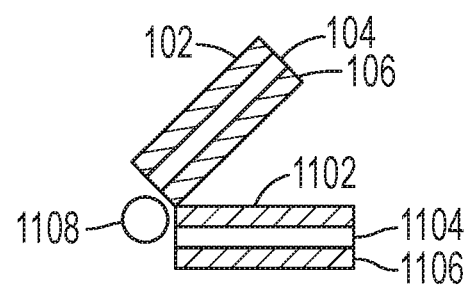

FIG. 11B depicts an exemplary simplified illustration used with some forms of the invention incorporating dual shutter-display-shutter screens movably connected in a stand laptop configuration.

Figure 11C:
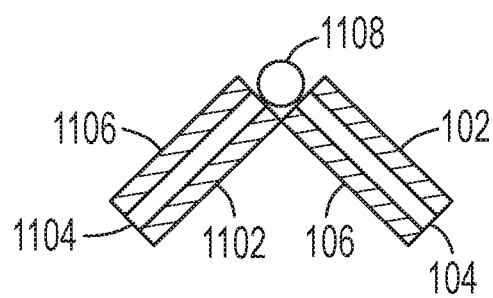

FIG. 11C depicts an exemplary simplified illustration used with some forms of the invention incorporating dual shutter-display-shutter screens movably connected in a tent laptop configuration.

Figure 11D:
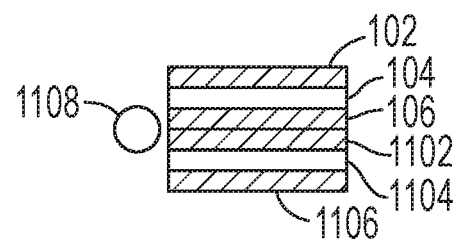

FIG. 11D depicts an exemplary simplified illustration used with some forms of the invention incorporating dual shutter-display-shutter screens movably connected in a small tablet configuration.

Figure 11E:
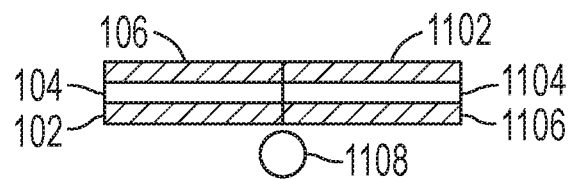

FIG. 11E depicts an exemplary simplified illustration used with some forms of the invention incorporating dual shutter-display-shutter screens movably connected in a large tablet configuration. While the hinge is depicted below the screen in the simplified illustration, it may be positioned between the two screens so that the device is able to lay flat on a table or other surface.

Dual DSD Screen Form Factor Configurations.

Figure 12A:
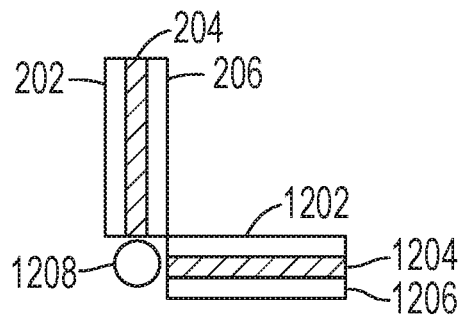

FIG. 12A depicts an exemplary simplified illustration used with some forms of the invention incorporating dual display-shutter-display screens movably connected in an upright laptop configuration.

Figure 12B:
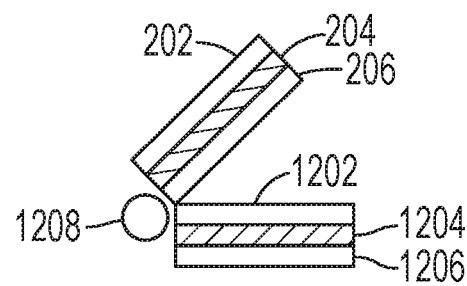

FIG. 12B depicts an exemplary simplified illustration used with some forms of the invention incorporating dual display-shutter-display screens movably connected in a stand laptop configuration.

Figure 12C:
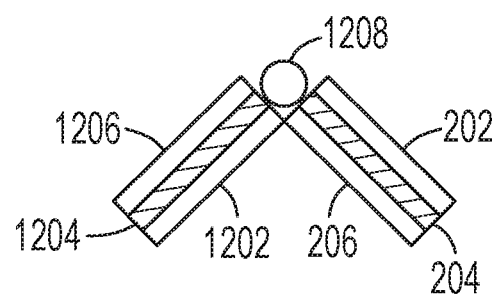

FIG. 12C depicts an exemplary simplified illustration used with some forms of the invention incorporating dual display-shutter-display screens movably connected in a tent laptop configuration.

Figure 12D:
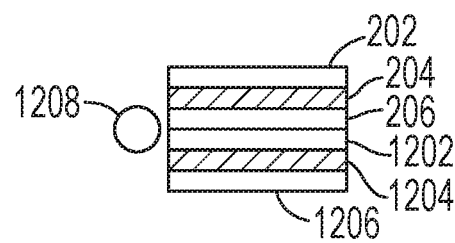

FIG. 12D depicts an exemplary simplified illustration used with some forms of the invention incorporating dual display-shutter-display screens movably connected in a small tablet configuration.

Figure 12E:
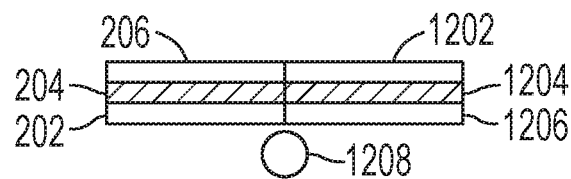

FIG. 12E depicts an exemplary simplified illustration used with some forms of the invention incorporating dual display-shutter-display screens movably connected in a large tablet configuration. While the hinge is depicted below the screen in the simplified illustration, it may be positioned between the two screens so that the device is able to lay flat on a table or other surface.

Device Context Determination.

FIG. 13 is a table depicting different device states based on a detected screen orientation and the detected orientation of the user's face.

Figure 14:
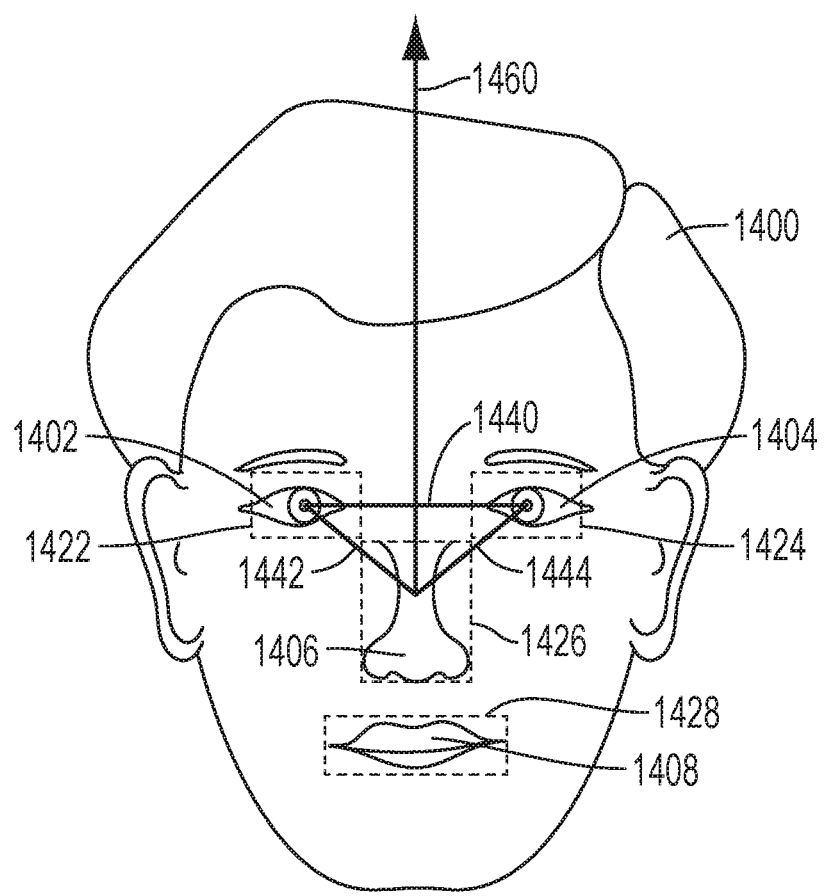

FIG. 14 depicts one form of face orientation detection.

Figure 15:
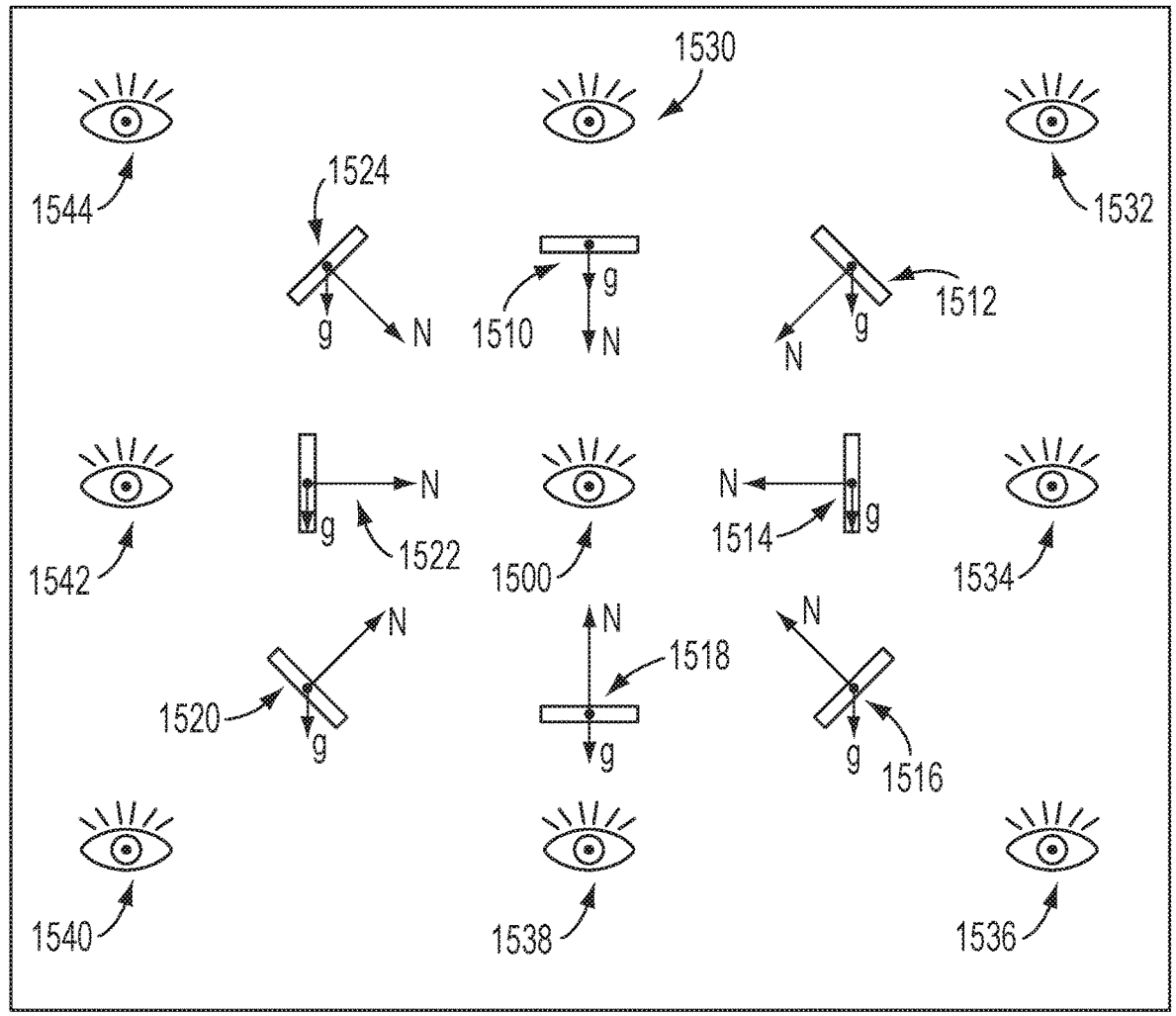

FIG. 15 is a table depicting different relative observer position detection states.

Exemplary Devices.

Figure 16A:
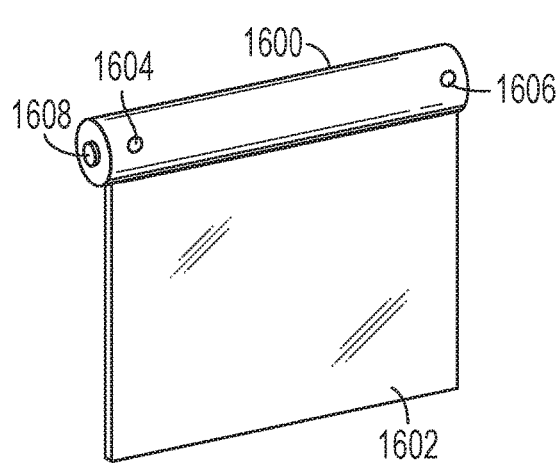

FIG. 16A depicts an exemplary single screen device.

Figure 16B:
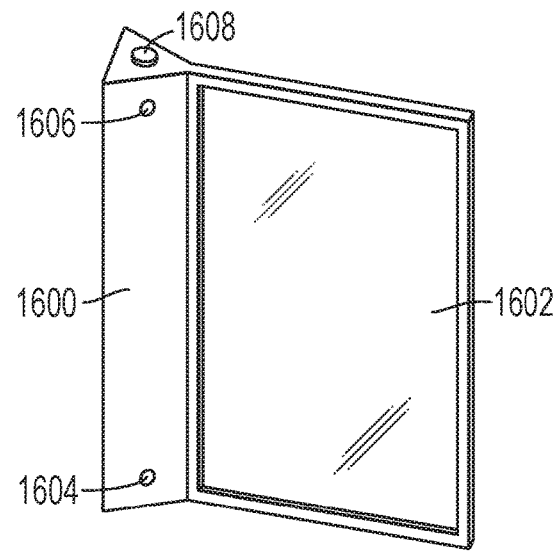

FIG. 16B depicts another exemplary single screen device.

Figure 17A:
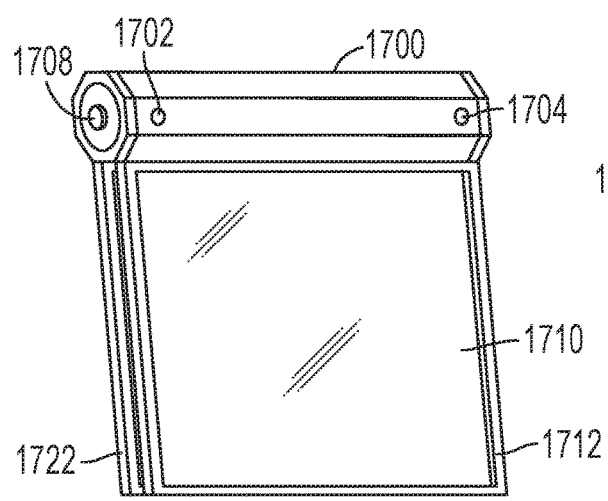

FIG. 17A depicts an exemplary multi-screen device in a small tablet or closed configuration.

Figure 17B:
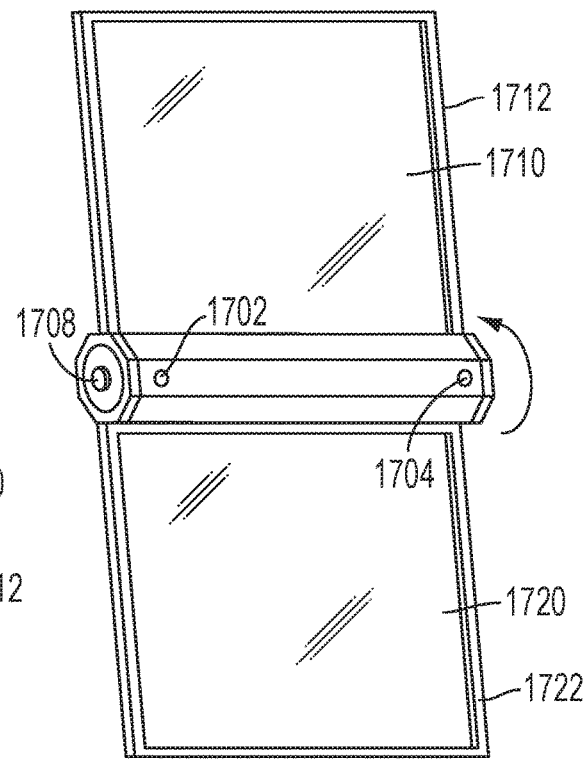

FIG. 17B depicts an exemplary multi-screen device in a large tablet configuration.

Perspective Correction for See-Through Displays in Augmented Reality Applications.

Figure 18A:
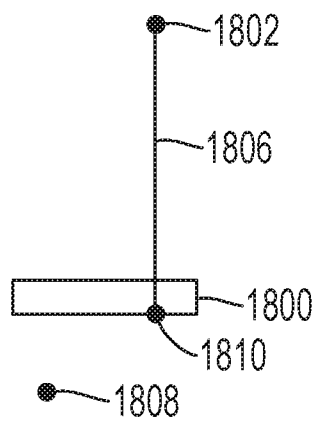

FIG. 18A depicts the simplified geometry of a device reproducing an object on a screen without accounting for the perspective of the user.

Figure 18B:
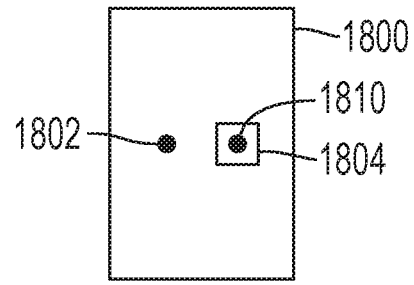

FIG. 18B depicts a view of a device screen from the perspective of a user with an annotation centered over an image of an object.

Figure 18C:
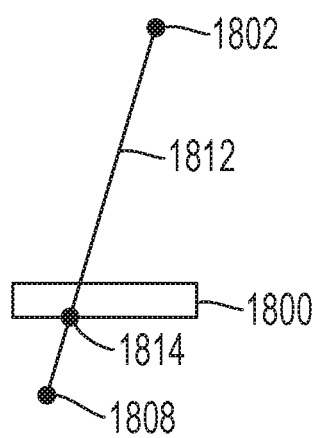

FIG. 18C depicts the simplified geometry of a device reproducing an object on a screen while accounting for the perspective of the user based on the determined position of the user relative to the screen.

Figure 18D:
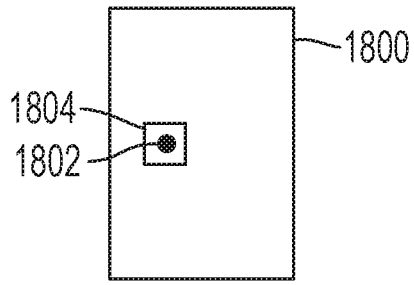

FIG. 18D depicts a view of a device with a transparent display screen from the perspective of a user with a mixed reality annotation centered over the user's view of the object through the transparent display.

Exemplary Applications.

Figure 19A:
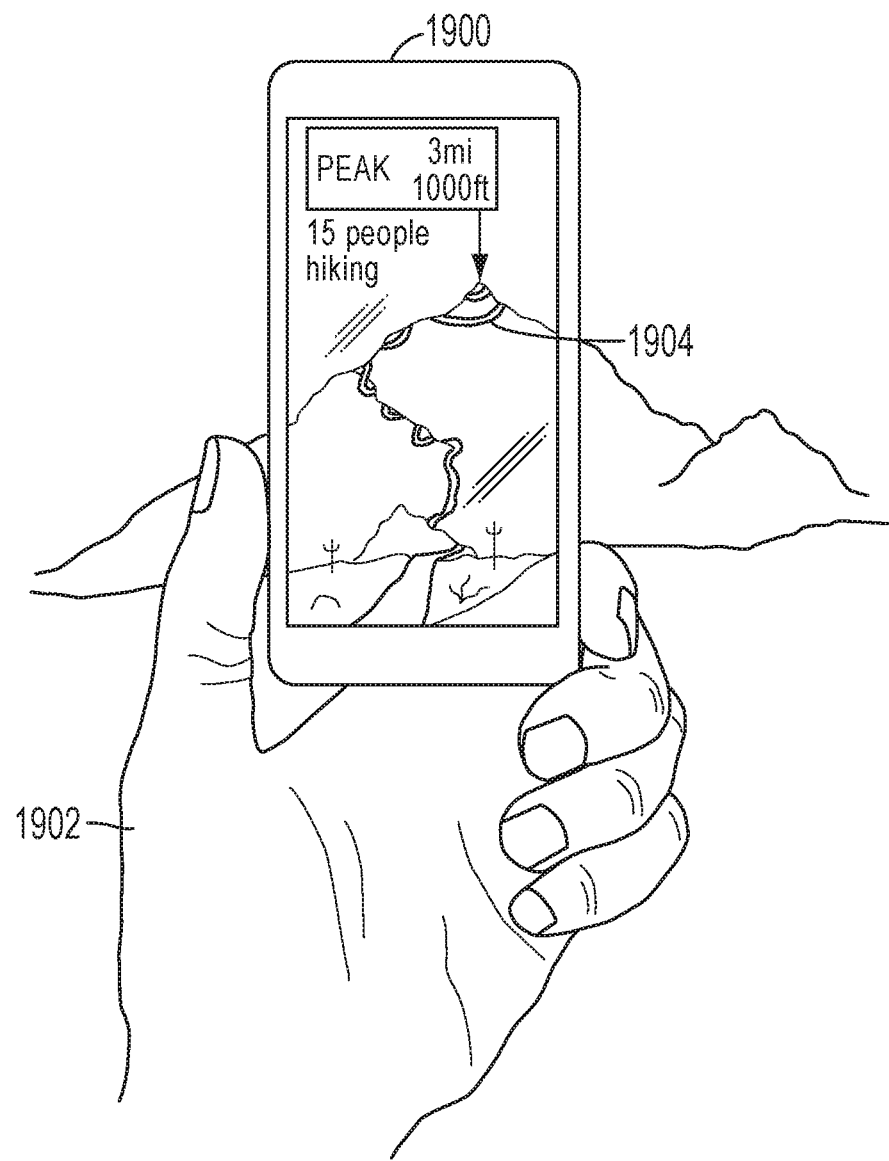

FIG. 19A depicts an example location-based mixed-reality hiking or mapping application running on a single screen device with a multi-mode display.

Figure 19B:
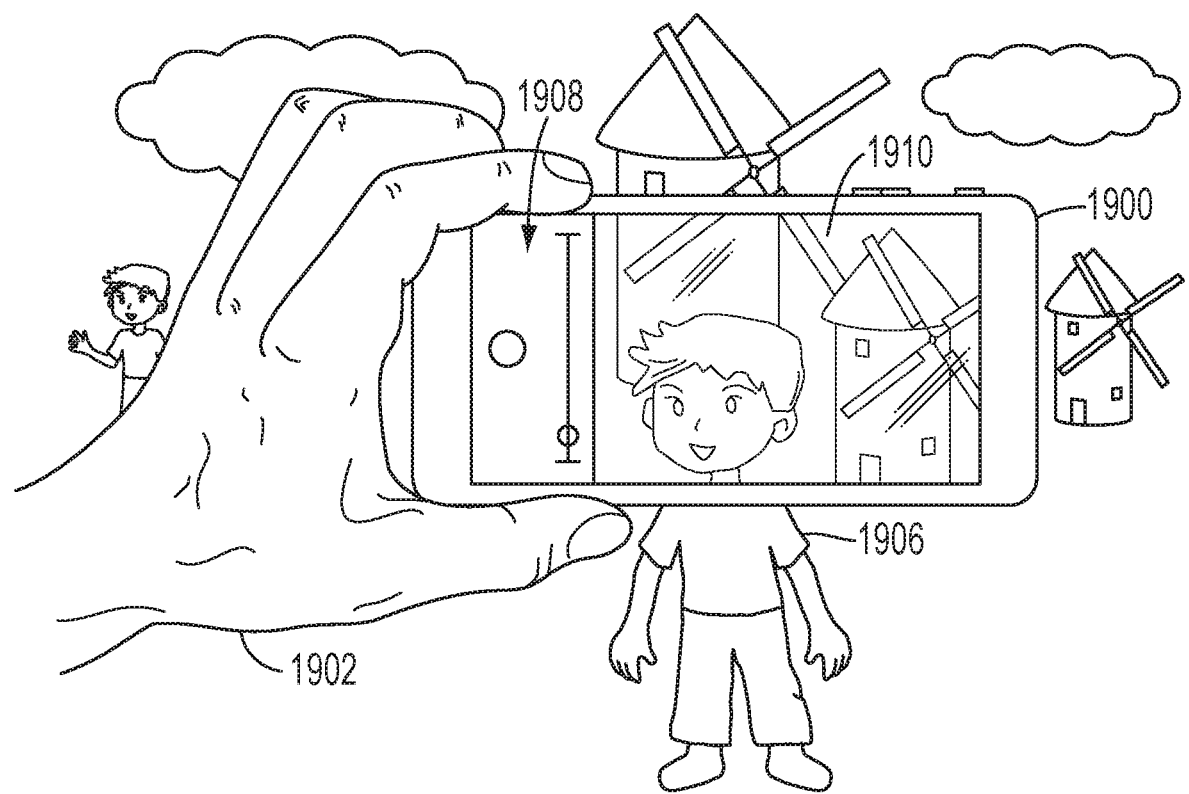

FIG. 19B depicts an example mixed-reality camera application running on a single screen device with a multi-mode display.

Elements and acts in the figures are illustrated for simplicity and clarity, and the drawings have not necessarily been rendered according to any sequence or embodiment, and their simplicity should not use to limit the scope of the invention.

DETAILED DESCRIPTION

In the following description, and for the purposes of explanation, numerous specific details are set forth in order to provide a thorough understanding of the various aspects of the invention. It will be understood, however, by those skilled in the relevant arts, that the present invention may be practiced without these specific details. In other instances, known structures and devices are shown or discussed more generally to avoid obscuring the invention. In many cases, a description of the operation is sufficient to enable one to implement the various forms of the invention, particularly when the operation is to be implemented in software. It should be noted that there are many different and alternative configurations, devices and technologies to which the disclosed inventions may be applied. The full scope of the inventions is not limited to the examples that are described below.

In addition to the description provided above, additional information is provided in the file history associated with this application and the associated provisional application referenced above (e.g., as an Appendix to the Specification, Information Disclosure Statement, Transmittal Letter, etc.); those materials are hereby incorporated by reference in its entirety.

I. Overview

I.1. Transparent Display (TD) Technologies.

There are two main see-through display technologies, LCD and LED. In see-through displays the difference between the absorptive nature of the LCD and emissive nature of the OLED gives them very different visual appearances. LCD systems impose a pattern of shading and colors on the background light seen through the display, while OLED systems impose a glowing image pattern on the background by using LED element suspended in a transparent medium.

I.1.A Liquid Crystal Display (LCD).

While any LCD panel is "see through" to some extent, most are placed in front of a back light so that the display image is bright and consistent to users. Furthermore, conventional LCDs have relatively low transmission efficiency so that they tend to appear somewhat dark against natural light. LCDs intended specifically for see-through displays are usually designed to have improved transmission efficiency. An alternative approach to commercializing this technology is to offer conventional back-lit display systems without the back-light system. LCD displays often also require removing a diffuser layer to adapt them for use as transparent displays. The key limitation to see-through LCD efficiency is in the polarizing filters, which inherently limit the transmission efficiency for un-polarized light to 50% or less. Inexpensive polarizing films also have relatively low transmission efficiency, though commercial development efforts have had some success in improving it. LCD technology may be used as a transparent display as discussed herein.

I.1.B Light-Emitting and Emissive Displays.

LED and OLED screens have two layers of glass on both sides of a set of addressable LEDs. Both inorganic and organic (OLED) LEDs can be used for this purpose. OLEDs consist of an emissive and conductive layer. Electrical impulses travel through the conductive layer and produce light at the emissive layer. This is different from LCDs in that OLEDs produce their own light, which produces better visual effect with a see-through display. The narrow gap between the pixels of the screen as well as the clear cathodes within allow the screens to be transparent. However, because the screens are transparent and use LEDs to emit light of various colors, they cannot display black portions of images. Also, while some transparent display elements have been available over time, many have been discontinued due to lack of demand. LED, OLED, and similar display technology may be used as a transparent display as discussed herein.

I.1.C Other Transparent Display Technologies.

While LED and OLED transparent-display panels are a type of transparent display element that can be used with the invention, any form of transparent display may be used.

I.2. Active Shutter (AS) Technologies.

An active shutter is a substantially transparent element that can be actuated to become opaque. There are many types of active shutters such as Kerr cell shutters and various types of liquid crystal shutters.

I.2.A Kerr Cell Shutters (KCS).

A Kerr cell shutter is a type of photographic shutter used for very fast shutter speeds down to nanosecond level. The Kerr Cell consists of a transparent container filled with nitrobenzene with attached electrodes. A high voltage is passed through the electrodes which causes an electric field perpendicular to the transmitted light beam to be applied. The nitrobenzene becomes birefringent under the influence of the electric field. This allows it to be used as a shutter that can be opened for a very brief amount of time, around 10 ns.

I.2.B Liquid Crystal Shutter (LCS).

Generally, a LCS is a liquid crystal layer which has the property of becoming opaque when voltage is applied (or removed), and being otherwise transparent in its other state. The shutter is controlled by a signal that allows the liquid crystal layer to block light or allow light to pass through the element. There are different types of devices, such as a twisted-nematic (TN) cell and a pi cell. According to one suppliers, a typical TN shutter will only toggle at a rate of about 90 to 100 Hz, while rates, up to about 1000 Hz are achieved with a pi cell. As such, pi cell LC shutters are generally used in applications where very fast switching cycle times are required. Pi cells also have an increased viewing angle, which is the result of the self-compensating nature of the cell structure.

I.2.C Smart Glass.

Smart glass or switchable glass (also smart windows or switchable windows in those applications) is glass or glazing whose light transmission properties are altered when voltage, light or heat is applied. Generally, the glass changes from translucent to transparent, changing from blocking some (or all) wavelengths of light to letting light pass through. Smart glass technologies include electrochromic, photochromic, thermochromic, suspended particle, microblind and polymer dispersed liquid crystal devices.

I.2.D Other Active Shutter Technologies.

While liquid crystal shutters (LCS) are currently the preferred type of active shutter (AS) element to be used with the invention, any form of active shutter may be used. In some forms of the invention the active shutter will have a fast switching rate. In some forms of the invention the active shutter will have low-reflectance so that it absorbs light instead of reflecting light.

I.3. TD with AS.

Various forms of the invention combine TD and AS technologies and use them in combination with one another to advantageously display images and optionally create opaque, transparent, or translucent effects along with single-sided or double-sided display images as further described throughout.

The disclosure is generally organized as follows. First, display elements that are created with TD and AS technologies are discussed. Second, the different states that the display elements may be operated in are discussed. Third, display modes created by combining display element states that can be used with the inventive display elements (or other display technologies) are discussed. Fourth, device form factors incorporating the display elements are discussed along with examples of the different form factor device configurations and display modes that may be used in each configuration. Finally, additional examples and applications of dual-sided transparent displays of any type are discussed.

The various display elements may variously be used for any of the disclosed display modes, devices, and applications in any combination.

II. Exemplary Display Elements.

Any of the configurations discussed herein may be used or modified for use with any form of the invention described herein. For purposes of illustration and without limitation, any basic simplified display element structure or configuration may be used or modified for use with any of the displays described herein, any appropriate display element state or mode described below or otherwise, any of the device form factors described below or otherwise, any of the applications described below or otherwise.

Numerous configurations can be achieved with TD and AS elements as further described below. Examples of shutter-display-shutter (SDS) and display-shutter-display (DSD) as well as shutter-display (SD) or display-shutter (DS) are provided for purposes of illustration and without limitation below.

II.1 Basic Simplified Screen Element Structure for a "SDS Display" (and SD or DS Displays)

II.1.A Shutter-Display-Shutter (SDS).

Figure 1A:
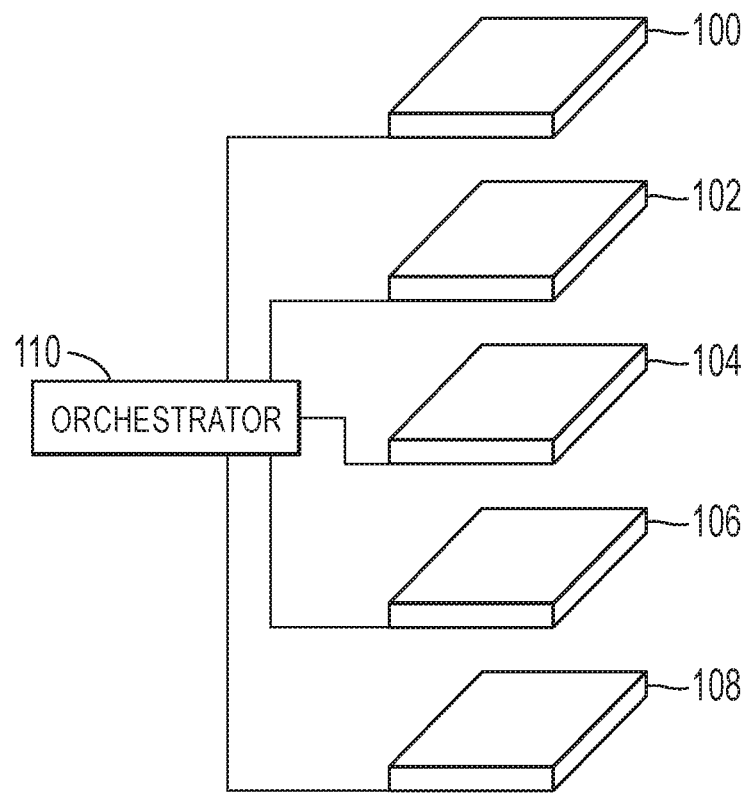
FIG. 1A depicts a separated block diagram of hardware used by some forms of the invention including two active shutters, one transparent display screen, and two touch sensing components.
Figure 1B:
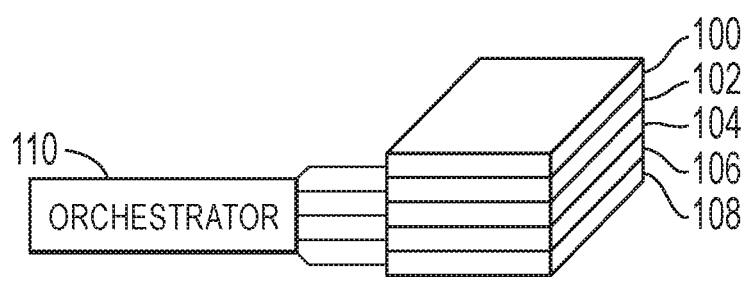
FIG. 1B depicts a joined block diagram of hardware used by some forms of the invention including two active shutters, one transparent display screen, and two touch sensing components.
Figure 1C:
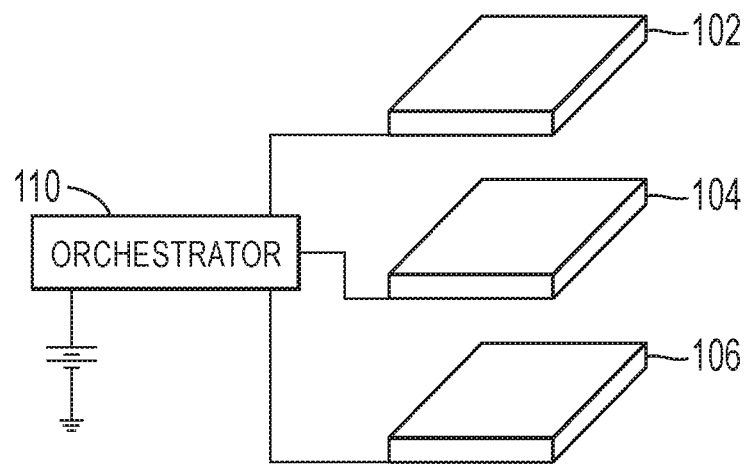
FIG. 1C depicts a separated block diagram of hardware used by some forms of the invention including two active shutters and one transparent display screen.

With reference to FIG. 1A (which depicts a separated block diagram of hardware used by some forms of the invention including two active shutters, one transparent display screen, and two touch sensing panels), FIG. 1B (which depicts a joined block diagram of hardware used by some forms of the invention including two active shutters, one transparent display screen, and two touch sensing panels), and FIG. 1C (which depicts a separated block diagram of hardware used by some forms of the invention including two active shutters and one transparent display screen), a transparent display 104 is placed in-between a first active shutter 102 and a second active shutter 106. There is an orchestrator 110 (which may be a stand-alone component or a module that is part of or software that is run on a central processing unit, display controller, microprocessor, microcontroller, or any other type of circuitry capable of controlling the various elements of the display as further described throughout) operatively coupled to the various components as described and shown.

Touch input sensors may also be integrated into components of the display. For example, with respect to FIG. 1C, the touch sensing may be integrated into either the active shutters 102 and 106, or may be part of the transparent display 104. As one example, emissive display elements of the transparent display 104 may be driven in a reverse biased mode to detect reflected light from a finger in contact or near the assembly.

With reference to FIG. 1A and FIG. 1B, touch sensor 100 and touch sensor 108 may be placed near active shutters 102 and 106, respectively. Touch sensor may be capacitive, resistive, multi-touch, force-touch, or any other type or variation of or combination of touch sensing technologies.

In forms of the invention using a SDS screen element, the OLED or other display pixels may be bi-directional or omni-directional so that light from the display pixel emanates outward in both or all directions from the display pixel.

II.1.B Display-Shutter (DS) or Shutter-Display (SD).

Figure 1D:
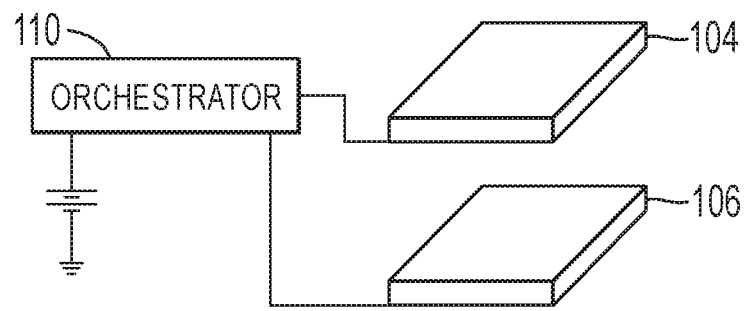
FIG. 1D depicts a separated block diagram of hardware used by some forms of the invention including one active shutter and one transparent display screen.

FIG. 1D (which depicts a separated block diagram of hardware used by some forms of the invention) includes one active shutter 106 and one transparent display screen 104 driven by an orchestrator 110.

In any form of the invention, there may also be any type of input or touch sensing technology integrated into the assembly, or otherwise used in conjunction with the assembly.

II.2 Basic Simplified Screen Element Structure for a "DSD Display"

II.2.A Display-Shutter-Display (DSD).

With reference to FIG. 2A (which depicts a separated block diagram of hardware used by some forms of the invention including two transparent display screens, one active shutter, and two touch sensing panels), FIG. 2B (which depicts a joined block diagram of hardware used by some forms of the invention including two transparent display screens, one active shutter, and two touch sensing panels), and FIG. 2C (which depicts a separated block diagram of hardware used by some forms of the invention including two transparent display screens, and one active shutter), an active shutter 204 is placed in-between a first transparent display 202 and a second transparent display 206. There is an orchestrator 110 (which may be a stand-alone component or a module that is part of or software that is run on a central processing unit, display controller, microprocessor, or any other type of circuitry capable of controlling the various elements of the display as further described throughout) operatively coupled to the various components as described and shown.

Touch input sensors may also be integrated into components of the display. For example, with respect to FIG. 2C, the touch sensing may be integrated into either the transparent displays 202 and 206, or may be part of the active shutter 204. As one example, emissive display elements of the transparent displays 202 and 206 may be driven in reverse biased mode to detect reflected light from a finger in contact or near the assembly.

With reference to FIG. 1A and FIG. 1B, touch sensor 100 and touch sensor 108 may be placed near transparent displays 202 and 206, respectively. Touch sensor may be capacitive, resistive, multi-touch, force-touch, or any other type or variation of or combination of touch sensing technologies.

II.2.B Display-Object-Display (DOD).

FIG. 2D depicts a separated block diagram of hardware used by some forms of the invention) includes two transparent displays 202 and 206 on either side of object 200 driven by an orchestrator 110. In any form of the invention, there may also be any type of input or touch sensing technology integrated into the assembly.

In forms of the invention using a DSD screen element, the OLED or other display pixels may be focused or otherwise directed or reflected outward from the shutter element of the screen.

II.3 Touch Sensing/Scanning/Emissive Touch Input.

In any form of the invention, there may also be any type of input or touch sensing technology integrated into the assembly, or placed within the assembly, or affixed to the assembly.

II.3.A Emissive Touch Input.

The emissive screen elements may be utilized for touch input as described in the following documents: See Cite No. D062. See also, e.g., U.S. Pat. No. 7,859,526.

II.3.B Scanning Display.

Portions of a display panel may also operate as an image scanner (e.g., functionality of a flat-bed scanner), or touch input sensors (e.g., instead of or in addition to resistive or capacitive touch sensors).

II.4 Construction.

Note that any type of construction is acceptable. Each element may be a pixel of a screen, each element may be a pane of a screen, the active shutter elements may be sized differently than the transparent display elements, active shutter elements larger than pixel of transparent display but less than whole size of transparent display. For example, the active shutter elements may be formed from strips that cover rows or columns of a transparent display panel. Furthermore, the display may be a flexible display. The active shutter or transparent display technologies may be any type of display technology. The various components may be separate layers stacked together as a combination of components, variously fused together, or provided as one packaged component. For a single panel, there may be one TD element with one AS element. A display may also have display element groups. A TD could be coupled with an AS containing multiple elements, each element corresponding to multiple TD pixels. A display may also contain individual display elements. For example, a TD may be coupled with an AS element corresponding to each pixel. For example, one AS may cover the subpixels that comprise a pixel. A display may also be a portion of a "traditional" otherwise non-see-through display panel. A TD may form a "window" in the panel. Any combination of the above (e.g., could be different for each side of device, etc.).

Furthermore, other types and variations of elements and states can be determined. Display (D) and shutter (S) elements may be stacked in any order and combination including the following: DS, SD, DSD, SDS, DSSD, SDSD, SDSDS, SDSSDS, and SSDSS. Any combination imaginable may be used. Furthermore, each part can be made from a different display or shutter technology if desirable.

III. Exemplary Display Element States

III. A SDS Element States.

Any of the element states discussed herein may be used or modified for use with any form of the invention described herein. For purposes of illustration and without limitation, any display state may be used or modified for use with any of the displays described above, any display mode described below or otherwise, any of the device form factors described below or otherwise, any of the applications described below or otherwise.

In some forms of the invention Shutter-Display-Shutter (SDS) configurations are used. Generally, SDS configurations exemplified in FIGS. 1A, 1B, 1C, and 1D (other forms possible) can be configured or placed in any number of states. For example, states corresponding to FIGS. 3A through 3L are possible. By using these states along with the structures and methods described elsewhere herein, forms of the invention can display any color (including any color composed of red, green, blue, white, black, or transparent) on either or both sides of the display.

Regarding the notation used below and throughout:
(1) L: and R: designate left and right of the cross-section depicted in the figures. These designations are for purposes of helping understand the invention and would obviously be reversed if the opposite cross section was taken. In practice, a user will be looking at the front or back of the device predominantly; however, it is easier here to describe the invention with a side cross section so that the front and back relative to the user can be described using left or right due to the limitations of a two-dimensional page. Thus, the left and right designations where used are exemplary and not limiting.
(2) AS.O is when an active shutter is opaque.
(3) AS.T is when an active shutter is transparent.
(4) TD.OFF is when the transparent display is OFF and transparent.
(5) ←TD.ONL is when the transparent display is on and configured to show an image correctly to the observer on the left (as depicted).
(6) TD.ONR→ Is when the transparent display is on and configured to show an image correctly to the observer on the right (as depicted).

With respect to FIG. 3A, a simplified side view illustration of a shutter-display-shutter element used by some forms of the invention is provided. Specifically, the illustration shows a state where the left active shutter 102 is opaque (L:AS.O), the elements 304 of the transparent display 104 are illuminated with an image that is properly oriented to an observer attempting to view the screen from the left (←TD.ONL), and the right active shutter 106 is transparent (R:AS.T). An observer to the left of the screen as depicted 300 will observe the opaque active shutter 102. An observer to the right of the screen as depicted 302 will observe an image from the transparent display 104 through transparent active shutter 106 on top of the opaque active shutter 102. The image observed by observer 302 will be mirror image (or flipped horizontally) from what would be considered the correct orientation for the image.

An Opaque State.

With respect to FIG. 3B, a simplified side view illustration of a shutter-display-shutter element used by some forms of the invention is provided. Specifically, the illustration shows a state where the left active shutter 102 is opaque (L:AS.O), the elements 304 of the transparent display 104 are off (TD.OFF), and the right active shutter 106 is transparent). An observer to the left of the screen as depicted 300 will observe the opaque active shutter 102. An observer to the right of the screen as depicted 302 will observe no image from the transparent display 104 through transparent active shutter 106 on top of the opaque active shutter 102. This SDS element state may be referred to or correspond to discussion elsewhere herein described as opaque.

A Normal State (Right).

With respect to FIG. 3C, a simplified side view illustration of a shutter-display-shutter element used by some forms of the invention is provided. Specifically, the illustration shows a state where the left active shutter 102 is opaque (L:AS.O), the elements 304 of the transparent display 104 are illuminated with an image that is properly oriented to an observer attempting to view the screen from the right (TD.ONR→), and the right active shutter 106 is transparent (R:AS.T). An observer to the left of the screen as depicted 300 will observe the opaque active shutter 102. An observer to the right of the screen as depicted 302 will observe an image from the transparent display 104 through transparent active shutter 106 on top of the opaque active shutter 102. The image observed by observer 302 will be in a correct orientation for the image (i.e., not mirror image or flipped horizontally). This SDS element state may be referred to or correspond to discussion elsewhere herein described as normal mode (right).

An Opaque State.

With respect to FIG. 3D, a simplified side view illustration of a shutter-display-shutter element used by some forms of the invention is provided. Specifically, the illustration shows a state where the left active shutter 102 is opaque (L:AS.O), the elements 304 of the transparent display 104 are illuminated with an image that is properly oriented to an observer attempting to view the screen from the left (←TD.ONL), and the right active shutter 106 is opaque (R:AS.O). An observer to the left of the screen as depicted 300 will observe the opaque active shutter 102. An observer to the left of the screen as depicted 302 will observe the opaque active shutter 106. This SDS element state may be referred to or correspond to discussion elsewhere herein described as opaque.

An Opaque State.

With respect to FIG. 3E, a simplified side view illustration of a shutter-display-shutter element used by some forms of the invention is provided. Specifically, the illustration shows a state where the left active shutter 102 is opaque (L:AS.O), the elements 304 of the transparent display 104 are off (TD.OFF), and the right active shutter 106 is opaque (R:AS.O). An observer to the left of the screen as depicted 300 will observe the opaque active shutter 102. An observer to the left of the screen as depicted 302 will observe the opaque active shutter 106. This SDS element state may be referred to or correspond to discussion elsewhere herein described as opaque.

An Opaque State.

With respect to FIG. 3F, a simplified side view illustration of a shutter-display-shutter element used by some forms of the invention is provided. Specifically, the illustration shows a state where the left active shutter 102 is opaque (L:AS.O), the elements 304 of the transparent display 104 are illuminated with an image that is properly oriented to an observer attempting to view the screen from the right (TD.ONL→), and the right active shutter 106 is opaque (R:AS.O). An observer to the left of the screen as depicted 300 will observe the opaque active shutter 102. An observer to the left of the screen as depicted 302 will observe the opaque active shutter 106. This SDS element state may be referred to or correspond to discussion elsewhere herein described as opaque.

A Normal State (Left).

With respect to FIG. 3G, a simplified side view illustration of a shutter-display-shutter element used by some forms of the invention is provided. Specifically, the illustration shows a state where the left active shutter 102 is transparent (L:AS.T), the elements 304 of the transparent display 104 are illuminated with an image that is properly oriented to an observer attempting to view the screen from the left (←TD.ONL), and the right active shutter 106 is opaque (R:AS.O). An observer to the left of the screen as depicted 300 will observe an image from the transparent display 104 through transparent active shutter 102 on top of the opaque active shutter 106. The image observed by observer 300 will be in a correct orientation for the image (i.e., not mirror image or flipped horizontally). An observer to the right of the screen as depicted 302 will observe the opaque active shutter 106. This SDS element state may be referred to or correspond to discussion elsewhere herein described as normal (left).

An Opaque State.

With respect to FIG. 3H, a simplified side view illustration of a shutter-display-shutter element used by some forms of the invention is provided. Specifically, the illustration shows a state where the left active shutter 102 is transparent (L:AS.T), the elements 304 of the transparent display 104 are off (TD.OFF), and the right active shutter 106 is opaque (R:AS.O). An observer to the left of the screen as depicted 300 will observe no image from the transparent display 104 through transparent active shutter 102 on top of the opaque active shutter 106. An observer to the right of the screen as depicted 302 will observe the opaque active shutter 106. This SDS element state may be referred to or correspond to discussion elsewhere herein described as opaque.

With respect to FIG. 3I, a simplified side view illustration of a shutter-display-shutter element used by some forms of the invention is provided. Specifically, the illustration shows a state where the left active shutter 102 is transparent (L:AS.T), the elements 304 of the transparent display 104 are illuminated with an image that is properly oriented to an observer attempting to view the screen from the right (TD.ONR→), and the right active shutter 106 is opaque (R:AS.O). An observer to the right of the screen as depicted 302 will observe the opaque active shutter 106. An observer to the left of the screen as depicted 300 will observe an image from the transparent display 104 through transparent active shutter 102 on top of the opaque active shutter 106. The image observed by observer 300 will be mirror image (or flipped horizontally) from what would be considered the correct orientation for the image.

An Augmented Reality State (Left).

With respect to FIG. 3J, a simplified side view illustration of a shutter-display-shutter element used by some forms of the invention is provided. Specifically, the illustration shows a state where the left active shutter 102 is transparent (L:AS.T), the elements 304 of the transparent display 104 are illuminated with an image that is properly oriented to an observer attempting to view the screen from the left (←TD.ONL), and the right active shutter 106 is transparent (R:AS.T). An observer to the left of the screen as depicted 300 will observe an image from the transparent display 104 through transparent active shutter 102 on top of the transparent active shutter 106. The image observed by observer 300 will be mirror image (or flipped horizontally) from what would be considered the correct orientation for the image. An observer to the right of the screen as depicted 302 will observe an image from the transparent display 104 through transparent active shutter 106 on top of the transparent active shutter 102. The image observed by observer 302 will be mirror image (or flipped horizontally) from what would be considered the correct orientation for the image. This SDS element state may be referred to or correspond to discussion elsewhere herein described as augmented reality (left).

A Transparent State.

With respect to FIG. 3K, a simplified side view illustration of a shutter-display-shutter element used by some forms of the invention is provided. Specifically, the illustration shows a state where the left active shutter 102 is transparent (L:AS.T), the elements 304 of the transparent display 104 are off (TD.OFF), and the right active shutter 106 is transparent (R:AS.T). An observer to the left of the screen as depicted 300 will observe light transmitted through transparent active shutter 102, transparent display 104, and transparent active shutter 106. An observer to the right of the screen as depicted 302 will observe light transmitted through transparent active shutter 102, transparent display 104, and transparent active shutter 106. This SDS element state may be referred to or correspond to discussion elsewhere herein described as transparent or translucent.

An Augmented Reality State (Right).

With respect to FIG. 3L, a simplified side view illustration of a shutter-display-shutter element used by some forms of the invention is provided. Specifically, the illustration shows a state where the left active shutter 102 is transparent (L:AS.T), the elements 304 of the transparent display 104 are illuminated with an image that is properly oriented to an observer attempting to view the screen from the right (TD.ONR→), and the right active shutter 106 is transparent (R:AS.T).

An observer to the left of the screen as depicted 300 will observe an image from the transparent display 104 through transparent active shutter 102 on top of the transparent active shutter 106. The image observed by observer 300 will be mirror image (or flipped horizontally) from what would be considered the correct orientation for the image. An observer to the right of the screen as depicted 302 will observe an image from the transparent display 104 through transparent active shutter 106 on top of the transparent active shutter 102. The image observed by observer 302 will be mirror image (or flipped horizontally) from what would be considered the correct orientation for the image. This SDS element state may be referred to or correspond to discussion elsewhere herein described as augmented reality (right).

With respect to FIGS. 3G through 3L above, these states illustrate possible states with a form of invention corresponding to the simplified illustration of FIG. 1D by disregarding the active shutter 102 depicted on the left of the simplified illustration.

The elements 304 of the transparent display 104 may be any type of sub-pixel or pixel. For example, they may represent an individual part of a sub-pixel such as a red, green, blue, or white display sub-element, or they may be a complete pixel component. Alternatively, they may be any type of component of a screen responsible for causing light to be emitted or augmented.

III.B DSD Element States.

In some forms of the invention Display-Shutter-Display (DSD) configurations are used. Generally, DSD configurations exemplified in FIGS. 2A, 2B, 2C, and 2D (other forms possible) can be configured or placed in any number of states. For example, states corresponding to FIGS. 4A through 4R are possible. By using these states along with the structures and methods described elsewhere herein, forms of the invention can display any color (including any color composed of red, green, blue, white, black, or transparent) on either or both sides of the display.

An Augmented Reality State (Left).

With respect to FIG. 4A, a simplified side view illustration of a display-shutter-display element used by some forms of the invention is provided. Specifically, the illustration shows a state where the elements of the left transparent display 202 are illuminated with an image that is properly oriented to an observer attempting to view the screen from the left (L:←TD.ONL), the active shutter 204 is transparent (AS.T), and the elements of the right transparent display 206 are off (R:TD.OFF). An observer to the left of the screen as depicted 400 will observe an image from the left transparent display 202 as well as any light transmitted through transparent active shutter 204 right transparent display 202. An observer to the right of the screen as depicted 402 will observe an image from the left transparent display 202 as well as any ambient light transmitted through left transparent display 202, transparent active shutter 204, and right transparent display 206. The image observed by observer 402 will be mirror image (or flipped horizontally) from what would be considered the correct orientation for the image. The image observed by observer 400 will be in a correct orientation for the image (i.e., not mirror image or flipped horizontally). This DSD element state may be referred to or correspond to discussion elsewhere herein described as augmented reality (left).

A Normal State (Left).

With respect to FIG. 4B, a simplified side view illustration of a display-shutter-display element used by some forms of the invention is provided. Specifically, the illustration shows a state where the elements of the left transparent display 202 are illuminated with an image that is properly oriented to an observer attempting to view the screen from the left (L:←TD.ONL), the active shutter 204 is opaque (AS.O), and the elements of the right transparent display 206 are off (R:TD.OFF). An observer to the left of the screen as depicted 400 will observe an image from the left transparent display 202 on top of opaque active shutter 204. An observer to the right of the screen as depicted 402 will observe opaque active shutter 204 through the right transparent display 206. The image observed by observer 400 will be in a correct orientation for the image (i.e., not mirror image or flipped horizontally). This DSD element state may be referred to or correspond to discussion elsewhere herein described as normal (left).

An Augmented Reality State (Right).

With respect to FIG. 4C, a simplified side view illustration of a display-shutter-display element used by some forms of the invention is provided. Specifically, the illustration shows a state where the elements of the left transparent display 202 are illuminated with an image that is properly oriented to an observer attempting to view the screen from the right (L:TD.ONR→), the active shutter 204 is transparent (AS.T), and the elements of the right transparent display 206 are off (R:TD.OFF). An observer to the left of the screen as depicted 400 will observe an image from the left transparent display 202 as well as any ambient light transmitted through left transparent display 202, transparent active shutter 204, and right transparent display 206. An observer to the right of the screen as depicted 402 will observe an image from the left transparent display 202 as well as any ambient light transmitted through left transparent display 202, transparent active shutter 204, and right transparent display 206. The image observed by observer 400 will be mirror image (or flipped horizontally) from what would be considered the correct orientation for the image. The image observed by observer 402 will be in a correct orientation for the image (i.e., not mirror image or flipped horizontally). This DSD element state may be referred to or correspond to discussion elsewhere herein described as augmented reality (right).

With respect to FIG. 4D, a simplified side view illustration of a display-shutter-display element used by some forms of the invention is provided. Specifically, the illustration shows a state where the elements of the left transparent display 202 are illuminated with an image that is properly oriented to an observer attempting to view the screen from the right (L:TD.ONR→), the active shutter 204 is opaque (AS.O), and the elements of the right transparent display 206 are off (R: TD.OFF). An observer to the left of the screen as depicted 400 will observe an image from the left transparent display 202 on top of opaque active shutter 204. An observer to the right of the screen as depicted 402 will observe opaque active shutter 204 through the right transparent display 206. The image observed by observer 400 will be mirror image (or flipped horizontally) from what would be considered the correct orientation for the image.

An Augmented Reality State 2.5D (Left).

With respect to FIG. 4E, a simplified side view illustration of a display-shutter-display element used by some forms of the invention is provided. Specifically, the illustration shows a state where the elements of the left transparent display 202 are illuminated with an image that is properly oriented to an observer attempting to view the screen from the left (L:←TD.ONL), the active shutter 204 is transparent (AS.T), and the elements of the right transparent display 206 are illuminated with an image that is properly oriented to an observer attempting to view the screen from the left (R:←TD.ONL). An observer to the left of the screen as depicted 400 will observe an image from the left transparent display 202, an image from the right transparent display 206, as well as any ambient light transmitted through left transparent display 202, transparent active shutter 204, and right transparent display 202. An observer to the right of the screen as depicted 402 will observe an image from the left transparent display 202, an image from the right transparent display 206, as well as any ambient light transmitted through left transparent display 202, transparent active shutter 204, and right transparent display 202. The image observed by observer 402 will be mirror image (or flipped horizontally) from what would be considered the correct orientation for the image from both transparent displays 202 and 206. The image observed by observer 400 will be in a correct orientation for the image (i.e., not mirror image or flipped horizontally) from both transparent displays 202 and 206. This DSD element state may be referred to or correspond to discussion elsewhere herein described as two-and-a-half dimensional augmented reality or the like.

With respect to FIG. 4F, a simplified side view illustration of a display-shutter-display element used by some forms of the invention is provided. Specifically, the illustration shows a state where the elements of the left transparent display 202 are illuminated with an image that is properly oriented to an observer attempting to view the screen from the left (L:←TD.ONL), the active shutter 204 is opaque (AS.O), and the elements of the right transparent display 206 are illuminated with an image that is properly oriented to an observer attempting to view the screen from the left (R:←TD.ONL). An observer to the left of the screen as depicted 400 will observe an image from the left transparent display 202 on top of opaque active shutter 204. An observer to the right of the screen as depicted 402 will observe an image from the right transparent display 206 on top of opaque active shutter 204. The image observed by observer 402 will be mirror image (or flipped horizontally) from what would be considered the correct orientation for the image. The image observed by observer 400 will be in a correct orientation for the image (i.e., not mirror image or flipped horizontally).

With respect to FIG. 4G, a simplified side view illustration of a display-shutter-display element used by some forms of the invention is provided. Specifically, the illustration shows a state where the elements of the left transparent display 202 are illuminated with an image that is properly oriented to an observer attempting to view the screen from the left (L:←TD.ONL), the active shutter 204 is transparent (AS.T), and the elements of the right transparent display 206 are illuminated with an image that is properly oriented to an observer attempting to view the screen from the right (R:TD.ONR→). An observer to the left of the screen as depicted 400 will observe an image from the left transparent display 202, an image from the right transparent display 206, as well as any ambient light transmitted through left transparent display 202, transparent active shutter 204, and right transparent display 202. An observer to the right of the screen as depicted 402 will observe an image from the left transparent display 202, an image from the right transparent display 206, as well as any ambient light transmitted through left transparent display 202, transparent active shutter 204, and right transparent display 202. With respect to observer 400, the image from the left transparent display 202 observed by observer 400 will be in a correct orientation for the image (i.e., not mirror image or flipped horizontally). However, the image from the right transparent display 206 observed by observer 400 will be observed as a mirror image (or flipped horizontally) from what would be considered the correct orientation for the image. With respect to observer 402, the image from the right transparent display 206 observed by observer 402 will be in a correct orientation for the image (i.e., not mirror image or flipped horizontally). However, the image from the left transparent display 202 observed by observer 402 will be observed as mirror image (or flipped horizontally) from what would be considered the correct orientation for the image.

A Sharing or Presentation State, or a Simultaneous Normal State.

With respect to FIG. 4H, a simplified side view illustration of a display-shutter-display element used by some forms of the invention is provided. Specifically, the illustration shows a state where the elements of the left transparent display 202 are illuminated with an image that is properly oriented to an observer attempting to view the screen from the left (L:←TD.ONL), the active shutter 204 is opaque (AS.O), and the elements of the right transparent display 206 are illuminated with an image that is properly oriented to an observer attempting to view the screen from the right (R:TD.ONR→). An observer to the left of the screen as depicted 400 will observe an image from the left transparent display 202 on top of opaque active shutter 204. An observer to the right of the screen as depicted 402 will observe an image from the right transparent display 206 on top of opaque active shutter 204. The image observed by both observers 400 and 402 will be in a correct orientation for the image (i.e., not mirror image or flipped horizontally). This DSD element state may be referred to or correspond to discussion elsewhere herein described as sharing, presentation, or simultaneous normal or the like.

With respect to FIG. 4I, a simplified side view illustration of a display-shutter-display element used by some forms of the invention is provided. Specifically, the illustration shows a state where the elements of the left transparent display 202 are illuminated with an image that is properly oriented to an observer attempting to view the screen from the right (L:TD.ONR→), the active shutter 204 is transparent (AS.T), and the elements of the right transparent display 206 are illuminated with an image that is properly oriented to an observer attempting to view the screen from the left (R:←TD.ONL). An observer to the left of the screen as depicted 400 will observe an image from the left transparent display 202, an image from the right transparent display 206, as well as any ambient light transmitted through left transparent display 202, transparent active shutter 204, and right transparent display 202. An observer to the right of the screen as depicted 402 will observe an image from the left transparent display 202, an image from the right transparent display 206, as well as any ambient light transmitted through left transparent display 202, transparent active shutter 204, and right transparent display 202.

With respect to observer 400, the image from the right transparent display 206 observed by observer 400 will be in a correct orientation for the image (i.e., not mirror image or flipped horizontally). However, the image from the left transparent display 202 observed by observer 400 will be observed as a mirror image (or flipped horizontally) from what would be considered the correct orientation for the image. With respect to observer 402, the image from the left transparent display 206 observed by observer 402 will be in a correct orientation for the image (i.e., not mirror image or flipped horizontally). However, the image from the left transparent display 202 observed by observer 402 will be observed as mirror image (or flipped horizontally) from what would be considered the correct orientation for the image.

With respect to FIG. 4J, a simplified side view illustration of a display-shutter-display element used by some forms of the invention is provided. Specifically, the illustration shows a state where the elements of the left transparent display 202 are illuminated with an image that is properly oriented to an observer attempting to view the screen from the right (L:TD.ONR→), the active shutter 204 is opaque (AS.O), and the elements of the right transparent display 206 are illuminated with an image that is properly oriented to an observer attempting to view the screen from the left (R:←TD.ONL). An observer to the left of the screen as depicted 400 will observe an image from the left transparent display 202 on top of opaque active shutter 204. An observer to the right of the screen as depicted 402 will observe an image from the right transparent display 206 on top of opaque active shutter 204. The image observed by both observers 400 and 402 will be mirror image (or flipped horizontally) from what would be considered the correct orientation for the image.

An Augmented Reality State 2.5D (Right).

With respect to FIG. 4K, a simplified side view illustration of a display-shutter-display element used by some forms of the invention is provided. Specifically, the illustration shows a state where the elements of the left transparent display 202 are illuminated with an image that is properly oriented to an observer attempting to view the screen from the right (L:TD.ONR→), the active shutter 204 is transparent (AS.T), and the elements of the right transparent display 206 are illuminated with an image that is properly oriented to an observer attempting to view the screen from the right (R:TD.ONR→). An observer to the left of the screen as depicted 400 will observe an image from the left transparent display 202, an image from the right transparent display 206, as well as any ambient light transmitted through left transparent display 202, transparent active shutter 204, and right transparent display 202. An observer to the right of the screen as depicted 402 will observe an image from the left transparent display 202, an image from the right transparent display 206, as well as any ambient light transmitted through left transparent display 202, transparent active shutter 204, and right transparent display 202. With respect to observer 400, the images from both the right transparent display 206 and the left transparent display 202 observed by observer 400 will be observed as a mirror image (or flipped horizontally) from what would be considered the correct orientation for the image. With respect to observer 402, the image from both the left transparent display 202 and the right transparent display 206 observed by observer 402 will be in a correct orientation for the image (i.e., not mirror image or flipped horizontally). This DSD element state may be referred to or correspond to discussion elsewhere herein described as two-and-a-half dimensional augmented reality (right) or the like.

With respect to FIG. 4L, a simplified side view illustration of a display-shutter-display element used by some forms of the invention is provided. Specifically, the illustration shows a state where the elements of the left transparent display 202 are illuminated with an image that is properly oriented to an observer attempting to view the screen from the right (L:TD.ONR→), the active shutter 204 is opaque (AS.O), and the elements of the right transparent display 206 are illuminated with an image that is properly oriented to an observer attempting to view the screen from the right (R:TD.ONR→). An observer to the left of the screen as depicted 400 will observe an image from the left transparent display 202 on top of opaque active shutter 204. An observer to the right of the screen as depicted 402 will observe an image from the right transparent display 206 on top of opaque active shutter 204. The image observed by observer 400 will be mirror image (or flipped horizontally) from what would be considered the correct orientation for the image. The image observed by observer 402 will be in a correct orientation for the image (i.e., not mirror image or flipped horizontally).

An Augmented Reality State (Left).

With respect to FIG. 4M, a simplified side view illustration of a display-shutter-display element used by some forms of the invention is provided. Specifically, the illustration shows a state where the elements of the left transparent display 202 are off (L:TD.OFF), the active shutter 204 is transparent (AS.T), and the elements of the right transparent display 206 are illuminated with an image that is properly oriented to an observer attempting to view the screen from the left (R:←TD.ONL). An observer to the left of the screen as depicted 400 will observe an image from the right transparent display 206 as well as any ambient light transmitted through left transparent display 202, transparent active shutter 204, and right transparent display 202. An observer to the right of the screen as depicted 402 will observe an image from the right transparent display 206 as well as any ambient light transmitted through left transparent display 202, transparent active shutter 204, and right transparent display 202. The image observed by observer 402 will be mirror image (or flipped horizontally) from what would be considered the correct orientation for the image. The image observed by observer 400 will be in a correct orientation for the image (i.e., not mirror image or flipped horizontally). This DSD element state may be referred to or correspond to discussion elsewhere herein described as augmented reality (left).

With respect to FIG. 4N, a simplified side view illustration of a display-shutter-display element used by some forms of the invention is provided. Specifically, the illustration shows a state where the elements of the left transparent display 202 are off (L:TD.OFF), the active shutter 204 is opaque (AS.O), and the elements of the right transparent display 206 are illuminated with an image that is properly oriented to an observer attempting to view the screen from the left (R:←TD.ONL). An observer to the left of the screen as depicted 400 will observe opaque active shutter 204 through the right transparent display 202. An observer to the right of the screen as depicted 402 will observe an image from the right transparent display 206 on top of opaque active shutter 204. The image observed by observer 402 will be mirror image (or flipped horizontally) from what would be considered the correct orientation for the image.

An Augmented Reality State (Right).

With respect to FIG. 4O, a simplified side view illustration of a display-shutter-display element used by some forms of the invention is provided. Specifically, the illustration shows a state where the elements of the left transparent display 202 are off (L:TD.OFF), the active shutter 204 is transparent (AS.T), and the elements of the right transparent display 206 are illuminated with an image that is properly oriented to an observer attempting to view the screen from the right (R:TD.ONR→). An observer to the left of the screen as depicted 400 will observe an image from the right transparent display 206 as well as any ambient light transmitted through left transparent display 202, transparent active shutter 204, and right transparent display 202. An observer to the right of the screen as depicted 402 will observe an image from the right transparent display 206 as well as any ambient light transmitted through left transparent display 202, transparent active shutter 204, and right transparent display 202. The image observed by observer 400 will be mirror image (or flipped horizontally) from what would be considered the correct orientation for the image. The image observed by observer 402 will be in a correct orientation for the image (i.e., not mirror image or flipped horizontally). This DSD element state may be referred to or correspond to discussion elsewhere herein described as augmented reality (right).

A Normal State (Right).

With respect to FIG. 4P, a simplified side view illustration of a display-shutter-display element used by some forms of the invention is provided. Specifically, the illustration shows a state where the elements of the left transparent display 202 are off (L:TD.OFF), the active shutter 204 is opaque (AS.O), and the elements of the right transparent display 206 are illuminated with an image that is properly oriented to an observer attempting to view the screen from the right (R:TD.ONR→). An observer to the left of the screen as depicted 400 will observe opaque active shutter 204 through the right transparent display 202. An observer to the right of the screen as depicted 402 will observe an image from the right transparent display 206 on top of opaque active shutter 204. The image observed by observer 402 will be in a correct orientation for the image (i.e., not mirror image or flipped horizontally). This DSD element state may be referred to or correspond to discussion elsewhere herein described as normal (right).

A Transparent State.

With respect to FIG. 4Q, a simplified side view illustration of a display-shutter-display element used by some forms of the invention is provided. Specifically, the illustration shows a state where the elements of the left transparent display 202 are off (L:TD.OFF), the active shutter 204 is transparent (AS.T), and the elements of the right transparent display 206 are off (R:TD.OFF). An observer to the left of the screen as depicted 400 will observe ambient light transmitted through left transparent display 202, transparent active shutter 204, and right transparent display 206. An observer to the right of the screen as depicted 402 will observe ambient light transmitted through left transparent display 202, transparent active shutter 204, and right transparent display 206. This DSD element state may be referred to or correspond to discussion elsewhere herein described as transparent or translucent or "translucent".

An Opaque State.

With respect to FIG. 4R, a simplified side view illustration of a display-shutter-display element used by some forms of the invention is provided. Specifically, the illustration shows a state where the elements of the left transparent display 202 are off (L:TD.OFF), the active shutter 204 is opaque (AS.O), and the elements of the right transparent display 206 are off (R:TD.OFF). An observer to the left of the screen as depicted 400 will observe opaque active shutter 204 through the left transparent display 202. An observer to the right of the screen as depicted 402 will observe opaque active shutter 204 through the right transparent display 206. This DSD element state may be referred to or correspond to discussion elsewhere herein described as opaque.

IV. Exemplary Element Display Modes.

The various exemplary display elements states illustrated in FIGS. 3A-3L and 4A-4R for each of the respective exemplary display element types can be combined to create exemplary display modes, discussed below.

IV.A SDS Element Display Modes.

Any of the element display modes discussed herein may be used or modified for use with any form of the invention described herein. For purposes of illustration and without limitation, any display mode may be used or modified for use with any of the displays described above, any display element state described above, any display mode described below or otherwise, any of the device form factors described below or otherwise, any of the applications described below or otherwise. Depending on the orientation of the device and position of the user, the operational modes of the device can be modified to operate as a use would expect without the user having to flip over or re-orient the device in physical space. Reference to (Left) and (Right) of the various modes throughout is only to simplify the illustrations and explanations and simply refers to the (Left) or (Right) of the simplified illustration profile provided in the corresponding figures.

The SDS element states discussed above can be combined into a control loop to create different SDS element display modes.

A Normal Mode.

This mode is used in instances where there is a user of the device on one side of the screen as one may normally use a display with an image on one side and no image on the other. One active shutter (AS) is placed in a transparent state (AS.T), and the other AS is placed in an opaque state (AS.O). The transparent display (TD) is caused to display image using pixel or subpixels such that the image is oriented to be viewed correctly through the transparent active shutter (AS.T). As described elsewhere herein, forms of the invention can determine the orientation of the device and the relative location of the user.

A Normal Mode (Left).

With reference to FIG. 5A (and FIG. 3G), an exemplary simplified flow diagram of a display control loop used with some forms of the invention incorporating a shutter-display-shutter element is shown. Specifically, the illustration shows a loop where the element is configured to operate in normal mode for an observer to the left (as depicted) at act 510. Illustrated another way, FIG. 7A depicts an exemplary simplified vertical time series illustration of a display control loop corresponding to FIG. 5A. Specifically, at step 710 observer 700 can observe the display element in normal state. The control loop then refreshes the display element to display the next image for observer 700.

A Normal Mode (Right).

With reference to FIG. 5B (and FIG. 3C), an exemplary simplified flow diagram of a display control loop used with some forms of the invention incorporating a shutter-display-shutter element is shown. Specifically, the illustration shows a loop where the element is configured to operate in normal mode for an observer to the right (as depicted) at act 512. Illustrated another way, FIG. 7B depicts an exemplary simplified vertical time series illustration of a display control loop corresponding to FIG. 5B. Specifically, at act 710 observer 702 can observer the display element in normal state. The control loop then refreshes the display element to display the next image for observer 702.

A Presentation Mode or a Sharing Mode.

Presentation mode and sharing mode may be used when a user of a device (or an application on a device) wishes to display useful information on both sides of the display screen. Generally, in these modes, one AS is put in a transparent state (AS.T) while the other active shutter is put in an opaque state (AS.O). The, TD displays an image that is in an orientation to be correctly viewed (i.e., not mirrored or flipped) through the transparent active shutter AS.T at any given time. The AS.T and AS.O will change to AS.O and AS.T with frequency F. In addition, the TD will change the orientation (or the content and orientation) of the image with frequency F. This will give the appearance of a different image being shown on each side of the display element.

A Presentation Mode.

For purposes of illustration and without limitation, it may be determined that an operator of the device is located on one side of the device and a guest viewer is on the other side of the device. As viewed from one side (the side on which the operator of the device is determined to be located), the display may show an operator interface, and on the other side of the display an audience interface may be shown. For example, consider a PowerPoint presentation on the device. One the operator side a PowerPoint presenter controls interface will be shown, and the audience side a full screen presentation view of only the final slides may be shown. As another example, consider a picture being taken. One side may have camera controls and a preview, while the other side (shown to the subject of the picture) may have a full screen preview of the photo to be taken or after being taken.

A Sharing Mode.

For purposes of illustration and without limitation, sharing mode may be like presentation mode, but both sides of the display may show the same image but corrected for the orientation of the viewer. For example, consider collaborative coding or working on a document with another person at a desk. A dual-sided monitor on a laptop or in the middle of the desk is put into sharing mode. Colleagues on either side of the display can see a correct display (i.e., not mirror image) of the code or document so both may study the details of the work project easily while one or both people are editing. As another example, parental controls on a device may dictate that a child's device must always operate in sharing mode so that a parent can monitor the content being consumed by the child from across the room. To conserve the child's device battery, sharing mode may only be activated when either the parent or child device detects the presence of the other device in the room (e.g., using BLE, Wi-Fi, RFID, etc.)

As described below and elsewhere herein, the opacity of sharing mode may appear opaque to both users. There may be an opacity adjustment. Variations of sharing mode with opacity may also be referred herein simply for purposes of illustration as an unobstructed mode or the like. The illustrated and described modes should be taken as illustrative of the invention and not limiting as other modes and variations are possible by varying the specific timing and sequence of element states shown herein.

A Simplified Presentation or a Simplified Sharing Mode Control Loop.

With reference to FIG. 5C (and FIGS. 3C and 3G), an exemplary simplified flow diagram of a display control loop used with some forms of the invention incorporating a shutter-display-shutter element is shown. The element is configured to operate in presentation mode or sharing mode." Specifically, the illustration shows a control loop. At act 512, the element is configured to operate in normal mode for an observer to the right. (See also FIG. 3C). At act 514, the element is configured to operate in normal mode for an observer to the left. (See also FIG. 3G). After act 514, the loop repeats for the next set of images. Of course, acts 512 and 514 could occur in opposite order for each loop as well. Illustrated another way, FIG. 7C depicts an exemplary simplified vertical time series illustration corresponding to FIG. 5C. Specifically, the illustration shows a loop. At act 714, the element is configured to operate in a normal state for an observer to the right (as depicted) 702. At act 716, the element is configured to operate in a normal state for an observer to the left (as depicted) 700. After act 716, the loop repeats for the next set of images.

Stated another way, with reference to FIG. 7C, looking at a profile of the stack of elements: At time period t1 (act 714): the left (as depicted) active shutter is commanded to be opaque; the transparent display element is turned on and configured to display an image with an orientation that can be viewed correctly from the right; and, the right active shutter is commanded to be transparent. At time period t2 (act 716): The left active shutter is commanded to be transparent; the transparent display is configured to display an image with an orientation that can be viewed correctly from the left; and, the right active shutter is commanded to be transparent.

There may be intermediate steps between t1 and t2 such as making the right AS.O prior to making the left AS.T so that the TD may have time to update the image while both AS are opaque. Time periods t1, t2, to in any of the figures or descriptions need not be the same duration and may be varied to achieve different visual effects.

One Possible Detailed Presentation Mode or Sharing Mode.

As a non-limiting example for further illustration of possible intermediate states between the major states depicted above (e.g., in forms where the TD switching rate is not as fast as the AS switching rate, etc.):

With reference to FIG. 5D (and FIGS. 3C, 3F, 3D, and 3G), another exemplary simplified flow diagram of a display control loop used with some forms of the invention incorporating a shutter-display-shutter element is shown. The element is configured to operate in presentation mode or sharing mode. Specifically, the illustration shows a control loop. At act 518, the display element is configured to operate in a normal state for an observer to the right (as depicted). (See also FIG. 3C). At act 520, the display element is configured to obscure the view of the TD during switching by making the right AS opaque. (See also FIG. 3F). At act 522, the display element is configured to change the orientation or content of the image shown on the TD. (See also FIG. 3D). At act 524, the display element is configured to operate in a normal state for an observer to the left (as depicted). (See also FIG. 3G). At act 526, the display element is configured to obscure the view of the TD during switching by making the left AS opaque. (See also FIG. 3D). At act 528, the display is configured to change the orientation or content of the image shown on the TD. (See also FIG. 3F). After act 528, the loop repeats for the next set of images.

Illustrated another way, FIG. 7D depicts another exemplary simplified vertical time series illustration corresponding to FIG. 5D. Specifically, the illustration shows a loop. At act 718, the display element is configured to operate in a normal state for an observer to the right (as depicted) 702. (See also FIG. 3C). At act 720, the display element is configured to obscure the view of the TD during switching for the observer to the right (as depicted) 702 by making the right AS opaque. (See also FIG. 3F). At act 722, the display element is configured to change the orientation or content of the image shown on the TD. (See also FIG. 3D). At act 724, the display element is configured to operate in a normal state for an observer to the left (as depicted) 700. (See also FIG. 3G). At act 726, the display element is configured to obscure the view of the TD for the observer to the left (as depicted) 700 during switching by making the left AS opaque. (See also FIG. 3D). At act 728, the display is configured to change the orientation or content of the image shown on the TD. (See also FIG. 3F). After act 728, the loop repeats for the next set of images.

For any of the modes described herein, to increase the effective brightness or transparency of the screen, the first and last or any of the acts may be repeated sequentially multiple times or of varying durations. For example, or the first and last or any of the acts may persist longer than the intermediate acts displayed. In addition, transparent, opaque, normal, or any additional states may be inserted in any of control loops. Furthermore, the timing of each block of the control loop may be varied and need not be the same as the others (e.g., t1, t2, to may all be different durations). These forms of diagrams are used throughout and should be considered in this light with respect to all display modes discussed herein.

Again, as described above (and as applicable further below even if not mentioned), there may be intermediate acts or states between those major states depicted in the diagrams presented herein. For example, yet another version of this display mode may allow for additional time for the image to switch orientation while both shutters are opaque.

An Augmented Reality Mode.

This mode is use in instances where a user or an application desires to overlay digital information on a view of a real-life scene framed by the device. For example, if holding the phone up to eye level and looking at a hiking path up a mountain in the desert, the device may configure the display to be transparent but for an illuminated line that appears on the screen such that the line appears to annotate the actual real-life path through the desert and up a mountain trail. As described elsewhere herein, the device can determine the type of shape to draw to achieve this effect using the inventive display structure by geolocation, orientation, and user face detection and eye tracking among other techniques. Generally, regarding the display structure, both active shutters are configured to be transparent (AS.T×2). The transparent display element is configured to display the annotation or image correctly to be viewed through device by user and overlaid on object in real world. As just mentioned, also described herein are methods of determining image placement with reference to sensors in the devices that measure all types of ambient information.

An Augmented Reality Mode (Left).

With reference to FIG. 5E (and FIG. 3J), an exemplary simplified flow diagram of a display control loop used with some forms of the invention incorporating a shutter-display-shutter element is shown. The element is configured to operate in augmented reality state for an observer to the left (as depicted). Specifically, the illustration shows a loop. At act 530, the display element is configured to operate in augmented reality state for an observer to the right. (See also FIG. 3J). After act 530, the loop repeats for the next image to be displayed to the user. Illustrated another way, FIG. 7E depicts an exemplary simplified vertical time series illustration of a display control loop corresponding to FIG. 5E. The element is configured to operate in augmented reality mode for an observer to the left (as depicted). At act 730, the display element is configured to operate in augmented reality state for an observer to the left 700. (See also FIG. 3J). For each frame, the observer 702 can see the light illuminated from the TD and the ambient light that passes from the environment through the AS-TD-AS structure. After act 730, the loop repeats for the next image to be displayed to the user.

An Augmented Reality Mode (Right).

With reference to FIG. 5F (and FIG. 3L), an exemplary simplified flow diagram of a display control loop used with some forms of the invention incorporating a shutter-display-shutter element is shown. The element is configured to operate in augmented reality mode for an observer to the right (as depicted). Specifically, the illustration shows a loop. At act 532, the display element is configured to operate in augmented reality state for an observer to the right. (See also FIG. 3L). After act 532, the loop repeats for the next image to be displayed to the user. Illustrated another way, FIG. 7F depicts an exemplary simplified vertical time series illustration of a display control loop corresponding to FIG. 5F. The element is configured to operate in augmented reality mode for an observer to the right (as depicted). At act 732, the display element is configured to operate in augmented reality state for an observer to the right (as depicted) 702. (See also FIG. 3L). For each frame, the observer 702 can see the light illuminated from the TD and the ambient light that passes from the environment through the AS-TD-AS structure. After act 732, the loop repeats for the next image or annotation to be displayed to the user 702.

An Unobstructed Mode (May Also be Called a Translucent Normal Mode or a Private AR Mode or the Like).

Generally, this mode allows for an operator of a device to maintain the privacy of the content on the screen (like normal mode), but also have the screen appear translucent to the operator and the person on the other side of the screen so it does not block the operator from people on other side of screen. This also enables augmented reality applications for the operator without allowing third parties to see the annotations displayed on the screen from the opposite side. Accordingly, Applicant again reminds the reader that these modes are exemplary and normal mode may also be thought of as "unobstructed mode with some translucent effects added. The following method may be used, for example, with the operator to the right of the screen as depicted.

An Unobstructed Mode (Right).

With reference to FIG. 5G (and FIGS. 3C and 3K), an exemplary simplified flow diagram of a display control loop used with some forms of the invention incorporating a shutter-display-shutter element is shown. The element is configured to operate in an unobstructed mode for an observer to the right (as depicted). Specifically, the illustration shows a loop. At act 534, the display element is configured to operate in a normal state for an observer to the right. (See also FIG. 3C). At act 536, the display element is configured to operate in a transparent state so that the screen appears transparent to users from either side. (See also FIG. 3K). After act 536, the loop repeats for the next set of images or augmented reality annotations.

Illustrated another way, FIG. 7G depicts an exemplary simplified vertical time series illustration of a display control loop corresponding to FIG. 5G. The display is configured to operate in an unobstructed mode for an observer to the right (as depicted). Specifically, the illustration shows a loop. At act 734, the display element is configured to operate in normal state for an observer to the right (as depicted) 702 at time t1. (See also FIG. 3C). At act 736, the display element is configured to operate in a transparent state so that the screen appears transparent to users from either side. Specifically, the observer to the right (as depicted) 702 at time t2 can see the ambient light that passes from the environment 708 through the AS-TD-AS structure. (See also FIG. 3K). After act 736, the loop repeats for the next set of images or augmented reality annotations.

One Possible Detailed Version of an Unobstructed Mode (Right).

With reference to FIG. 5I (and FIGS. 3C, 3B, and 3K), another exemplary simplified flow diagram of a display control loop used with some forms of the invention incorporating a shutter-display-shutter element is shown. The element is configured to operate in an unobstructed mode for an observer to the right (as depicted). Specifically, the illustration shows a loop. At act 542, the display element is configured to operate in a normal state for an observer to the right. (See also FIG. 3C). At act 544, the display element is configured turn the transparent display TD off (TD.OFF) while keeping the left active shutter opaque (L:AS.O) until the image is no longer displayed on the TD to preserve privacy. (See also FIG. 3B). At act 546, the display element is configured to operate in a transparent state so that the screen appears transparent to users from either side and that ambient light from objects on the other side of the screen can pass through the AS-TD-AS structure. (See also FIG. 3K). At act 548, the display element is configured turn the left active shutter opaque (L:AS.O) prior to displaying the next image in the loop on the TD to preserve privacy. (See also FIG. 3B). After act 548, the loop repeats for the next set of images or augmented reality annotations.

Illustrated another way, FIG. 7I depicts another exemplary simplified vertical time series illustration of a display control loop corresponding to FIG. 5I. The element is configured to operate in an unobstructed mode for an observer to the right (as depicted). Specifically, the illustration shows a loop. At act 742, the display element is configured to operate in a normal state for an observer to the right (as depicted) 702 during time t1. (See also FIG. 3C). At act 744, the display element is configured turn the transparent display TD off (TD.OFF) while keeping the left active shutter opaque (L:AS.O) until the image is no longer displayed on the TD to preserve privacy. (See also FIG. 3B). At act 746, the display element is configured to operate in a transparent state so that the screen appears transparent to users from either side and that ambient light from objects on the other side of the screen can pass through the AS-TD-AS structure and be observed by the observer to the right (as depicted) 702 during time t3. (See also FIG. 3K). At act 748, the display element is configured turn the left active shutter opaque (L:AS.O) prior to displaying the next image in the loop on the TD to preserve privacy. (See also FIG. 3B). After act 748, the loop repeats for the next set of images or augmented reality annotations.

An Unobstructed Mode (Left).

With reference to FIG. 5H (and FIGS. 3G and 3K), exemplary simplified flow diagram of a display control loop used with some forms of the invention incorporating a shutter-display-shutter element is shown. The element is configured to operate in an unobstructed mode for an observer to the left (as depicted). Specifically, the illustration shows a loop. At act 538, the display element is configured to operate in a normal state for an observer to the left. (See also FIG. 3G). At act 540, the display element is configured to operate in a transparent state so that the screen appears transparent to users from either side. (See also FIG. 3K). After act 540, the loop repeats for the next set of images or augmented reality annotations.

Illustrated another way, FIG. 7H depicts an exemplary simplified vertical time series illustration of a display control loop used with some forms of the invention incorporating a shutter-display-shutter element when the element is configured to operate in an unobstructed mode for an observer to the left (as depicted). Specifically, the illustration shows a loop. At act 738, the display element is configured to operate in a normal state for an observer to the left (as depicted) 700 at time t1. (See also FIG. 3G). At act 740, the display element is configured to operate in a transparent state so that the screen appears transparent to users from either side. Specifically, the observer to the right (as depicted) 700 at time t2 can see the ambient light that passes from the environment 708 through the AS-TD-AS structure. (See also FIG. 3K). After act 740, the loop repeats for the next set of images or augmented reality annotations.

One Possible Detailed Version of an Unobstructed Mode (Left).

With reference to FIG. 5J (and FIGS. 3G, 3H, and 3K), another exemplary simplified flow diagram of a display control loop used with some forms of the invention incorporating a shutter-display-shutter element is shown. The element is configured to operate in an unobstructed mode for an observer to the left (as depicted). Specifically, the illustration shows a loop. At act 550, the display element is configured to operate in a normal state for an observer to the left. (See also FIG. 3G). At act 552, the display element is configured turn the transparent display TD off (TD.OFF) while keeping the right active shutter opaque (R:AS.O) until the image is no longer displayed on the TD to preserve privacy. (See also FIG. 3H). At act 554, the display element is configured to operate in a transparent state so that the screen appears transparent to users from either side and that ambient light from objects on the other side of the screen can pass through the AS-TD-AS structure. (See also FIG. 3K). At act 556, the display element is configured turn the right active shutter opaque (R:AS.O) prior to displaying the next image in the loop on the TD to preserve privacy. (See also FIG. 3H). After act 556, the loop repeats for the next set of images or augmented reality annotations.

Illustrated another way, FIG. 7J depicts another exemplary simplified vertical time series illustration of a display control loop corresponding to FIG. 5J. The element is configured to operate in an unobstructed mode for an observer to the left (as depicted). Specifically, the illustration shows a loop. At act 750, the display element is configured to operate in a normal state for an observer to the left (as depicted) 700 during time t1. (See also FIG. 3G). At act 752, the display element is configured turn the transparent display TD off (TD.OFF) while keeping the right active shutter opaque (R:AS.O) until the image is no longer displayed on the TD to preserve privacy. (See also FIG. 3H). At act 754, the display element is configured to operate in a transparent state so that the screen appears transparent to users from either side and that ambient light from objects on the other side of the screen 708 can pass through the AS-TD-AS structure and be observed by the observer to the left (as depicted) 700 during time t3. (See also FIG. 3K). At act 756, the display element is configured turn the right active shutter opaque (R:AS.O) prior to displaying the next image in the loop on the TD to preserve privacy. (See also FIG. 3H). After act 756, the loop repeats for the next set of images or augmented reality annotations.

An Unobstructed Mode (Translucent Presentation Mode, Translucent Sharing Mode, Dual AR Mode or the Like).

Generally, this mode allows content to be viewed from both sides of the screen (like presentation or sharing mode), but also have the screen appear translucent to the operator and the person on the other side of the screen so it does not block the operator from people on other side of screen. For example, assuming operator to the right and observer to the left (or vice versa), FIGS. 5K and 7K are discussed. With reference to FIG. 5K (and FIGS. 3C, 3K, and 3G), an exemplary simplified flow diagram of a display control loop used with some forms of the invention incorporating a shutter-display-shutter element is shown. The element is configured to operate in an unobstructed mode. Specifically, the illustration shows a control loop. At act 558, the display element is configured to operate in a normal state for an observer to the right. (See also FIG. 3C). At act 560, the display element is configured to operate in a transparent state so that the screen appears transparent to users from either side. (See also FIG. 3K). At act 562, the display element is configured to operate in a normal state for an observer to the left. (See also FIG. 3G). At act 564, the display element is configured to operate in a transparent state so that the screen appears transparent to users from either side. (See also FIG. 3K). After act 564, the loop repeats for the next set of images or augmented reality annotations.

Illustrated another way, FIG. 7K depicts an exemplary simplified vertical time series illustration of a display control loop corresponding to FIG. 5K. The element is configured to operate in an unobstructed mode. Specifically, the illustration shows a control loop. At act 758, the display element is configured to operate in a normal state for an observer to the right (as depicted) 702 during time t1. (See also FIG. 3C). At act 760, the display element is configured to operate in a transparent state so that the screen appears transparent to users from either side. (See also FIG. 3K). Observers 700 and 702 are both able to see through the transparent display screen during time t2. At act 762, the display element is configured to operate in a normal state for an observer to the left (as depicted) 702 at time t3. (See also FIG. 3G). At act 764, the display element is configured to operate in a transparent state so that the screen appears transparent to users from either side. (See also FIG. 3K). Observers 700 and 702 are both able to see through the transparent display screen during time t4. After act 764, the loop repeats for the next set of images or augmented reality annotations.

Other Possibilities.

There are numerous other possible modes that can be created that will work that work with variations of the display elements discussed above. For example, for a shutter-display (SD) display or a display-shutter (DS) display, the following modes may also be used with forms of the invention corresponding to FIG. 1D (if you disregard the left active shutter in corresponding FIG. 3, and the left active shutter depicted in the respective FIGS. 7A, E, H, and J): FIGS. 5A and 7A (Normal Mode (Left)), FIGS. 5E and 7E (Augmented Reality Mode (Left)), FIGS. 5F and 7F (Augmented Reality Mode (Right)), FIGS. 5H and 7H (Unobstructed Mode 1 (Left)), and FIGS. 5J and 7J (One Possible Detailed Form of Unobstructed Mode 1 (Left)). Of course, as previously noted, the left and right designation is made for simplicity in disclosing the invention with respect to the example illustrations and the orientation may be reversed or swapped in practice (or if viewed from the opposite side).

IV.B DSD Element Display Modes.

The DSD element states discussed above can be combined into a control loop to create different DSD element display modes.

A Normal Mode.

This mode is used in instances where there is a user of the device on one side of the screen as one may normally use a display with an image on one side an no image on the other. Generally, in this mode with a display-shutter-display DSD element, one TD is off (TD.OFF) (or on but not displaying an image), the AS is opaque (AS.O), and the other TD displays image correctly to be viewed from appropriate side.

A Normal Mode (Left).

With reference to FIG. 6A (and FIG. 4B), an exemplary simplified flow diagram of a display control loop used with some forms of the invention incorporating a display-shutter-display element is shown. The element is configured to operate in normal mode for an observer to the left (as depicted). Specifically, the illustration shows a loop where the element is configured to operate in normal mode for an observer to the left (as depicted) at act 610. Illustrated another way, FIG. 8A depicts an exemplary simplified vertical time series illustration of a display control loop used with some forms of the invention corresponding to FIG. 6A. (See also FIG. 4B). Specifically, at step 810, observer 800 can observe the display element in a normal state. The control loop then refreshes the display element to display the next image for observer 800.

A Normal Mode (Right).

With reference to FIG. 6B (and FIG. 4P), an exemplary simplified flow diagram of a display control loop used with some forms of the invention incorporating a display-shutter-display element is shown. The element is configured to operate in normal mode for an observer to the right (as depicted). Specifically, the illustration shows a loop where the element is configured to operate in normal mode for an observer to the right (as depicted) at act 612. Illustrated another way, FIG. 8B depicts an exemplary simplified vertical time series illustration of a display control loop used with some forms of the invention corresponding to FIG. 6B. (See also FIG. 4P). Specifically, at step 812, observer 802 can observe the display element in a normal state. The control loop then refreshes the display element to display the next image for observer 802.

A Presentation Mode or a Sharing Mode.

As previously discussed, presentation mode and sharing mode may be used when a user of a device (or an application on a device) wishes to display useful information on both sides of the display screen. Generally, in these modes, the AS is put in an opaque state (AS.O) while the left and right transparent displays are configured to show images that are in an appropriate orientation to be viewed (i.e., not mirrored or flipped) by a user on the same side of the device. The opaque active shutter prevents the image from the opposite transparent display from being viewed by a user on the other side of the device.

With reference to FIG. 6C (and FIG. 4H), an exemplary simplified flow diagram of a display control loop used with some forms of the invention incorporating a display-shutter-display element is shown. The element is configured to operate in presentation mode or sharing mode. Specifically, the illustration shows a control loop. At act 614, the element is configured to operate in a presentation state or a sharing state (See also FIG. 4H). After act 614, the loop repeats for the next set of images. Illustrated another way, FIG. 8C depicts an exemplary simplified vertical time series illustration of a display control loop used with some forms of the invention incorporating a display-shutter-display element when the element is configured to operate in presentation mode or sharing mode. Specifically, the illustration shows a control loop. At act 814, the element is configured to operate in a presentation state or a sharing state. An observer to the left (as depicted) 800 can see the image displayed on the left (as depicted) transparent display. Opaque active shutter prevents observer 802 from seeing the image on the right (as depicted) transparent display. An observer to the right (as depicted) 802 can see the image displayed on the right transparent display. Opaque active shutter prevents observer 802 from seeing the image on the left (as depicted) transparent display. After act 814, the loop repeats for the next set of images.

An Augmented Reality Mode.

As previously discussed, augmented reality modes are used when a user of a device (or an application on a device) wishes to display useful information (or annotations) that appear to be placed or overlaid on the real world.

An Augmented Reality Mode (Right).

With reference to FIG. 6D (and FIG. 4C), an exemplary simplified flow diagram of a display control loop used with some forms of the invention incorporating a display-shutter-display element is shown. The element is configured to operate in augmented reality mode for an observer to the right as depicted. Specifically, the illustration shows a control loop. At act 616, the element is configured to operate in an augmented reality state. (See also FIG. 4C). After act 616, the loop repeats for the next set of images or annotations. Illustrated another way, FIG. 8D depicts another exemplary simplified vertical time series illustration corresponding to FIG. 6D. Specifically, the illustration shows a control loop. At act 816, the element is configured to operate in an augmented reality state for an observer to the right (as depicted) 802. (See also FIG. 4C). For each frame, the observer 802 can see the light illuminated from the left TD (as depicted) and the ambient light that passes through the TD-AS-TD structure from objects on the other side of the display 808. After act 816, the loop repeats for the next image or annotation to be displayed to the user 802.

An Augmented Reality Mode (Right).

With reference to FIG. 6E (and FIG. 4O), another exemplary simplified flow diagram of a display control loop used with some forms of the invention incorporating a display-shutter-display element is shown. The element is configured to operate in augmented reality mode for an observer to the right as depicted. Specifically, the illustration shows a control loop. At act 618, the element is configured to operate in an augmented reality state. (See also FIG. 4O). After act 618, the loop repeats for the next set of images or annotations. Illustrated another way, FIG. 8E depicts another exemplary simplified vertical time series illustration corresponding to FIG. 6E. Specifically, the illustration shows a control loop. At act 818, the element is configured to operate in an augmented reality state for an observer to the right (as depicted) 802. (See also FIG. 4O). For each frame, the observer 802 can see the light illuminated from the right TD (as depicted) and the ambient light that passes through the TD-AS-TD structure from objects on the other side of the display 808. After act 818, the loop repeats for the next image or annotation to be displayed to the user 802.

A 2.5D Augmented Reality Mode (Right).

In addition, a DSD element may display two layers of emissive light information to a user giving a two-and-a-half dimensional effect. For example, in a camera application the TD layer furthest from a user may display annotations on a picture such as virtual stickers, geo-referenced stickers, augmented reality filters that are overlaid on the users in the photograph to be taken, or the like. The layer closest to the operator may display camera control annotations over the real world (optionally augmented) image. These layers can be reversed in order of closeness to the user. Alternatively, one layer may be used in another mode and the annotations mixed to give a less dimensional but similar effect. With reference to FIG. 6F (and FIG. 4K), an exemplary simplified flow diagram of a display control loop used with some forms of the invention incorporating a display-shutter-display element is shown. The element is configured to operate in a two-and-a-half dimensional augmented reality mode for an observer to the right as depicted. Specifically, the illustration shows a control loop. At act 620, the element is configured to operate in a two and a half dimensional augmented reality state. (See also FIG. 4K). After act 620, the loop repeats for the next set of images or annotations. Illustrated another way, FIG. 8F depicts another exemplary simplified vertical time series illustration corresponding to FIG. 6F. Specifically, the illustration shows a control loop. At act 820, the element is configured to operate in "a two and a half dimensional augmented reality state" for an observer to the right (as depicted) 802. (See also FIG. 4K). For each frame, the observer 802 can see the light illuminated from the right TD (as depicted), the light illuminated from the left TD (as depicted), and the ambient light that passes through the TD-AS-TD structure from objects on the other side of the display 808. After act 820, the loop repeats for the next image or annotation to be displayed to the user 802.

An Augmented Reality Mode (Left).

For example, with reference to FIG. 6G (and FIG. 4M), an exemplary simplified flow diagram of a display control loop used with some forms of the invention incorporating a display-shutter-display element is shown. The element is configured to operate in augmented reality mode for an observer to the left as depicted. Specifically, the illustration shows a control loop. At act 622, the element is configured to operate in an augmented reality state. (See also FIG. 4M). After act 622, the loop repeats for the next set of images or annotations. Illustrated another way, FIG. 8G depicts another exemplary simplified vertical time series illustration corresponding to FIG. 6G. Specifically, the illustration shows a control loop. At act 822, the element is configured to operate in an augmented reality state for an observer to the left (as depicted) 800. (See also FIG. 4M). For each frame, the observer 800 can see the light illuminated from the left TD (as depicted) and the ambient light that passes through the TD-AS-TD structure from objects on the other side of the display 808. After act 822, the loop repeats for the next image or annotation to be displayed to the user 800.

An Augmented Reality Mode (Left).

With reference to FIG. 6H (and FIG. 4A), another exemplary simplified flow diagram of a display control loop used with some forms of the invention incorporating a display-shutter-display element is shown. The element is configured to operate in an augmented reality state for an observer to the left as depicted. Specifically, the illustration shows a control loop. At act 624, the element is configured to operate in an augmented reality state. (See also FIG. 4A). After act 624, the loop repeats for the next set of images or annotations. Illustrated another way, FIG. 8H depicts another exemplary simplified vertical time series illustration corresponding to FIG. 6H. Specifically, the illustration shows a control loop. At act 824, the element is configured to operate in an augmented reality state. (See also FIG. 4A). After act 824, the loop repeats for the next set of images or annotations. At act 824, the element is configured to operate in an augmented reality state for an observer to the left (as depicted) 800. (See also FIG. 4M). For each frame, the observer 800 can see the light illuminated from the right TD (as depicted) and the ambient light that passes through the TD-AS-TD structure from objects on the other side of the display 808. After act 824, the loop repeats for the next image or annotation to be displayed to the user 800.

A 2.5D Augmented Reality Mode (Left).

With reference to FIG. 6I (FIG. 4E), an exemplary simplified flow diagram of a display control loop used with some forms of the invention incorporating a display-shutterdisplay element is shown. The element is configured to operate in two-and-a-half dimensional augmented reality for an observer to the left as depicted. Specifically, the illustration shows a control loop. At act 626, the element is configured to operate in a two and a half dimensional augmented reality state. (See also FIG. 4E). After act 626, the loop repeats for the next set of images or annotations.

Illustrated another way, FIG. 8I depicts another exemplary simplified vertical time series illustration corresponding to FIG. 6I. Specifically, the illustration shows a control loop. At act 826, the element is configured to operate in a two-and-a-half dimensional augmented reality state for an observer to the left (as depicted) 800. (See also FIG. 4E). For each frame, the observer 800 can see the light illuminated from the right TD (as depicted), the light illuminated from the left TD (as depicted), and the ambient light that passes through the TD-AS-TD structure from objects on the other side of the display 808. After act 826, the loop repeats for the next image or annotation to be displayed to the user 802.

An Unobstructed Mode (Translucent Normal Mode or Private AR)—

Generally, this mode allows for an operator of a device to maintain the privacy of the content on the screen (like normal mode), but also have the screen appear translucent to the operator and the person on the other side of the screen so it does not block the operator from people on other side of screen.

An Unobstructed Mode (Right).

The following method may be used, for example, with the operator to the right of the screen as depicted. With reference to FIG. 6J (and FIGS. 4P and 4Q), an exemplary simplified flow diagram of a display control loop used with some forms of the invention incorporating a display-shutter-display element is shown. The element is configured to operate in an unobstructed mode for an observer to the right as depicted. Specifically, the illustration shows a control loop. At act 628, the element is configured to operate in a normal state for a user to the right of the device (as depicted). (See also FIG. 4P). At act 628, the element is configured to operate in a transparent state. (See also FIG. 4Q). After act 630, the loop repeats for the next set of images or annotations.

Illustrated another way, FIG. 8J depicts another exemplary simplified vertical time series illustration corresponding to FIG. 6J. Specifically, the illustration shows a control loop. At act 828, the element is configured to operate in a normal state for a user to the right of the device (as depicted) 802 during time t1. (See also FIG. 4P). At act 828, the element is configured to operate in a transparent state so that any user on the left of the device (as depicted) 800, and any user on the right of the device (as depicted) 802 may see through the device structure during time t2. (See also FIG. 4Q). After act 630, the loop repeats for the next set of images or annotations.

Applicant reminds the reader that the apparent brightness and opacity of the display in this or any other mode may be varied by changing the time durations (such as t1, t2, etc.) to different values. For example, using the above described mode to illustrate the point, extending time period t1 for act 828 and/or reducing period t2 for act 830 will make the image appear brighter; extending period t2 for act 830 and/or reducing period t1 for act 828 will make the image appear more transparent.

An Unobstructed Mode (Left).

The following method may be used, for example, with the operator to the left of the screen as depicted. With reference to FIG. 6K (and FIGS. 4B and 4Q), an exemplary simplified flow diagram of a display control loop used with some forms of the invention incorporating a display-shutter-display element is shown. The element is configured to operate in an unobstructed mode for an observer to the left as depicted. Specifically, the illustration shows a control loop. At act 632, the element is configured to operate in a normal state for a user to the left of the device (as depicted). (See also FIG. 4B). At act 634, the element is configured to operate in a transparent state. (See also FIG. 4Q). After act 634, the loop repeats for the next set of images or annotations.

Illustrated another way, FIG. 8K depicts another exemplary simplified vertical time series illustration corresponding to FIG. 6K. Specifically, the illustration shows a control loop. At act 832, the element is configured to operate in a normal state for a user to the left of the device (as depicted) 800 during time t1. (See also FIG. 4B). At act 834, the element is configured to operate in a transparent state so that any user on the left of the device (as depicted) 800, and any user on the right of the device (as depicted) 802 may see through the device structure during time t2. (See also FIG. 4Q). After act 834, the loop repeats for the next set of images or annotations.

An Unobstructed Mode (Translucent Presentation Mode, Translucent Sharing Mode, Dual AR Mode or the Like).

Generally, this mode allows content to be viewed from both sides of the screen (like presentation or sharing mode), but also have the screen appear translucent to the operator and the person on the other side of the screen so it does not block the operator from people on other side of screen. This may be useful in conference rooms so that participants can look through devices at other conference participants while the other conference participant can still use their laptop as normal. For example, assuming operator to the right and observer to the left (or vice versa). With reference to FIG. 6L (and FIGS. 4H and 4Q), an exemplary simplified flow diagram of a display control loop used with some forms of the invention incorporating a display-shutter-display element is shown. The element is configured to operate in an unobstructed mode. Specifically, the illustration shows a control loop. At act 636, the element is configured to operate in a presentation state or a sharing state. (See also FIG. 4H). At act 638, the element is configured to operate in a transparent state. (See also FIG. 4Q). After act 638, the loop repeats for the next set of images or annotations.

Illustrated another way, FIG. 8L depicts another exemplary simplified vertical time series illustration corresponding to FIG. 6L. Specifically, the illustration shows a control loop. At act 836, the element is configured to operate in a presentation state or a sharing state so that a user on the left of the device (as depicted) 800 sees an image displayed on the left TD in a proper orientation, and the user on the right of the device (as depicted) 802 simultaneously sees an image displayed on the right TD in a proper orientation. The active shutter element is configured to be opaque as to prevent the user on one side from seeing the transparent display illumination on the other side of the device. (See also FIG. 4H). At act 838, the element is configured to operate in a transparent state so that any user on the left of the device (as depicted) 800, and any user on the right of the device (as depicted) 802 may see through the device structure during time t2. (See also FIG. 4Q). After act 838, the loop repeats for the next set of images or annotations.

Alternatively, with reference to FIG. 6M (and FIGS. 4P, 4Q, and 4B), another exemplary simplified flow diagram of a display control loop used with some forms of the invention incorporating a display-shutter-display element is shown. The element is configured to operate in an unobstructed mode. Specifically, the illustration shows a control loop. At act 640, the element is configured to operate in a normal state for a user to the right of the device (as depicted). (See also FIG. 4P). At act 642, the element is configured to operate in a transparent state. (See also FIG. 4Q). At act 644, the element is configured to operate in a normal state for a user to the left of the device (as depicted). (See also FIG. 4B). At act 646, the element is configured to operate in a transparent state. (See also FIG. 4Q). After act 646, the loop repeats for the next set of images or annotations. Illustrated another way, FIG. 8M depicts another exemplary simplified vertical time series illustration corresponding to FIG. 6M. Specifically, the illustration shows a control loop. At act 840, the element is configured to operate in a normal state for a user to the right of the device (as depicted) 802 during time t1. (See also FIG. 4P). At act 842, the element is configured to operate in a transparent state so that any user on the left of the device (as depicted) 800, and any user on the right of the device (as depicted) 802 may see through the device structure during time t2. (See also FIG. 4Q). At act 844, the element is configured to operate in a normal state for a user to the left of the device (as depicted) 800 during time t3. (See also FIG. 4B). At act 846, the element is configured to operate in a transparent state so that any user on the left of the device (as depicted) 800, and any user on the right of the device (as depicted) 802 may see through the device structure during time t4. (See also FIG. 4Q). After act 846, the loop repeats for the next set of images or annotations. At act 836, the element is configured to operate in a presentation state or a sharing state so that a user on the left of the device (as depicted) 800 sees an image displayed on the left TD in a proper orientation, and the user on the right of the device (as depicted) 802 simultaneously sees an image displayed on the right TD in a proper orientation. The active shutter element is configured to be opaque as to prevent the user on one side from seeing the transparent display illumination on the other side of the device. (See also FIG. 4H).

V. Context.

Devices incorporating dual-sided and/or transparent screen elements may also incorporate sensors and other components that help the device determine the context in which it is being used. Based on the context of use, the device may operate the screen in different modes as discussed herein. As one simple and preliminary example, depending on the orientation of the device and position of the user, the operational modes of the device can be modified to operate as a use would expect without the user having to flip over or re-orient the device in physical space. There are numerous aspects of context, some of which are discussed below.

The displays discussed above will be particularly useful in mobile devices that switch between normal or traditional operating modes and the inventive modes that support, among other things, augmented reality (also called mixed reality). To achieve this functionality, the display devices discussed above can be combined with several other components to obtain spatial context relative to:

User/Device Orientation and Configuration Detection.

To enable general orientation corrections to ensure that the correct side of the screen is operating in the correct mode and in the correct orientation at any given time, the relative orientation of the device and user is ascertained with various sensors. In addition, the configuration of the device may be used to inform the correct screen modes and other aspects of the device operation. See Section V.A.

Device/Earth Position.

To enable determination of relevant POI information or the retrieval of learned/known/remotely stored area information. Other geolocation services in applications both in augmented reality and more traditional modes. See Section V.B.

Device Motion/Area/Depth.

The device motion, the area the device is in, and depth perception of the area to enable analysis of the area in which the augmented reality annotations are being rendered onto. Other motion/health/fitness tracking services in applications both in augmented reality and more traditional modes. See Section V.C.

User/Device Head Position.

To enable modification of the AR annotations as the user is looking through the transparent display and not at a screen that is fixed in space. AR Glasses may not need this as the user is always positioned near and in same position relative to the display near the eye. A transparent AR device will benefit from the compensation provided by head tracking. Head tracking can also provide other effects in more traditional modes and input based on head motion relative to the phone (or phone motion relative to head). See Section V.D.

Far Field Occlusion.

To enable modifications of the AR annotations on objects that are far from the device, such as objects that make up the landscape and cityscape, stored 3D models of the world or other objects may be used to determine the appropriate annotation based on the device's position in the world, and the user's position relative to the device. See Section V.E.

Device Activity and Motion Detection.

The activity and motion of the device may influence the context determination of the device and influence the resulting display mode that the device implements. See Section V.E.

To achieve the spatial context, a mobile device incorporating the display elements discussed above may include numerous and various types of sensors as described elsewhere herein including above in the background of the invention.

V.A User/Device Orientation and Configuration Detection.

The device can determine its orientation and use case based on many factors. Based on this determination, the screen can be oriented in the most convenient manner for the use at hand. This may be determined based at least in part on the orientation of the user, the orientation of the device, the form factor of the device, and the current physical configuration of the device.

These methods can be used with traditional single sided devices with the appropriate sensors, or may be used with double-sided devices such as those described herein using transparent displays (or similar) display systems.

V.A.1 User/Device Orientation Detection.

With reference to FIG. 13, many different possible states are illustrated.

The orientation of the device is detected using accelerometer, gyroscope, IMU or any other similar technology. The screen may be oriented based on these sensors and the determined direction of gravity relative to the phone.

However, the problem with existing devices is that sometimes the orientation that is aligned with gravity is not the orientation that is desired by the user. For example, when a user is laying horizontally in bed with his or her head on a pillow, and desires to read in "landscape" mode on a rectangular device. In such an instance, the "gravity sensor" (e.g., accelerometer) may automatically orient the screen in "portrait" mode because although the user's eyes are oriented vertically, the device orients the phone in line with gravity.

Another method of automatically orienting the phone could use a combination of sensors including any combination of the following: accelerometers, gyroscope, magnetometer, barometer, inertial measuring unit, cameras, 360-degree cameras, infrared imaging devices, proximity sensors, or any other type of sensor or combination of sensors. A single sensor listed above (e.g. accelerometer) or combination thereof (e.g., inertial measuring unit) may detect gravity. In addition, cameras or infrared imaging devices on one side of the device may detect the axis along which the user's eyes are oriented. The device can then align the display based on the readings from the gravity sensor and the sensors that determine the axis along which the user's eyes are on.

With reference to FIG. 14, one way of recognizing a face and the orientation of a face 1400 is illustrated. Eyes 1402 and 1404, nose 1406 and mouth 1408 may be detected as objects 1422, 1424, 1426, and 1428, respectively. Based on these determinations, the device may determine the relative positions of facial features with vectors such as 1440, 1442 and 1444. The device may also determine a facial orientation vector 1460. Facial and other image recognition may also be accomplished using an appropriately trained convolutional neural network such as ImageNet, or libraries such as OpenCV.

In some forms of the invention, the face tracking may be used to increase the security of the device. A unique facial expression may be used as a passcode in conjunction with other biometric data relating to the user's face. Alternatively, a sequence of facial expressions may be used as a passcode. For example, the device takes a 2D image or a 3D image or scan of a face and obtains biometric data regarding the user for each expression to be used as part of a passcode. The device takes these measurements again each time the user tries to log into the device. The device compares the 2D image information with the pre-stored information or compares 3D mesh information with pre-stored information for each facial expression. If the facial expression, or facial expression sequence matches the correct sequence (as well as the face matching the correct user), the device may unlock or verify that the user is authorized to take an action on the device. Even if third parties are able to see the expression sequence of the user, the biometric readings associated with the user's face and sequence of face movements are unique to the user and would be exceedingly difficult for a third party to reproduce.

With reference to FIG. 15, the location of the user relative to the device and gravity may be ascertained. For example, if the user is lying in bed with the device in the air above the user the sensor may determine that the user is below the device 1500 and therefore that the primary display should be directed down toward the user as shown in 1524, 1510, or 1512. In addition, with reference to FIG. 13, it may determine that the left side of the device is angled down 1320 and the user's face is horizontal up 1302, and therefore that the screen oriented toward the ground should be in landscape up to the right of the device 1322.

Alternatively, with reference to FIG. 15, a user at location 1500 may be sitting and holding the phone in his or her lap at location 1520. In that instance, the sensor readings would determine that the user is above the phone and the primary display is the display that is on top based on gravity. With reference to FIG. 13, if the user is holding the phone with the bottom tilted down 1310 and the user's face is horizontal up 1302, the device would display in portrait up to top 1312 on the display that is on top relative to gravity.

On double sided devices, an independent determination can be made for each side of the device. For example, if a user on one side of the device is oriented differently than the user on another side of the device, the display can be oriented differently on each side of the device according to, for example FIGS. 13, 14 and 15.

Instead of or in addition to using a camera to determine the axis of the user's eyes, edge detection or screen-based detection of hand position may also be used to determine the current position of the user relative to the phone. The device may use hand position sensors or touch input sensors to determine hand position. Sensors may be part of the screen or placed around the edge of the device. The device can determine the grip the user has on the device to use as a factor (or the only factor) in determining the appropriate orientation to display on the device. If it is determined that the user is gripping the sides from the back of the device, the device may determine it should be in portrait mode when gravity is determined to be directed down between webbing of index finger and thumb with the main display out the side opposite the palm. If it is determined that the user is gripping the side on top with an index finger and on the bottom with a thumb and with a ring finger on the back and gravity down through thumb, the phone may place itself in landscape mode.

These methods for determining the appropriate display orientation and mode can be implemented in any of the various forms of the invention.

On double sided devices, there may be eye orientation sensors on each side that operate to determine which side of the device the user is on. If there are users on both sides of the device, such as when a device is in presentation, sharing, or other double-sided modes, the device may determine the operator user and the audience user by facial recognition, touch sensor usage, distance measurements or any other method. For example, the device could determine the operator user based on a facial recognition result that identifies the person as a known or logged in user. As another example, the device could determine the operator user by determining the user that is using the touch screen or other input device to interact with the device. As another example, the device may use image recognition, a proximity, or other sensor or combination of sensor and techniques to determine the distance or relative distance from the device. A user that is closer may be determined to be the operator while a user that is further from the device may be determined to be the audience user. Any combination of the above or other methods may be used to determine a primary/operator user and a secondary/audience user.

V.A.2 Device Configuration Determination.

With device form factors (discussed further below), the mode that the device goes into based on the user/device position may also be influenced by the current configuration of the device. The device may determine orientation as discussed above, and may also use a hinge position sensor, gravity direction determination, single orientation sensor to determine orientation of one of the sides of the hinged device, or double orientation sensor to determine the orientation of both sides of the device (and/or their relative orientations). For example, instead of a hinge position sensor, an IMU could be placed on either side of the hinge. For illustration and understanding orientation simplified to single axis relative to gravity; 2, 3, or 4 dimensional quantities such as quaternions may be used to express the state of each side of the device. Based on these readings, the hinged device may determine that it is in different configurations such as those described below.

Normal Configuration.

When one panel is relatively horizontal, and another is relatively vertical, hinge sensor if used is for example substantially between 90 degrees 135 degrees (or just less than 180), and the gravity vector points down and away to both panels. See, e.g., FIGS. 9A, 10A, 11A, and 12A.

Stand Configuration.

When one panel is relatively horizontal, and another is elevated, hinge sensor if used is between 0 and 90 degrees, and the gravity vector points down and away from both panels See, e.g., FIGS. 9B, 10B, 11B, and 12B.

Tent Configuration.

As one example consider a device in "tent" configuration/mode. If the hinge is up and both sides are down, then the device would be in "tent" configuration/mode. Gravity vector points down through the angle made by both panels. See, e.g., FIGS. 9C, 10C, 11C, and 12C.

Tablet (Small) Configuration.

A hinge sensor may indicate that the device is closed at about 0 degrees or open at about 360 degrees. Alternatively, two IMU's or other sensors may indicate as such; both panel orientations are same (or opposite). Alternatively, a button or other sensor may simply indicate that the two panels are touching or in a closed state. See, e.g., FIGS. 9D, 10D, 11D, 12D, 17A, and 18C.

Tablet (Large) Configuration.

A hinge sensor may indicate that the device is open at about 180 degrees. Alternatively, two IMU's or other sensors may indicate as such; both panel orientations oriented 180 degrees apart. Alternatively, a button or other sensor may simply indicate that the two panels are in a state that is 180 degrees apart. See, e.g., FIGS. 9E, 10E, 11E, 12E, and 17B.

Dual Display or Book Configuration.

A hinge sensor may indicate that the device is open at roughly 45 degrees to 130 degrees. Alternatively, two IMU's or other sensors may indicate as such. Alternatively, a button or other sensor may simply indicate that the two panels are in such a state. The device may also consider whether the gravity vector parallel to axis of hinge.

Other configurations are also possible as discussed further herein.

V.B Device/Earth Position.

The location of the device on the earth or inside buildings may be ascertained using any type position sensing hardware. Several types of position sensing hardware are discussed above in the background of the invention. With respect to augmented reality modes, the physical location of the device in the world may be used to help determine the correct annotations to draw on the screen.

V.C Device Motion/Area/Depth.

The device may use sensors to determine the physical spaces, rooms, or other areas that the device is located in. These sensors may also be used to help identify nearby people and objects. Several types of these sensors and systems are discussed above in the background of the invention. In augmented reality modes, this information can help further refine the placement of annotations on the screen of the device.

V.D User/Device Head Position.

Once we have the spatial context factors discussed above, augmented reality applications using a camera to display the information on a screen with annotations are possible. Since the screen is see through, the user's eyes may be located anywhere on one side of the device and the object on the other side of the device that is being annotated may be located anywhere on the other side of the device. The correct placement of the augmented reality annotations will therefore depend on both the relative position of the user's eyes to the device as well as the relative position of the object relative to the device. Information on determining face position relative to screen or gaze tracking and 3D projection are discussed above in the background of the invention.

The annotations can be made to look (to a user) like they are anywhere in three-dimensional space, projected correctly onto the plane of the screen to account for the position of objects behind the screen and the position of the user's face.

For example, with reference to FIG. 18A, the position of the object 1802 is determined to be Xo, Yo, Zo with sensors on device 1800. These values can be measured or determined as discussed elsewhere herein.

FIG. 18B shows the display of an annotation over an object corresponding to FIG. 18A from the perspective of the user located at position 1808. A device that uses a camera and a traditional or opaque screen to do augmented reality will display the object at position 1810 on the screen of device 1800. It may place an annotation 1804 that appears over the rendering of the object 1810 by projecting along path 1806. Regardless of the position of the user relative to the screen, the annotation 1804 will appear over the rendering object 1810. However, using the inventive transparent screen in modes discussed above like "augmented reality mode," an additional correction must be done to ensure that the annotation appears over the object. Specifically, unlike augmented reality applications that rely on a camera to take a video/picture that is displayed on a screen, in the augmented reality modes of the optionally transparent display the user will need to look through the screen, so the perspective projection will need to be modified. With reference to FIG. 18B, without correcting the perspective to look through the screen, a user will observe the object 1802 through the device 1800, and the annotation 1804 will be off to the right and not match the observed position of the object 1802 through the screen.

To properly modify the annotation to match up with the view of the object through the screen, the position of the user's face relative to the screen may be determined. For example, one way to implement this is with cameras positioned around the edge of the device. A power setting may be selected that dictates what sensors are used. More sensors result in higher battery use but better positional tracking. In other words, various sensor combinations can be used to get better readings at the expense of battery usage. The coordinate of the head position relative to the physical center of the device in the X, Y, and Z axis, in millimeters (or any other unit), may be determined. In addition, information about the head inclination angle (the sideways inclination of the head relative to the device), whether a face is detected, and whether the system is tracking the head position may be obtained.

While any type of coordinate correction can be implemented, one example method would be to correct the perspective projection in modes such as transparent augmented reality modes using the position of the user's head relative to the screen as determined by head tracking sensors on the user's side of the device.

Once both the object position and the head position are obtained, correct perspective for annotations can be achieved. FIGS. 18C and 18D illustrate this graphically. With reference to FIG. 18C, the position of the object 1802 is determined to be Xo, Yo, Zo with sensors on device 1800, and the position of the user 1808 is determined to be Xu, Yu, Zu relative to the device 1800. The device can determine that object 1802 appears at position 1814 to the user located at position 1808. These values can be measured or determined as discussed elsewhere herein.

FIG. 18D shows the display of an annotation over an object corresponding to FIG. 18C. As shown in FIG. 18C, the annotation is then drawn on the screen of the device in the location where the line 1812 between the location of the object 1802 and the location of the user 1808 intersects the screen 2000. With reference to FIG. 18D, the resulting annotation 1804 appears over the object 2002 as viewed by the user at location 1808 through the screen 1800. In other words, the annotation 1804 is centered on location 1814.

V.E Far-Field Occlusion.

In instances where the location of the object 2002 is very far away from the device, the device may not be able to use its sensors to determine the distance or coordinates Xo, Yo, and Zo. One example of this may be when the device is pointed at a skyline. If a user is running an augmented reality application to show directions or a path to a destination through the skyline, the path may be rendered as an annotation over a building that the path should pass behind (i.e., the path should be occluded by the building).

As another example, if a pin is placed far away between two buildings and extends upward into the sky, the AR device will not know how to properly draw the annotation as it extends upward, because the device will render the pen annotation for its full length and not just for the portion of the annotation that extends upward above the closest building but in front of the further building. Alternatively, the phone will not know to render the occluded portion of the annotation differently such that the user is aware that the annotation is occluded.

To solve this problem, sensor data may be supplemented with a 3D model of the world and buildings such as those models available on Apple Maps or Google Earth. The relevant 3D models need not be displayed, and may only be used to calculate proper occlusion for annotations based on the current location and viewing angle of the device, head position of the user, etc.

V.F Device Activity Detection and Mode Selection.

Based on the sensors and spatial context of the device, it can operate the screen in various modes. In addition, aspects of the device can be changed based on the context of a specific activity.

For example, there may be a walking mode. In some forms of the invention it is determined that the user is walking based on motion processor. The device may determine that a user is walking and is in a congested area of a city. Once this is determined, the device may begin to operate the screen in private AR mode/unobstructed mode (private normal mode) so that the user can see what is in front of them while continuing to utilize their device to consume information privately without showing third parties that are walking the opposite direction.

As another example, there may be a driving mode. In some forms of the invention it is determined that the user is driving based on a motion processor. The device may also determine this based on device location corresponding to a road, for example. In addition, or alternatively, the activity determination may be based in whole or in part on distance to user's face, and face angle. If the device is on a dashboard, for instance, (based on distance and angle to user) and it is determined the user is driving, then the device may switch automatically into an automotive driving mode as a heads-up display (HUD) and display an appropriate user interface in any augmented reality or similar display mode.

VI. Device Form Factors.

The above-described technology can be incorporated into devices of any form factor. Some form factors may include any of, or any combination of the following: a phone that is fully transparent, a phone that is partially transparent, a phone with a front display, a phone with a front and a rear display, a phone with orientation detection, a phone with augmented reality display, a phone that acts as a heads-up display, a phone that implements any of the features described with reference to tablets, laptops, or other types of form factors, a tablet with any of the features of the phone described above, a laptop that can be configured in various configurations described herein, a double sided display, an ultra-wide display, a virtual or augmented reality device, a flexible display, or any other type of form factor or combination of form factors. For form factors that implement both augmented reality and virtual reality, the shutter element on the back panel (away from head) is made opaque so that it is not see through when in virtual reality mode but can be made transparent for unobstructed or augmented reality applications.

The form factors may implement any type any number of elements discussed herein. For example, single element form factors may incorporate one SDS or DSD (or any other combination of D and S elements) display panels. As another example, dual element form factors may incorporate two or more SDS or DSD (or any other combination of D and S elements) display panels. In addition, as depicted, form factors may incorporate one or more flexible panels instead of hinged flat panels.

VI.A Form Factor: Single Element.

With reference to FIGS. 16A and 16B, one form factor is a device that incorporates a display panel 1602 in a bar, panel, or tablet form factor and configuration. The device includes a main body 1600 and sensors 1604 and 1606. Sensors 1604 and 1606 are cameras but may be any type of sensor, and additional sensors may be present on the device. Devices of this form factor may incorporate any of the inventive display elements and display modes discussed above.

A Normal Mode.

With reference to, for example, FIGS. 3C, 3G, 5A, 5B, 7A, 7B, 4B, 4P, 6A, 6B, 8A, and 8B, the device can drive the display in normal mode. Normal mode may be used for various applications that run on the device. The device or applications may change the display to this mode based on heuristics, a user selected function and/or based upon sensor input. For example, if it is detected that the device is in use, the device may wake from sleep mode if applicable and activate any display mode. If normal display mode is activated, the device may determine the orientation of the phone either relative to gravity or relative to the user's face, and display the primary user interface on the appropriate side of the transparent display panel for the primary user in the proper orientation relative to gravity or relative to the user's face while operating the AS elements and TD elements as described elsewhere herein.

A Presentation Mode.

With reference to, for example, FIGS. 3C, 3G, 5C, 5D, 7C, 7D, 4H, 6C, and 8C, the device can drive the display in presentation mode. Presentation mode may be used for various applications that run on the device. The device or applications may change the display to this mode based on heuristics, a user selected function and/or based upon sensor input. For example, if the user raises the device up so that the back is somewhat perpendicular to the horizon, the device may change to presentation mode. In addition, the device may sense if there is an observer on both sides of the device prior to changing to presentation mode. Generally, it may display a user-selected background image, branding, location based advertisements, or the like. Alternatively, presentation mode may be activated when a user runs an application. One example would be when the user runs a camera application. The camera application may operate the device operator side of the display to show a camera preview and camera controls, the camera application may operate the opposite side of the display to show a full screen preview of the photograph to be taken to assist the photograph subjects in posing for the photo. The camera application may only activate presentation mode when the device is both in picture taking mode and oriented substantially perpendicular to the horizon.

A Sharing Mode.

With reference to, for example, FIGS. 3C, 3G, 5C, 5D, 7C, 7D, 4H, 6C and 8C, the device can drive the display in sharing mode. Sharing mode may be used for various applications that run on the device. The device or applications may change the display to this mode based on heuristics, a user selected function and/or based upon sensor input. This is like presentation mode, but the back would display content that a user wishes to share with others. This may simply be a background image, pictures, or a display and controls multiplayer game. For example, a flash card type game may show the user on one side a clue while simultaneously showing a user on the other side the answer. The phone may use facial recognition to determine which player should see which card.

An Augmented Reality Mode.

With reference to, for example, FIGS. 3J 3L, 5E, 5F, 7E, 7F, 4C, 4O, 4K, 4M, 4A, 4E, 6D, 6E, 6F, 6G, 6H, 6I, 8D, 8E, 8F, 8G, 8H, and 8I, the device can drive the display in augmented reality mode. Augmented reality (or mixed reality) mode may be used for various applications that run on the device. The device or applications may change the display to this mode based on heuristics, a user selected function and/or based upon sensor input. This mode may be used for various applications that run on the device that desire to overlay information onto the real world. For example, if the user raises the device up so that the back is substantially perpendicular to the horizon, the device may change to augmented reality mode by driving the display screen and shutters as discussed elsewhere herein to overlay information or annotations onto the real world as viewed by a user of the device.

A Dual Sided Augmented Reality Mode or an Unobstructed Mode.

With reference to, for example, FIGS. 3C, 3K, 3G, 3B, 3H 5G, 5H, 5I, 5J, 5K, 7G, 7H, 7I, 7J, 7K, 4P, 4Q, 4B, 4H, 6J, 6K, 6L, 6M, 8J, 8K, 8L and 8M, the device can drive the display in a dual sided augmented reality mode (or an unobstructed mode). These modes may be used for various applications that run on the device. The device or applications may change the display to this mode based on heuristics, a user selected function and/or based upon sensor input. This mode may be used for various applications that run on the device that desire to overlay information onto the real world for users on either side of the device. The modes may also be used to allow a user to see information from one side of the device while providing a level of transparency so that the device screen does not completely occlude the user's view of someone on the other side of the device.

Virtual Reality Mode.

The device can drive the display in a virtual reality mode. This mode may be used for various applications that run on the device. The device or applications may change the display to this mode based on heuristics, a user selected function and/or based upon sensor input. For example, if the phone is put into a headset it may switch to a virtual reality mode. This mode may operate the display in normal mode when the virtual world is being displayed to the user. If the user is getting close to an object in the real world, as detected by sensors on the device or in the headset in communication with the device, the device may switch to an unobstructed (partially transparent) or a fully transparent mode to allow the user to see what is happening in the real world. The device may also be put into a sharing mode such that the user wearing the goggles sees a stereoscopic virtual reality rendering whereas someone on the outside of the goggles sees a conventional rendering of the view shown to the user. A headset may also be used with augmented reality modes. Furthermore, there may be additional optics between the screen and the user in forms of the invention utilizing augmented reality mode.

A single element device may be combined with another object to behave like a single element hinged device as discussed below. For example, a hinge, clip etc. may be used to couple a single element device with a wired or wireless connection to an input device or other object.

A single element device may also be combined with another single element device to behave like a dual element hinged device as discussed below. For example, a hinge, clip etc. may be used to couple a single element device with another single element device. Of course, two display elements may also be manufactured into a dual element device.

VI.B Form Factor: Single Element Hinged.

With reference to FIGS. 9A-9D, 9G-9J, and 10A-10D, one form factor is a hinged device that incorporates a multi-mode display panel. The device includes a main body and sensors devices of this form factor may incorporate any of the inventive display elements and display modes discussed above. A single element hinged device with an SDS display includes at least active shutter 102, transparent display 104, active shutter 106, and object 900 (such as a device body or keyboard). The SDS panel and object 900 are joined by hinge 902. A single element hinged device with a DSD display includes at least transparent display 202, active shutter 204, transparent display 206, and object 1000 (such as a device body or keyboard). The DSD panel and object 1000 are joined by hinge 1002.

VI.B.1 Upright Laptop Configuration.

With reference to FIGS. 9A (SDS screen), 9G (SD screen), and 10A (DSD screen), a single element hinged device may be placed into an upright laptop configuration. In such a configuration, the display elements may be operated in any state or combination of states, and/or the display may be operated in any of the modes discussed herein and with some examples provided below.

Upright Configuration—Normal Mode.

The device may drive the display in an upright normal mode. This mode may be used for various applications that run on the device. The device or applications may change the display to this mode based on heuristics, a user selected function and/or based upon sensor input. For example, in this mode, the panel may display an operating system desktop, launcher, or other application to the user of the device such that the user is able to see the user interface and operate or access the object 900 or 1000. An observer on the back side of the device may only see the active shutter element which obscures or blocks the reverse image of the display thus maintaining the user's privacy.

For purposes of illustration and without limitation, with reference to FIG. 9A, active shutter 102 is made opaque, transparent display 104 is configured to display an image in the correct orientation for a user to the right as depicted, and active shutter 106 is made transparent. For purposes of illustration and without limitation, with reference to FIG. 9G, active shutter 102 is made opaque, and transparent display 104 is configured to display an image in the correct orientation for a user to the right as depicted. For purposes of illustration and without limitation, with reference to FIG. 10A, transparent display 202 is inactive or made to display an image such as branding or a decorative image, active shutter 204 is made opaque, and transparent display 206 is configured to display an image of the desktop or user interface in the correct orientation for a user of the device to the right as depicted.

Upright Configuration—Presentation Mode or Sharing Mode.

The device may drive the display in an upright presentation or sharing mode. This mode may be used for various applications that run on the device. The device or applications may change the display to this mode based on heuristics, a user selected function and/or based upon sensor input. For example, in this mode, the panel may display an operating system desktop, launcher, or other application to the user of the device (to the right as depicted) such that the user is able to see the user interface and operate or access the object 900 or 1000. An observer on the back side of the device (to the left as depicted) may see the same image (but reversed to maintain correct orientation), or a different image (such as a decorative design for the lid, branding, advertisements, or an audience view instead of a presenter view). For example, a user of the laptop may run a PowerPoint presentation on the device. On one side of the device a presenter view with controls and notes is shown. On the other side of the device, a full screen version of the presentation (without controls or presenter notes) is shown. As another example, a game of "Battle Ship," "Risk" (with fog of war) or another game where each user has a different display of the application state. Each side of the device may show a different image of the game board tailored to each user. As with any of the devices discussed herein, the display may also include touchscreen functionality on one or both sides. Where there is a touch screen capability both sides of the display, each user can operate each side of the screen independently.

Upright Configuration—Augmented Reality Mode.

The device may drive the display in an augmented reality mode as discussed herein. This mode may be used for various applications that run on the device. The device or applications may change the display to this mode based on heuristics, a user selected function and/or based upon sensor input.

Upright Configuration—Unobstructed Mode.

The device may drive the display in an unobstructed or dual sided augmented reality mode as discussed herein. This mode may be used for various applications that run on the device. The device or applications may change the display to this mode based on heuristics, a user selected function and/or based upon sensor input. For example, in one such mode, the screen appears opaque or translucent to an audience to maintain privacy but normal (optionally with some degree of transparency) to an operator so it does not block the operator from people on other side of screen but allows the operator to maintain privacy and use the device. As another example, in another such mode, the screen appears translucent to both parties while showing the same or a different image to both parties. This allows each party to see one another as well as information in a conference setting, or allows bi-directional augmented reality applications.

VI.B.2 Stand Configuration.

With reference to FIGS. 9B (SDS screen), 9H (SD screen) and 10B (DSD screen), a single element hinged device may be placed into a stand configuration. In such a configuration, the display elements may be operated in any state or combination of states, and/or the display may be operated in any of the modes discussed herein and with some examples provided below.

Stand Configuration—Normal Mode.

The device may drive the display in a stand normal mode. This mode may be used for various applications that run on the device. The device or applications may change the display to this mode based on heuristics, a user selected function and/or based upon sensor input. For example, in this mode, the panel may display an operating system desktop, launcher, or other application to the user of the device such that the user is able to see the user interface (from the left as depicted in FIGS. 9B and 10B). The user may operate the device with any input device including a touch screen user interface, or a wireless keyboard and/or mouse, pen, game controller, etc. This mode may be preferable for a user that wants to minimize the surface space required on a table or tray (e.g., when on an airplane) to watch movies or read documents.

For purposes of illustration and without limitation, with reference to FIG. 9B, active shutter 102 is made transparent, transparent display 104 is configured to display an image in the correct orientation for a user to the left as depicted, and active shutter 106 is made opaque. For purposes of illustration and without limitation, with reference to FIG. 9H, active shutter 102 is made opaque, and transparent display 104 is configured to display an image in the correct orientation for a user to the right as depicted. For purposes of illustration and without limitation, with reference to FIG. 10B, transparent display 202 is configured to display an image in the correct orientation for a user to the left as depicted, active shutter 204 is made opaque, and transparent display 206 is inactive, or may be active such as when the device is in an ambient light mode as discussed below.

Stand Configuration—Ambient Light Mode.

The device may drive the display in a stand ambient light mode. This mode may be used for various applications that run on the device. The device or applications may change the display to this mode based on heuristics, a user selected function and/or based upon sensor input. For example, in this mode, the panel may display an operating system desktop, launcher, video, movie or other application to the user of the device such that the user is able to see the user interface (from the left as depicted in FIGS. 9B and 10B). The user may operate the device with any input device including a touch screen user interface, or a wireless keyboard and/or mouse, pen, game controller, etc. This mode may be preferable for a user that wants to minimize the surface space required on a table or tray (e.g., when on an airplane) to watch movies or read documents. This mode may be desirable when a user is watching a movie in low light conditions and wishes to cast a light color behind the device to help set a mood when watching a movie etc.

For purposes of illustration and without limitation, with reference to FIG. 9B, at a first time, active shutter 102 is made transparent, transparent display 104 is configured to display an image in the correct orientation for a user to the left as depicted, and active shutter 106 is made opaque. At a second time, active shutter 102 is made opaque, active shutter 106 is made transparent, and transparent display 104 is configured to display a color as to illuminate the area behind the device (to the right as depicted) as viewed by the user. The color may be any color or combination of colors as to project an ambient light color. This process would then repeat quickly at a rate such that the user of the device does not perceive the flickering. For purposes of illustration and without limitation, with reference to FIG. 10B, transparent display 202 is configured to display an image in the correct orientation for a user to the left as depicted, active shutter 204 is made opaque, and transparent display 206 is configured to display a color or combination of colors to illuminate the area behind the device.

Stand Configuration—Augmented Reality Mode.

The device may drive the display in a stand augmented reality mode. This mode may be used for various applications that run on the device. The device or applications may change the display to this mode based on heuristics, a user selected function and/or based upon sensor input. For example, in this mode, the panel may display an operating system desktop, launcher, video, movie or other application to the user of the device such that the user is able to see the user interface (from the left as depicted in FIGS. 9B and 10B). The user may operate the device with any input device including a touch screen user interface, or a wireless keyboard and/or mouse, pen, game controller, etc. This mode may be used with table top games, CAD, or other data visualization software. Two devices may be networked so that two devices are showing same annotations in real world from different physical positions. For example, two players of a table top game are able to see the game board from different vantage points through two different devices placed on the table. The two devices are able to correlate anchor points on the table so that corresponding annotations can be displayed on each device from the proper angle.

In one implementation, with reference to FIGS. 9B and 10B, the screen is placed into a normal mode and sensors on the right side of the device (as depicted) are used to ascertain the scene and. With reference to FIG. 18A, the device 1800 determines the position of any objects 1802 (whether real or virtual objects or holograms that are being placed into reality). Then, the objects are displayed on the device at position 1810 using a normal display mode. With reference to FIG. 18B, the object 1802 is rendered on the opaque normal mode screen at location 1810.

In another implementation, with reference to FIGS. 9B and 10B, the screen is placed into an augmented reality mode and sensors on the right side of the device (as depicted) are used to ascertain the scene. Furthermore, sensors on the left side of the device (as depicted) are used to ascertain the location of the user. With reference to FIG. 18C, the device 1800 determines the position of any objects 1802 (whether real or virtual objects or holograms that are being placed into reality) and determines the position of the user 1808. Then, with reference to FIGS. 18C and 18D, real objects 1802 are visible through the screen at position 1814 or a virtual object at position 1802 may be rendered on the screen at location 1814 for a user at position 1808. If a real object is being annotated, then an annotation 1804 may be displayed with appropriate relationship to the object 1802 given the position of the user 1808 displayed on the device at position 1810 using a normal display mode.

Stand Configuration—Unobstructed Mode.

The device may drive the display in an unobstructed or dual sided augmented reality mode as discussed herein. This mode may be used for various applications that run on the device. The device or applications may change the display to this mode based on heuristics, a user selected function and/or based upon sensor input. For example, in one such mode, the screen appears opaque or translucent to an audience to maintain privacy but normal (optionally with some degree of transparency) to an operator so it does not block the operator from people on other side of screen but allows the operator to maintain privacy and use the device. As another example, in another such mode, the screen appears translucent to both parties while showing the same or a different image to both parties. This allows each party to see one another as well as information in a conference setting, or allows bi-directional augmented reality applications.

VI.B.3 Tent Configuration.

With reference to FIGS. 9C (SDS screen), 9I (SD screen) and 10C (DSD screen), a single element hinged device may be placed into a tent configuration. In such a configuration, the display elements may be operated in any state or combination of states, and/or the display may be operated in any of the modes discussed herein and with some examples provided below.

Tent Configuration—Normal Mode.

The device may drive the display in a tent normal mode. This mode may be used for various applications that run on the device. The device or applications may change the display to this mode based on heuristics, a user selected function and/or based upon sensor input. For example, in this mode, the panel may display an operating system desktop, launcher, or other application to the user of the device such that the user is able to see the user interface and operate or access the device.

For purposes of illustration and without limitation, with reference to FIG. 9C, active shutter 102 is made transparent, transparent display 104 is configured to display an image in the correct orientation for a user to the left as depicted, and active shutter 106 is made opaque. For purposes of illustration and without limitation, with reference to FIG. 9I, active shutter 102 is made opaque, and transparent display 104 is configured to display an image in the correct orientation for a user to the left as depicted. For purposes of illustration and without limitation, with reference to FIG. 10C, transparent display 202 is configured to display an image of the desktop or user interface in the correct orientation for a user of the device to the left as depicted, active shutter 204 is made opaque, and transparent display 206 is inactive, or may be active such as when the device is in an ambient light mode as discussed below.

Tent Configuration—Ambient Light Mode.

The device may drive the display in a tent ambient light mode. This mode may be used for various applications that run on the device. The device or applications may change the display to this mode based on heuristics, a user selected function and/or based upon sensor input. For example, in this mode, the panel may display an operating system desktop, launcher, video, movie or other application to the user of the device such that the user is able to see the user interface (from the left as depicted in FIGS. 9C and 10C). The user may operate the device with any input device including a touch screen user interface, or a wireless keyboard and/or mouse, pen, game controller, etc. This mode may be preferable for a user that wants to minimize the surface space required on a table or tray (e.g., when on an airplane) to watch movies or read documents. This mode may be desirable when a user is watching a movie in low light conditions and wishes to cast a light color behind the device to help set a mood when watching a movie etc.

For purposes of illustration and without limitation, with reference to FIG. 9C, at a first time, active shutter 102 is made transparent, transparent display 104 is configured to display an image in the correct orientation for a user to the left as depicted, and active shutter 106 is made opaque. At a second time, active shutter 102 is made opaque, active shutter 106 is made transparent, and transparent display 104 is configured to display a color as to illuminate the area behind the device (to the right as depicted) as viewed by the user. The color may be any color or combination of colors as to project an ambient light color. This process would then repeat quickly at a rate such that the user of the device does not perceive the flickering. For purposes of illustration and without limitation, with reference to FIG. 10C, transparent display 202 is configured to display an image in the correct orientation for a user to the left as depicted, active shutter 204 is made opaque, and transparent display 206 is configured to display a color or combination of colors to illuminate the area behind the device.

VI.B.4 Tablet Configuration.

With reference to FIGS. 9D (SDS screen), 9J (SD screen) and 10D (DSD screen), a single element hinged device may be placed into a tablet configuration. In such a configuration, the display elements may be operated in any state or combination of states, and/or the display may be operated in any of the modes discussed herein and with some examples provided below.

Tablet Configuration—Normal Mode.

The device may drive the display in a tablet normal mode. This mode may be used for various applications that run on the device. The device or applications may change the display to this mode based on heuristics, a user selected function and/or based upon sensor input. For example, in this mode, the panel may display an operating system desktop, launcher, or other application to the user of the device such that the user is able to see the user interface and operate or access the device.

For purposes of illustration and without limitation, with reference to FIG. 9D, active shutter 102 is made transparent, transparent display 104 is configured to display an image in the correct orientation for a user above the device as depicted, and active shutter 106 is made opaque but in some cases may be transparent. For purposes of illustration and without limitation, with reference to FIG. 9J, active shutter 102 is made opaque but in some cases may be transparent, and transparent display 104 is configured to display an image in the correct orientation for a user above the device as depicted. For purposes of illustration and without limitation, with reference to FIG. 10D, transparent display 202 is configured to display an image of the desktop or user interface in the correct orientation for a user of the device above the device as depicted, active shutter 204 is made opaque but in some cases may be transparent, and transparent display 206 is inactive but may be active in some cases. Alternatively, for purposes of illustration and without limitation, with reference to FIG. 10D, transparent display 202 is inactive and therefore transparent, active shutter 204 is made opaque but in some cases may be transparent, and transparent display 206 is configured to display an image of the desktop or user interface in the correct orientation for a user of the device above the device as depicted.

Tablet Configuration—2.5D/3D Mode.

The device may drive the display in a 2.5D or 3D mode. This mode may be used for various applications that run on the device. The device or applications may change the display to this mode based on heuristics, a user selected function and/or based upon sensor input. For example, in this mode, the panel may display an operating system desktop, launcher, or other application to the user of the device such that the user is able to see the user interface and operate or access the device. The desktop icons may be displayed on a screen closer to the user and other objects or images on the desktop may be displayed on a screen further from the user giving a 2.5 dimensional or 3-dimensional effect. In addition, the front facing cameras may track the user's face as discussed elsewhere to add a parallax effect where the objects on one screen move at a different rate than objects on another based on the movement and position of the user's head relative to the screen.

For purposes of illustration and without limitation, with reference to FIG. 10D, transparent display 202 is configured to display an image of a foreground layer of the desktop or user interface in the correct orientation for a user of the device above the device as depicted, active shutter 204 is made transparent, and transparent display 206 is configured to display an image of a background layer of the desktop or user interface in the correct orientation for a user of the device above the device as depicted.

Tablet Configuration—Tracing Mode.

The device may drive the display in a tablet tracing mode. This mode may be used for various applications that run on the device. The device or applications may change the display to this mode based on heuristics, a user selected function and/or based upon sensor input. For example, in this mode, the panel may display an operating system desktop, launcher, or other application to the user of the device such that the user is able to see the user interface and operate or access the device. The user can see through the screen to a physical document placed under the screen and above object 900 or 1000. The user can trace an illustration on the physical document on the top of the screen of the device.

For purposes of illustration and without limitation, with reference to FIG. 9D, a document is placed between object 900 and active shutter 106. Active shutter 102 is made transparent, transparent display 104 is configured to be inactive or display an image of a user interface in the correct orientation for a user above the device as depicted, and active shutter 106 is made transparent or partially transparent. For example, in forms of the invention where the active shutters have many pixels that correspond to the pixels of transparent display 104, the pixels of active shutter 106 that correspond to illuminated pixels of transparent display 104 may be opaque, while pixels of active shutter 106 that correspond to inactive (transparent) pixels of transparent display 104 are transparent. For purposes of illustration and without limitation, with reference to FIG. 9J, a document is placed between object 900 and active shutter 102. Active shutter 102 is made transparent, and transparent display 104 is configured to display an image in the correct orientation for a user above the device as depicted. For purposes of illustration and without limitation, with reference to FIG. 10D, a document is placed between object 1000 and transparent display 206, transparent display 202 is configured to display an image of the desktop or user interface in the correct orientation for a user of the device above the device as depicted, active shutter 204 is transparent, and transparent display 206 is inactive and therefore transparent. Alternatively, for purposes of illustration and without limitation, with reference to FIG. 10D, a document is placed between object 1000 and transparent display 206, transparent display 202 is inactive and therefore transparent, active shutter 204 is made transparent, and transparent display 206 is configured to display an image of the desktop or user interface in the correct orientation for a user of the device above the device as depicted. In any of the above or similar forms of the invention, a user of the device is able to see the document through the screen and may trace portions of the document using a touch screen, pen, or any other input device.

Tablet Configuration—Scanning Mode.

The device may drive the display in a tablet scanning mode. As noted throughout, while this is discussed with respect to one form of the invention, scanning mode can be used in other forms of the invention discussed throughout. This mode may be used for various applications that run on the device. The device or applications may change the display to this mode based on heuristics, a user selected function and/or based upon sensor input. For example, in this mode, the panel may display an operating system desktop, launcher, or other application to the user of the device such that the user is able to see the user interface and operate or access the device. The user can see through the screen to a physical document placed under the screen and above object 900 or 1000. Alternatively, a document can be placed face down onto the top of the device. The device can use the emissive display screen elements in a forward bias state to illuminate the document while other emissive display elements can be used in a reversed bias state to sense the reflected light as to digitally scan the document into the device.

For purposes of illustration and without limitation, with reference to FIG. 9D, a document is placed between object 900 and active shutter 106. Active shutter 102 is made transparent, transparent display 104 is configured to be inactive or display an image of a user interface in the correct orientation for a user above the device as depicted, and active shutter 106 is made transparent or partially transparent. For example, in forms of the invention where the active shutters have many pixels that correspond to the pixels of transparent display 104, the pixels of active shutter 106 that correspond to illuminated pixels of transparent display 104 may be opaque, while pixels of active shutter 106 that correspond to inactive (transparent) pixels of transparent display 104 are transparent. In this way, a user interface can be shown in conjunction with the view of the actual document. A user could, for example, draw a rectangle or other area over the document to scan. Once a scan begins, portions of the emissive display 104 are used to illuminate the document while other portions of emissive display 104 are used to sense the reflected light. For purposes of illustration and without limitation, with reference to FIG. 9J, a document is placed between object 900 and active shutter 102. Active shutter 102 is made transparent, and transparent display 104 is configured to display an image in the correct orientation for a user above the device as depicted in the same fashion as described with respect to FIG. 9D. For purposes of illustration and without limitation, with reference to FIG. 10D, a document is placed between object 1000 and transparent display 206, transparent display 202 is configured to display an image of the desktop or user interface in the correct orientation for a user of the device above the device as depicted, active shutter 204 is transparent, and transparent display 206 is inactive and therefore transparent. Transparent display 206 may be used to illuminate portions of the document while simultaneously scanning with other emissive display elements that are reverse biased. Alternatively, for purposes of illustration and without limitation, with reference to FIG. 10D, a document is placed bon transparent display 202 face down, transparent display 202 is inactive and therefore transparent or may display a user interface, active shutter 204 is made transparent, and transparent display 202 or 206 may be configured to display an image of the desktop or user interface in the correct orientation for a user of the device above the device as depicted or it may be inactive. Transparent display 202 is used to illuminate and scan portions of the document as described above with respect to other forms of the invention.

Scanning Operations.

Generally, the scanning operations described above are applicable to any form of display element, screen, device form factor, or device form factor configuration. As discussed above a user would place a document under a screen or place a document on a screen. The screen uses the emissive elements to scan the document or object and create digital reproduction. For example, with a document placed on a SDS screen, the active shutter closest to the document would be transparent, and the active shutter furthest from the document may be opaque. The transparent emissive display would then scan the document by reverse biasing some of the missive elements at any given time, and when done the device can correct the orientation of the digitized document image as necessary for display of the image to the user. With a DSD screen, the transparent display closest to the document may be used for scanning and the active shutter may be opaque.

Example Usage.

For purposes of illustration and without limitation, a user of a device may carry the device in tablet configuration in her purse. Upon receiving a phone call, she may answer the call using a user interface displayed on the screen in tablet configuration normal mode. See FIGS. 9D, 9J and 10D. After the call, the user may need to work on a power point presentation at a coffee shop. She sits down and opens the device so that it is now in a laptop configuration with a full keyboard 900 exposed and available to use. See FIGS. 9A, 9G, and 10A. While working on the presentation, the device is in normal mode so that other people at the coffee shop cannot see the presentation from the back side of her device. When it is time to present the information to a business associate, she can put the device into a laptop configuration and a sharing or a presenting mode. See FIGS. 9A, 10A. The business associate may see the full screen presentation on the back side of the device, while the user can see a presenter interface including notes and controls. After the presentation, the user takes some notes on paper and then operates the screen in scanning mode to digitize the information and save it on the device. When entering her car after the meeting, the user requests directions on the device in tablet configuration normal mode. After receiving the directions and showing a route preview overlaid on a map, the user adjusts the device so that it is in upright laptop or stand configuration. See FIGS. 9A, 9B, 9H, 10A, and 10B. The user places the device on her dashboard and starts driving. The device detects its configuration, that the user has started driving (based on, for example, a motion coprocessor) and that the user's face is a distance away indicating that the device should switch to an augmented reality mode. The device switches to an augmented reality mode and displays a highlighted path and other information to the user as she drives along the path.

Any Combination of Elements, Display Modes, Form Factors and Configurations are Contemplated.

Any of the modes discussed above or elsewhere herein may be used in any configuration. Many of the modes are discussed only with respect to certain device form factors and configurations and not duplicated throughout for brevity. However, it is contemplated that any mode or combination of element states can be used with any device in any configuration.

VI.C Other Single Element Form Factors.

With reference to FIGS. 9E-9F and 10E-10F, many other form factors are possible for devices incorporating a single multi-mode display panel. With reference to FIGS. 9E and 10E, one such device is an extra wide display. Extra wide displays may be incorporated into simulators, game cabinets, gaming devices, or any other type of device. With reference to FIGS. 9F and 10F, another such device is virtual or augmented reality glasses. Both types of devices are discussed in more detail below.

Other Form Factors—Extra Wide Display (SDS Screen).

With reference to FIG. 9E, an extra wide display may be constructed with a SDS display panel. The device contains a transparent display 104, active shutters 102 and 106, and mirrors 904 and 908. The display may be operated in a mode like presentation or sharing mode (see, e.g., FIGS. 5C, 5D, 7C and 7D) with the image that is displayed to the left being the left half of, for example, a panoramic image that is being displayed and the image that is displayed to the right being the right portion of the panoramic image. An observer looking at the extra wide display will observe the full panoramic image.

Other Form Factors—Extra Wide Display (DSD Screen).

With reference to FIG. 10E, an extra wide display may be constructed with a DSD display panel. The device contains an active shutter 204, transparent displays 202 and 206, and mirrors 1004 and 1008. The display may be operated in a mode like presentation or sharing mode (see, e.g., FIGS. 6C and 8C) with the image that is displayed to the left being the left half of, for example, a panoramic image that is being displayed and the image that is displayed to the right being the right portion of the panoramic image. An observer looking at the extra wide display will observe the full panoramic image.

Other Form Factors—Glasses (SDS Screen).

With reference to FIG. 9F, a pair of virtual reality or mixed reality glasses may be constructed with a single SDS display panel. For example, active shutter 102 is placed on the outside of the glasses, active shutter 106 is placed on the inside of the glasses, and transparent display 104 is placed between the two active shutters. There may be additional optics between the user and the screen in certain forms of the invention.

Alternatively, as discussed elsewhere herein, the single SDS display panel may have multiple shutter regions, or display regions. For example, with reference to FIG. 9F, active shutters 102 and 106 may each have separate regions for the right and left eyes (i.e., they may be split above the bridge of the nose into left and right active shutter elements.) The transparent display 104 can be operated in multiple modes simultaneously in different regions (such as in a left region and a right region) in coordination with one region (e.g., the right half) of active shutters 102 and 106, and another region (e.g., the left half) of active shutters 102 and 106. The right side and left side of the device may implement different display modes simultaneously or the same display mode but out of phase (e.g., 180 degrees out of phase). Still further, the device may be constructed with more than one SDS display panels (e.g., one per eye).

In an augmented reality mode, both active shutters 102 and 106 are transparent and transparent display displays an image in the correct orientation for a user of the glasses. In a private AR mode, wherein shutter 102 alternates between transparent and opaque states, and is opaque during the time that transparent display 106 displays an image to the user of the device. In this mode (or any other mode as discussed herein), the duration of time that transparent display 104 and active shutter 102 are opaque may be different from the duration of time that elements 102, 104, and 106 are substantially simultaneously transparent. In a virtual reality mode, active shutter 102 is opaque and active shutter 106 is transparent, or it may operate according to any of the combinations of element states discussed above. Transparent display 104 renders an appropriate image for the user of the device to provide a virtual reality experience to the user. There may also be operated in a sharing mode or presentation mode to substantially simultaneously display the virtual world to the wearer of the device, and a "regular" 2D rendering of the world, or other information about the game to an observer looking at the glasses on the wearer of the device (e.g., game map, game stats, player vitals, game logo, player name, player standing, etc.)

As another alternative, with reference to FIG. 9F, the device may be constructed with single SD or multiple SD display panels. For example, active shutter 106 may be eliminated from the device 906. In an augmented reality mode, active shutter 102 may be transparent or alternate between transparent and opaque as discussed above to maintain privacy of the information displayed on transparent display 104. In a virtual reality mode, active shutter 102 is opaque and transparent display 104 displays an image to the wearer of the device.

More generally, as discussed through the disclosure, any type number and combination of multi-mode displays may be used. Any of the element states for SDS or SD elements or any of the display modes discussed above for SDS or SD displays may be used with this form of the invention. This was said above, and need not be said further through this disclosure for any form factor or configuration or various form of the invention, but is done so here out of an abundance of caution.

Other Form Factors—Glasses (DSD Screen).

With reference to FIG. 10F, a pair of virtual reality or mixed reality glasses may be constructed with a single DSD display panel. Alternatively, as discussed elsewhere herein, the single DSD display panel may have multiple shutter regions, or display regions. Still further, the device may be constructed with more than one DSD display panels (e.g., one per eye).

With reference to FIG. 10F, a pair of virtual reality or mixed reality glasses may be constructed with a single DSD display panel. For example, transparent display 202 is placed on the outside of the glasses, transparent display 206 is placed on the inside of the glasses, and active shutter 204 is placed between the two transparent displays. In an augmented reality mode, at least one of the transparent displays 202 and 206 are displaying annotations according to one of the augmented reality modes described above and active shutter 204 is transparent. There may also be a private AR mode as discussed above. Alternatively, as discussed elsewhere herein, the single DSD display panel may have multiple shutter regions, or display regions. For example, active shutters 204 may have separate regions for the right and left eyes (i.e., it may be split above the bridge of the nose into left and right active shutter elements.) The transparent display elements 202 and 206 can be operated in multiple modes simultaneously in different regions (such as in a left region and a right region) in coordination with one region (e.g., the right half) of active shutter 204, and another region (e.g., the left half) of active shutter 204. The right side and left side of the device may implement different display modes simultaneously or the same display mode but out of phase (e.g., 180 degrees out of phase). Still further, the device may be constructed with more than one DSD display panels (e.g., one per eye).

Any of the element states for DSD elements and modes discussed above for DSD displays may be used with this form of the invention. This was said above, and need not be said further through this disclosure for any form factor or configuration or various form of the invention, but is done so here out of an abundance of caution.

VI.D Form Factor: Dual Element Hinged.

With reference to FIGS. 11A-11E and 12A-12E, one form factor is a device that incorporates two multi-mode display panels coupled by a hinge in a hinged device. The device includes a main body and sensors devices of this form factor may incorporate any of the inventive display elements and display modes discussed above. With reference to FIGS. 11A-11E, a dual element hinged device with two SDS displays includes at least on one of the display panels: an active shutter 102, a transparent display 104, an active shutter 106, and on the other display panel: an active shutter 1102, a transparent display 1104, and an active shutter 1106. The two SDS display panels are coupled by a hinge 1108. With reference to FIGS. 12A-12E, a dual element hinged device with a DSD display includes at least on one of the display panels: a transparent display 202, an active shutter 204, a transparent display 206, and on the other display panel: a transparent display 1202, an active shutter 1204, a transparent display 1206 (such as a device body or keyboard). The two display panels are coupled by a hinge 1208. With reference to FIGS. 17A-17B, some illustrations of an exemplary dual multi-mode display device 1700 is provided in a small tablet and large tablet configuration, respectively. A flexible display device may also behave in the same or analogous manner as a dual element hinged device as described herein, particularly when it is configured with multiple regions (e.g., at least one on each side of the bend in the screen).

The control electronics may be built into the hinge, a border around the screens, or placed discretely in the screen between the pixel elements such that they are imperceptible to the human eye. An inertial measurement unit (IMU) is built into each movable element so that the absolute and relative orientation of each element of the device can be ascertained and used to determine the configuration and context of the device in order to help choose a display mode and orientation. Alternatively, one IMU may be placed in the device at a known location, and a hinge position detector could be used to ascertain the device configuration and orientation.

VI.D.1 Upright Laptop Configuration.

With reference to FIGS. 11A (dual SDS screen), 12A (dual DSD screen), a dual element hinged device or flexible device (a device with a single flexible panel) may be placed into an upright laptop configuration. In such a configuration, the display elements may be operated in any state or combination of states, and/or the display may be operated in any of the modes discussed herein and with some examples provided below.

Upright Configuration—Normal Mode.

The device may drive one or both displays in a normal mode. This mode may be used for various applications that run on the device. The device or applications may change the display to this mode based on heuristics, a user selected function and/or based upon sensor input. For example, in this mode, the upright (or "top" screen) panel may display an operating system desktop, launcher, or other application to the user of the device such that the user is able to see the user interface and operate or access the other display screen that is horizontal (or the "bottom" screen). An observer on the back side of the device may only see the active shutter element of the top screen which obscures or blocks the reverse image of the display thus maintaining the user's privacy. The "bottom" panel may be in a normal mode, unobstructed mode, or any other mode and display a keyboard user interface to the user of the device.

For purposes of illustration and without limitation, with reference to FIG. 11A, active shutters 102 and 1106 are made opaque, transparent display 104 is configured to display an image (e.g., of a desktop or user interface) in the correct orientation for a user to the right as depicted, transparent display 1104 is configured to display an image (e.g., of a keyboard or input user interface) in the correct orientation for a user to the right as depicted, and active shutters 106 and 1104 are made transparent. For purposes of illustration and without limitation, with reference to FIG. 12A, transparent displays 202 and 1206 are independently either inactive or made to display an image such as branding or a decorative image, active shutter 204 is made opaque, active shutter 1204 is optionally made opaque, transparent display 206 is configured to display an image (e.g., of a desktop or user interface) in the correct orientation for a user of the device to the right as depicted, and transparent display 1202 is configured to display an image (e.g., of a keyboard or input user interface) in the correct orientation for a user of the device to the right as depicted. With either type of display element, the "bottom" panel may show a keyboard or other input interface, or it may show a second screen for content (e.g., when no user input is needed, or when it is when used with external input device such is keyboard, mouse or pen).

Upright Configuration—Presentation or Sharing Mode.

As described above with respect to other form factors (e.g., single element hinged), at least the top panel of a dual panel device may be placed in a presentation mode or sharing mode. The bottom panel may be placed in any mode.

Upright Configuration—Augmented Reality Mode.

As described above with respect to other form factors (e.g., single element hinged), at least the top panel of a dual panel device may be placed in an augmented reality mode. The bottom panel may be placed in any mode.

Upright Configuration—Tracing or Scanning Mode.

The device may drive the display in an upright tracing mode. This mode may be used for various applications that run on the device. The device or applications may change the display to this mode based on heuristics, a user selected function and/or based upon sensor input. For example, in this mode, the top panel may be operated in any mode. The bottom panel is operated in, for example, an "unobstructed" or augmented reality mode such that a paper can be placed underneath the display and traced with the touch screen, pen, mouse input, or any other input device. The bottom panel may also display some form of user interface over the object on the transparent display. Alternatively, as described elsewhere herein, either panel may be operated in a scanning mode.

Upright Configuration—Unobstructed Mode.

As described above with respect to other form factors (e.g., single element hinged), at least the top panel of a dual panel device may be placed in an unobstructed mode. The bottom panel may be placed in any mode. For example, the top panel may appear translucent to the audience of the device operator to maintain privacy of the data on the screen but appear normal or translucent to the device operator so that it does not block the operator from the audience on other side of screen. As another example, the top panel may appear translucent to both parties while showing image in the correct orientation on both sides so both parties can see each other and simultaneously observe the information on the display of the device.

VI.D.2 Stand Configuration.

With reference to FIGS. 11B (dual SDS screen) and 12B (dual DSD screen), a dual element hinged device may be placed into a stand configuration. In such a configuration, the top display and bottom display may be independently operated in any of the modes discussed herein and with some examples provided below.

Stand Configuration—Normal Mode.

The device may drive one or both displays in a normal mode. This mode may be used for various applications that run on the device. The device or applications may change the display to this mode based on heuristics, a user selected function and/or based upon sensor input. For example, in this mode, the upright (or "top" screen) panel may display an operating system desktop, launcher, video player or other application to the user to the left of the device as depicted. The "bottom" panel may be in an inactive mode, a normal mode, unobstructed mode, or any other mode.

For purposes of illustration and without limitation, with reference to FIG. 11B, active shutter 106 is made opaque and active shutter 102 is made transparent, transparent display 104 is configured to display an image in the correct orientation for a user to the left of the device as depicted, transparent display 1104 is inactive and active shutters 1102 and 1106 may be made transparent or opaque. For purposes of illustration and without limitation, with reference to FIG. 12B, transparent display 202 is made to display an image to a user to the left of the device as depicted, active shutter 204 is made opaque, and transparent display 206 may be inactive (or may be active in other modes such as ambient light mode). Active shutters 1204 is optionally made opaque or transparent, transparent display 1202 is to be inactive (or may be active in other modes such as ambient light mode) and transparent display 1206 is configured to be inactive. With either type of display element, the "top" panel may optionally show a keyboard or other input interface, or it may remove any displayed user input user interfaces (e.g., when no user input is needed, or when it is when used with external input device such as keyboard, mouse or pen).

Stand Configuration—Ambient Light Mode.

As described above with respect to other form factors (e.g., single element hinged), at least the top panel of a dual panel device in stand configuration (and optionally the bottom panel) may be placed in an ambient light mode. The bottom panel may be placed in any mode. For example, with reference to FIGS. 11B and 12B, either the top or the bottom panel may be operated in a presentation or sharing mode (see, e.g., FIGS. 5C, 7C and FIGS. 6A-6C, and 8A-8C). When the display casts light to the right of the device, the light may be an ambient light color that is determined to match the content displayed on the device as described above. When the display casts light the left of the device, it is the image to be displayed in a correct orientation for a user to the left of the device as depicted.

Stand Configuration—Augmented Reality Mode.

As described above with respect to other form factors (e.g., single element hinged), at least the top panel of a dual panel device may be placed in an augmented reality mode. The bottom panel may be placed in any mode.

Stand Configuration—Unobstructed Mode.

As described above with respect to other form factors (e.g., single element hinged), at least the top panel of a dual panel device may be placed in an unobstructed mode. The bottom panel may be placed in any mode. For example, the top panel may appear translucent to the audience of the device operator to maintain privacy of the data on the screen but appear normal or translucent to the device operator, so it does not block the operator from the audience on other side of screen. As another example, the top panel may appear translucent to both parties while showing image in the correct orientation on both sides so both parties can see each other and simultaneously observe the information on the display of the device.

VI.D.3 Tent Configuration.

With reference to FIGS. 11C (dual SDS screens) and 12C (dual DSD screens), a dual element hinged device may be placed into a tent configuration. In such a configuration, the top display and bottom display may be independently operated in any of the modes discussed herein and with some examples provided below.

Tent Configuration—Normal Mode.

The device may drive one or both displays in a normal mode in the tent configuration. This mode may be used for various applications that run on the device. The device or applications may change the display to this mode based on heuristics, a user selected function and/or based upon sensor input. For example, in this mode, the device may detect that the operator of the device is located to the left of the device as depicted using a camera (it may detect and recognize the logged in user's face using a left-facing camera), sensor, or by detecting which panel the user is interacting with via the user input device (via touch input on the left panel, wireless mouse movements that only make sense if the user was located on the left of the device, etc.). Alternatively, the device may determine that the known operator is to the left, and an unknown (or known audience user) is to the right and it may prompt the operator of the computer if it would like to switch to a presentation or other mode (this is applicable to all forms of the invention, form factors, and configurations). Once the user is determined to be to the left, the left panel may display an operating system desktop, launcher, video player or other application to the user to the left of the device as depicted in a normal display mode. The right panel may be in an inactive mode, a normal mode, unobstructed mode, or any other mode.

For purposes of illustration and without limitation, with reference to FIG. 11C, active shutter 1106 is made transparent and active shutter 1102 is made opaque, transparent display 1104 is configured to display an image in the correct orientation for a user to the left of the device as depicted. Transparent display 104 may be inactive and active shutters 102 and 106 may independently be made transparent or opaque. For purposes of illustration and without limitation, with reference to FIG. 12C, transparent display 1206 is made to display an image to a user to the left of the device as depicted, active shutter 1204 is made opaque, and transparent display 1202 may be inactive (or may be active in other modes such as ambient light mode). Active shutter 204 is optionally made opaque or transparent, and transparent display 206 is configured to be inactive (or may be active in other modes such as ambient light mode) and transparent display 202 is configured to be inactive (or may be active in other modes such as presentation mode or sharing mode). With either type of display element, either the left or right panel may optionally show a keyboard or other input interface to a user located to the left of or right of the device as depicted, respectively. In addition, the device may remove any displayed user input user interfaces (e.g., when no user input is needed, or when it is when used with external input device such is keyboard, mouse or pen).

Tent Configuration—Presentation or Sharing Mode.

As described above with respect to other form factors (e.g., single element hinged), the dual panel device may be placed in a presentation mode. For purposes of illustration and without limitation, with reference to FIG. 11C, active shutter 1106 is made transparent and active shutter 1102 is made opaque, transparent display 1104 is configured to display an image in the correct orientation for a user to the left of the device as depicted. Active shutter 106 is made opaque and active shutter 102 is made transparent, transparent display 104 is configured to display an image in the correct orientation for a user to the right of the device as depicted. For purposes of illustration and without limitation, with reference to FIG. 12C, transparent display 1206 is made to display an image to a user to the left of the device as depicted, active shutter 1204 is made opaque, and transparent display 1202 may be inactive (or may be active in other modes such as ambient light mode). Transparent display 202 is made to display an image to a user to the right of the device as depicted, active shutter 204 is made opaque, and transparent display 206 may be inactive (or may be active in other modes such as ambient light mode). With either type of display element, either the left or right panel may optionally show a keyboard or other input interface to a user located to the left of or right of the device as depicted, respectively. In addition, the device may remove any displayed user input user interfaces (e.g., when no user input is needed, or when it is when used with external input device such is keyboard, mouse or pen).

Tent Configuration—Ambient Light Mode.

In any mode, the dual screen device may be placed into an ambient light mode as discussed herein. In such a mode, the device will display an image outward to a user on the left and/or right of the device as depicted using the appropriate screen. When the device display modes allow for light to be transmitted downward toward the table, a color may be displayed that casts an ambient light color that corresponds to content being displayed on the screen.

Tent Configuration—Augmented Reality Mode.

As described above with respect to other form factors (e.g., single element hinged), the dual panel device may be placed in an augmented reality mode (see, e.g., FIGS. 3J, 3L, 4A, 4C, 4E, 4K, 4M, 4O, 4Q, 5E, 7E, 5F, 7F, 5G, 7G, 5H, 7H, 6D, 8D, 6E, 8E, 6F, 8F, 6G, 8G, 6H, 8H, 6I, 8I, etc.). The device may render augmented reality annotations that appear under the device to users that are located to the left and right of the device as depicted. A user to the left and a user to the right are shown an appropriate rendering of the scene underneath the tent configured device. This may be used for games or 3D entertainment such as a 3D recording of a play, or a movie that is rendered in 3D and played back to users. The users may rotate the device or the 3D playback as to change the perspective. Alternatively, both viewers can choose an independent viewpoint of their choosing. Of course, one display may operate in augmented reality mode and the other display may be inactive when there is only one user watching the augmented reality content.

Tent Configuration—Unobstructed Modes.

The device may drive the display in an unobstructed or dual sided augmented reality mode as discussed herein. The left and right displays may be placed in a transparent display mode as appropriate (see, e.g., FIGS. 3K, 4Q, 5G, 7G, 5H, 7H, 6J, 8J, 6K, 8K, 6L, 8L, 6M, 8M, etc.). The device or applications may change the display to these modes based on heuristics, a user selected function and/or based upon sensor input. For example, in one such mode, the device screens appear opaque or translucent to an audience to maintain privacy but normal (optionally with some degree of transparency) to an operator so it does not block the operator from people on other side of screen but allows the operator to maintain privacy and use the device. As another example, in another such mode, the screen appears translucent to both parties while showing the same or a different image to both parties. This allows each party to see one another as well as information in a conference setting, or allows bi-directional augmented reality applications.

VI.D.4 Small Tablet Configuration.

With reference to FIGS. 11D (dual SDS screen) and 12D (dual DSD screen), a dual element hinged device may be placed into a small tablet configuration by folding the device shut such that the device footprint is approximately the size of a single screen (plus bezel etc.). In such a configuration, the display elements may be operated in any state or combination of states, and/or the display may be operated in any of the modes discussed herein and with some examples provided below. All of the modes discussed below, and all of the modes discussed with any of the dual screen hinged form factors herein, may also be used with devices containing other combinations of displays such as a DSD-SD hinged device or a SDS-DS hinged device.

Small Tablet Configuration—Normal Mode.

The device may drive one or both displays in a normal mode in the tablet small configuration. This mode may be used for various applications that run on the device. The device or applications may change the display to this mode based on heuristics, a user selected function and/or based upon sensor input. For example, in this mode, the device may detect that the operator of the device is located on one side of the device in an orientation relative to the device as discussed elsewhere herein. Once the user's relative location is determined the appropriate normal display mode can be activated. For example, if the user is determined to be above the device as depicted, the top panel may display an operating system desktop, launcher, video player or other application to the user above the device as depicted in a normal display mode with appropriate orientation (portrait, landscape, right side up, upside down, etc.). The bottom panel may be in an inactive mode, a normal mode, unobstructed mode, or any other mode.

For purposes of illustration and without limitation, with reference to FIG. 11D, active shutter 102 is made transparent and active shutters 106, 1102 and 1106 are optionally and independently made opaque or transparent. Transparent display 104 is configured to display an image in the correct orientation for a user above the device as depicted. Transparent display 1104 may be inactive. For purposes of illustration and without limitation, with reference to FIG. 12D, transparent display 202 is made to display an image to a user above the device as depicted, active shutter 204 is made opaque, and transparent displays 206, 1202, and 1206 may be inactive.

Small Tablet Configuration—2.5D/3D Mode.

The device may drive one or both displays in a 2.5D or 3D display mode in the tablet small configuration. This mode may be used for various applications that run on the device to display multiple physical display layers to the user for a depth effect. The device or applications may change the display to this mode based on heuristics, a user selected function and/or based upon sensor input.

For purposes of illustration and without limitation, with reference to FIG. 11D, assuming the user is above the device active shutters 102, 106, and 1102 are made transparent and active shutter 1106 is made opaque. Transparent display 104 is configured to display a foreground image, and transparent display 1104 is configured to display a background image, both images are displayed in the correct orientation for a user above the device as depicted. For purposes of illustration and without limitation, with reference to FIG. 12C, assuming a user above the device, either transparent display 202 or 206 are made to display a foreground image to a user above the device as depicted, and transparent display 1202 or 1206 are made to display a background image to a user above the device as depicted. Alternatively, transparent displays 202, 206, 1202, and 1206 may display up to four layers of images to the user. Active shutters 204 and 1204 are independently made transparent or opaque as necessary to reveal the active transparent displays to the user above the device. For example, transparent displays 202, 206 and 1202 may display three layers of images to a user above the device and active shutter 204 is transparent and active shutter 1202 is made opaque. Transparent display 1206 may be inactive.

Small Tablet Configuration—Augmented Reality Mode.

As described above with respect to other form factors (e.g., single element hinged), the dual panel device may be placed in an augmented reality or multi-layer augmented reality mode (see, e.g., FIGS. 3J, 3L, 4A, 4C, 4E, 4K, 4M, 4O, 4Q, 5E, 7E, 5F, 7F, 5G, 7G, 5H, 7H, 6D, 8D, 6E, 8E, 6F, 8F, 6G, 8G, 6H, 8H, 6I, 8I, etc.).

Small Tablet Configuration—Tracing Mode and Scanning Mode.

The device may drive the display in a tablet tracing or scanning mode as described elsewhere herein.

VI.D.5 Large Tablet Configuration.

With reference to FIGS. 11E (dual SDS screen) and 12E (dual DSD screen), a dual element hinged device may be placed into a large tablet configuration by unfolding the device such that the hinge is open, and the device footprint is approximately the size of both screens (plus bezel etc.). In such a configuration, the display elements may be operated in any state or combination of states, and/or the display may be operated in any of the modes discussed herein and with some examples provided below.

Large Tablet Configuration—Normal Mode.

The device may drive one or both displays in a normal mode in the large tablet configuration. This mode may be used for various applications that run on the device. The device or applications may change the display to this mode based on heuristics, a user selected function and/or based upon sensor input. For example, in this mode, the device may detect that the operator of the device is located on one side of the device in an orientation relative to the device as discussed elsewhere herein. Once the user's relative location is determined the appropriate normal display mode can be activated. For example, if the user is determined to be above the device as depicted, the top face of each panel may display an operating system desktop, launcher, video player or other application to the user above the device as depicted in a normal display mode with appropriate orientation (portrait, landscape, right side up, upside down, etc.). The bottom face of each panel may be in an inactive mode, a normal mode, unobstructed mode, or any other mode.

For purposes of illustration and without limitation, with reference to FIG. 11E, active shutters 106 and 1102 are made transparent and active shutters 102 and 1106 are made opaque when the user is determined to be above the tablet as depicted. Transparent displays 104 and 1104 are configured to display an image in the correct orientation for a user above the device as depicted. For purposes of illustration and without limitation, with reference to FIG. 12E, transparent displays 206 and 1202 are is made to display an image to a user above the device as depicted, active shutters 204 and 1204 are made opaque, and transparent displays 202 and 1206 may be inactive.

Large Tablet Configuration—Augmented Reality Mode.

As described above with respect to other form factors (e.g., single element hinged), the dual panel device may be placed in an augmented reality or multi-layer augmented reality mode (see, e.g., FIGS. 3J, 3L, 4A, 4C, 4E, 4K, 4M, 4O, 4Q, 5E, 7E, 5F, 7F, 5G, 7G, 5H, 7H, 6D, 8D, 6E, 8E, 6F, 8F, 6G, 8G, 6H, 8H, 6I, 8I, etc.).

Large Tablet Configuration—Tracing or Scanning Mode.

The device may drive the display in a tablet tracing or scanning mode as described elsewhere herein.

VI.D.6 Dual Monitor Display or Book Configuration.

With reference to FIGS. 11A and 11E (dual SDS screen), and 12A and 12E (dual DSD screen), a dual element hinged device may be placed into a dual monitor display or book configuration by unfolding the device such that the hinge is substantially open and—for example—operated with the hinge vertical relative to the operator's face. In such a configuration, the display elements may be operated in any state or combination of states, and/or the display may be operated in any of the modes discussed herein and with some examples provided below. The objective is to provide a dual monitor display or a book configuration when held like a book Dual Monitor Display or Book Configuration—Normal.

When operating as a dual monitor display, at least one of the panels operate in a normal mode toward the user as described elsewhere herein. The panels will display content or a user interface toward the user of the device. In a book mode, the panels display book pages to a user toward the user.

Dual Monitor Display or Book Configuration—Presenting or Sharing Mode.

When operating as a dual monitor display, at least one of the panels operates in a presentation or sharing mode as toward the user as described elsewhere herein. The panels will display content or a user interface toward the user of the device. In a book mode, the panels may display a book cover when projecting light away from the user, or to save power the panes may not project light away from the user.

Dual Monitor Display or Book Configuration—Augmented Reality Mode.

When operating in augmented reality mode, at least one of the panels operates according to an augmented reality mode toward the user as described elsewhere herein.

Dual Monitor Display or Book Configuration—Tracing or Scanning Mode.

The device may drive at least one of the displays in a tracing or scanning mode as described elsewhere herein.

Dual Monitor Display or Book Configuration—Unobstructed Modes.

The device may drive at least one of the displays in an unobstructed mode as described elsewhere herein.

Example Usage.

For purposes of illustration and without limitation, a user of a device may carry the device in a small tablet configuration in her purse. See FIGS. 11D and 12D. Upon receiving a phone call, she may answer the call using a user interface displayed on the screen in a small tablet configuration and normal display mode. As she removes the device from her purse, the device determines based on the motion and sensor data the side of the device that the user will be most able to operate the relative orientation of the user. Based on this information, the user interface is drawn on one side of the device in an orientation appropriate for the user. See, e.g., FIGS. 13, 14, and 15. After the call, the user may need to work on a power point presentation at a coffee shop. She sits down and opens the device so that it is now in a laptop configuration. See FIGS. 11A and 12A. The device determines which display has been placed on the table and also determines the upward facing direction for that display. The device shows a software keyboard on the upward facing display of the horizontal double-sided display panel. While working on the presentation, the vertical panel is placed into a normal mode so that the user may work on the presentation without other people at the coffee shop being able to see the presentation from the back side of her device. Alternatively, the device may be in a sharing mode where the user is able to see her work, but third parties are only able to see a decorative image, logo, or advertisement on the back side of the vertical screen. After working for a while on her power point presentation, the user decides to read another chapter of a book. She opens a book reader application and selects a book to read. She then picks up the device and holds the hinge in her hand with screens to the left and right. The device senses this contextual change based on, for example, IMU sensor data and the indication the book application is running, and the device changes to book mode. Later, when it is time to present the information to a business associate, she can put the device into a laptop configuration and a sharing or a presenting mode. See FIGS. 11A and 12A. The business associate may see the full screen presentation on the back side of the device, while the user can see a presenter interface including notes and controls. During the presentation, the user needs to present some large images of blueprints, so she places the device into a large tablet configuration normal mode and passes the device to her business associate. See FIGS. 11E and 12E. Afterward, she goes back to her desk and places the device sideways on her desk with the hinge vertical and the screens slightly bent. The device pairs with a Bluetooth keyboard and mouse and begins operating in a dual monitor display configuration and normal mode.

VI.E Form Factor: Dual SD Hinged.

With reference to FIGS. 11A-11E and 12A-12E, the display panels used may be modified such that one or both panels are a SD or DS element, or any other combination of display element types. It is apparent from the above discussion of the element states, display modes, and form factors how one would modify the operation of the device with different element types and will not be repeated here for conciseness.

VII.F Apparatus for Holding the Multi-Mode Screen.

If a device is operated in mixed or augmented reality for extended periods of time while the user is holding the device at eye level, the user may become tired of holding the phone. In such instances, the device may be placed in an apparatus that can hold and position the phone with respect to the user.

For example, a stand has a base that is placed on a table (or a clamp that can be affixed to an object) coupled to an articulating arm which is also coupled to a holding device adapted to attach to the side of the screen of the mobile device (as to not obscure the view through the screen when the screen is operated in transparent or semi-transparent modes) may be used. The user may place the device into the holding device of such stand and position the stand on the table (or affix it to an appropriate object) and articulate the arm to obtain the desired view angle through the device without using their hands. For purposes of illustration and without limitation, a sailor in a regatta loads the race course into a sailing application on her mobile device with multi-mode screen and mounts the mobile in a holding device that is then attached to the deck of the boat. The sailor articulates the arm of the holding device to position the screen within her view of the area ahead of the boat. The mobile device is operated in an augmented reality mode so that it does not block the sailor's view of the course, and the mobile device displays annotations such as the course line and highlights the turn-point buoy to the user. To the extent the sailor's head moves substantially so that the view through the device no longer passes through the device to the course line, the device may change to a display mode that displays "left" or "right" instructions and information such as speed, wind direction and distance to next turn point to the sailor so that it continues to provide relevant information. Once the sailor's head is again positioned to look through the device, the device may switch back to an augmented reality display mode and user interface.

As another example, a head mount may be used to hold the device. This may be in the form of goggles (e.g. FIGS. 9F and 10F), or a hat or other head mounted apparatus that has material extending in front of the user's eyes with a holding device adapted to attach to the side of the screen of the mobile device (as to not obscure the view through the screen when the screen is operated in a transparent or semi-transparent mode). The mount is adapted to hold the mobile device far enough away from the user's eyes so that the user can see through the screen of the mobile device as well as focus on the annotations that are displayed on the screen of the mobile device.

VII. Applications.

There many applications can be written that take specific advantage of the inventive display elements, display modes, device form factors, and device configurations.

VII.A Apps: Dual-Sided.

Unique applications are possible that make use of the dual-sided aspects of the displays.

Personalizing Outer Surface of the Device.

In some forms of the invention, a device that incorporates a dual-sided display allows for a user to set up a digital image that appears on the outward facing surface of the device. For purposes of illustration and without limitation, a user may select a background image that is shown on the exterior "lid" or "back" of the device so that the user's device appears personalized to third parties that see the user working on the device. Similarly, a book application may display a book cover image on the outer display (facing away from the user).

Advertising on Mobile Device.

Still further, any application may add branding to the back of the device. For example, the device may superimpose a logo over the image that is displayed to brand the device (e.g., an Apple or Dell logo is placed over an image selected by a user to be displayed on the "back" of the screen). As another example, when running a particular application, the logo of the application may be displayed on the back of the device.

Location Based Advertising on Mobile Device.

Location based advertising may also be implemented. For example, devices with dual-sided displays may be used at a coffee shop. The coffee shop may cause the devices to display the logo of the coffee shop or another image (e.g., Snapchat QR code) as condition of using their Wi-Fi. Alternatively, an application or service running on the device may report this to an advertising exchange and provide the exchange with contextual information about the location of the device, the user of the device, etc. The exchange may determine the demographics of the establishment based on recorded data or real-time data. The exchange then may issue an advertisement to be displayed on the outside screen of the device.

Dual-Sided Camera Applications.

Camera applications utilizing the dual-sided displays can display a control user interface to the operator of the camera application, and on the "back" side of the device display an image preview to the subject of the photograph.

Advertising Applications on Store Display Device.

Store window displays can be configured to display different things to different people depending on the side from which viewed. For example, a screen can highlight things in a window display to people outside the store with augmented reality annotations such as highlights, boxes, arrows, messages, videos, etc. Instead of the shoppers in the store seeing the reverse/backward image of the annotations shown to those outside while shopping in the store, the display shows the correct orientation version of the image to the user's in the store. Alternatively, the display shows a different image that is more relevant to people that have already entered the store. For example, to the shoppers in the store signs and information can be displayed to help the shoppers navigate the store or provide decoration or ambience to the store. In forms of the invention, the window to the store still appears transparent/translucent so that the display does not completely block the view of the outside or inside of the store while images are being displayed. As another alternative, the shoppers in the store may have no information appear on the display so that the shoppers are not distracted from the other items in the store, while the potential shoppers outside the store are presented with information to draw them into the store.

Kiosk/Directory Applications.

Kiosks can utilize the dual-sided transparent screens to show an interactive map or application. A kiosk may be a screen placed in the middle of a walkway or a forum area of a public place such as a mall or public transit station. Users on both sides can independently use the applications available on the device to obtain information about tenants in a building or transportation options, for example. When nobody is using the kiosk on one side, the kiosk can appear substantially translucent or transparent from that side while displaying information to a user on the other side of the kiosk. If both sides are unused, the kiosk can appear substantially translucent or transparent from both sides. Thus, the device can "disappear" when it is not being used leaving the area feeling open and not closed off due to big display blocking all of the light or the view across an otherwise unobstructed area.

Game Applications.

Various gaming applications can utilize the dual-sided transparent displays to improve gameplay. For example, the game "Battleship" could be operated on a dual-screen laptop having two dual-sided transparent displays in a normal laptop configuration. During a first player's turn, on the horizontal display, the upward facing side of the display can show the positions of the first player's ships, and the locations where the second player has "hit" and "missed" the first player's ships. The bottom facing side of the horizontal display is on the table. On the vertical display, the "front" side facing the user shows where the first player has "hit" and "missed" the second player's ships. The "back" side of the display may show the second player: (i) where they have "hit" and "missed" the first player's ships, (ii) the locations of the second player's ships and where the first player has "hit" or "missed." The second player may be provided an option to select which view with a menu or other user interface element, or the various views may automatically alternate. After the first player's turn is over, the screens go blank and the computer is rotated 180 degrees in any axis (e.g., flipped away from the first user to the second by pushing the vertical screen away from the first user so that it becomes the horizontal screen; or simply rotating the computer to the left or right). An IMU in the device may determine that the device orientation has changed, and then display the game board to the second user in the same manner it was shown to the first as described above.

Alternatively, a game or application may be displayed on a single dual-sided transparent panel placed between two players/users. Each player/user is able to see their own game board, and during periods of the game portions of the screen may be transparent so that the players are able to see each other while other portions of the screen contain game elements. Each side of the screen may display different images as appropriate for each user, while portions of the screen appear transparent to both users. For example, the screen may be divided in to a top portion that is that is transparent and a bottom portion that has game or application elements.

For example, a casino card game may utilize a vertical dual-sided transparent display. The "front" of the display shows information to the player, while the back of the display shows information to the dealer. Optionally, there may be a horizontal display that shows a table top area where users may place bets or view game information. As another example, the vertical display may show information to the players on the back of the display and information to the dealer on the front of the display. The top of an optional horizontal display may show additional information to the dealer. While playing cards it is sometimes telling to be able to see the face of your opponents. Thus, portions of the screen between the players and dealer may be put into a transparent mode so that the user's can see one another. If a player wins a hand, an animation may be superimposed on the otherwise transparent area to provide a rewarding visual effect to the player.

VII.B Apps: Augmented and Virtual Reality.

As discussed above, the display in combination with various sensors to detect device context including device location (e.g., GPS, iBeacon, BLE, etc.), object location (e.g., Tango Platform, Image Recognition, etc.), user location relative to device (e.g., Omron Face Tracking), and user gaze tracking augmented reality applications are possible by which the user can see the world through the transparent or translucent screen while the screen displays annotations over real world objects.

Camera Application.

With reference to FIG. 19B, a camera application may utilize various aspects of the multi-mode display device 1900. For purposes of illustration and without limitation, in one form of the invention there may be no appreciable user interface on the photographer's side of the device. The device may direct the photographer to place his head so that the image viewed through the substantially transparent glass 1910 is the desired photo. The device measures the position of the user's head relative to the device to determine the bounds of the photo. Once the photo is taken, the digitized photo fades into view on top of the real-world image until the screen is in a normal mode showing the picture. The picture may once again fade away until the screen is once again in a transparent or augmented reality mode. In the same form or in different forms of the invention, a portion of the photographer's screen may operate in an augmented reality or a transparent mode 1910, while another portion operates in an unobstructed or normal mode showing camera controls 1908. In the same form or in different forms of the invention, if the photographer zooms in on a subject the display will transition from operating in a transparent mode to operating in a normal mode so that it can display a representation of the zoomed image as it would be captured. In the same form or in different forms of the invention, the reverse side of the device displays a preview image to the subject of the photo so that they are able to position themselves and ensure that their pose is satisfactory. Alternatively, the subject's side of the device may appear transparent or operate in any other mode. In the same form or in different forms of the invention, when the subject is being viewed in an augmented reality mode, the camera may annotate the real-world view such as by drawing a box around the scene to be captured or by indicating faces or other items within view. In the same form or in different forms of the invention, if the photographer's head is out of position, the camera may provide direction on how to move the device to get an improved viewing angle for the photograph.

Automotive/Airplane/Vehicle Applications.

Navigation and vehicular applications may utilize various aspects of the multi-mode display device. For purposes of illustration and without limitation, any form factor and configuration discussed herein (or otherwise) may be utilized. The mobile device may be placed in any configuration on the dashboard of a vehicle. Alternatively, the multi-mode displays may be built into the vehicle as part of the windshield (or canopy of some aircraft) or as a separate device such as a visor that may be moved or a display that is permanently affixed to the dashboard between the user and the windshield.

For purposes of illustration and without limitation, in some forms of the invention, the device displays valuable information relating to the vehicle as well as augmented reality annotations. In an aircraft the AR annotations may show course, airspace, glide ring (in aircraft), points of interest (e.g., airports, flat areas, terrain warnings, destination, other aircraft from ADS-B in). In some forms of the invention (preferably where the display is incorporated into a windshield or canopy), the vehicle is able to track the position of the sun and the specific location of the passengers in the vehicle (or the general location based on seat position and average head position). Based on this information, the vehicle can activate the active shutter components of the display to darken the windshield in just the locations where it will block the sun from the eyes of each passenger. The transparent display elements of the screen, and other portions of the screen, can continue to show annotations. For example, if the plane with the multi-mode screen windshield or canopy is flying generally toward the sun, and there is oncoming traffic coming toward the plane from the sun, the display may activate the shutters over the sun making a black circle or oval on the canopy and then draw a diamond with altitude difference indication within the black dot in the location of the oncoming traffic from the perspective of the pilot. This way, the pilot can see where the traffic should be (but would not be able to due to the brightness of the sun), and the pilot will not be blinded by the sun. While the illustrative example was given with respect to aircraft, this can be adapted and apply to any vehicular or non-vehicular application.

Other Augmented Reality Applications.

Other application may utilize various aspects of the multi-mode display device. Generally, devices operating in an augmented reality mode may be configured to show appropriate waypoints, points of interest, and other pertinent information based on the context of the device. For purposes of illustration and without limitation, in one form of the invention a hiking application may operate on a device in a tablet configuration. The device determines the direction of components of the gravity vector (g) as down toward the bottom of the device and also offset to an angle relative to the plane of the screen based on sensor readings. The device determines the direction of the normal vector (N) to the user and determines the orientation of the user's face. With reference to FIG. 13, the user's eye orientation is determined to be is horizontal up 1304, and the device is being held bottom down 1310, so the device is in portrait up to the top of the device mode 1312. With reference to FIG. 15, the device is able to determine that it is at position 1520 relative to the user's position at location 1500. Thus, the tablet configuration device begins displaying information in normal mode. This allows the user to operate the application to locate a hiking path. The device uses a location sensor and a wireless interface to query a database backend. The device receives information pertaining to hiking trails near the location of the user. Once the user arrives at the base of the trail, the user may raise the device to look at the trail in an augmented reality mode. The device determines the direction of components of the gravity vector (g) as down toward the bottom of the device and also substantially parallel to the plane of the screen based on sensor readings. The device determines the direction of the normal vector (N) to the user and determines the orientation of the user's face. With reference to FIG. 13, the user's eye orientation is determined to be is horizontal up 1304, and the device is being held bottom down 1310, so the device is in portrait up to the top of the device mode 1312. With reference to FIG. 15, the device is able to determine that it is at position 1522 relative to the user's position at location 1500. With reference to FIG. 19A, the device 1900 begins operating in an augmented reality mode. The user 1902 holds the device so 1900 and is able to look through the device at the trail. An augmented reality annotation 1904 is overlaid on or outlines the trail. Other information such as the distance of the hike, elevation or climb, and the number of hikers currently on the trail may also be displayed.

In forms of the invention, annotations relating to a real-world event may be overlaid on the game field based on the context of the phone and information from an external source. For purposes of illustration and without limitation, while watching football in real life a first down line in real life may be drawn on a football field utilizing an application. The application determines the user's position relative to the field based on an analysis of the shape of the field or based on location sensors. The device is then able to communicate wirelessly with a server that provides the current state of the sporting event and a listing of annotations that should be drawn with reference to the field. Based on the device sensors, and the information obtained from the server associated with the sporting event, the device is able to display annotations on the screen of the device in an augmented reality mode. As another illustrative example without limitation, an application written by a retailer may provide a user interface for a user to search for an item. The user may request directions to that item. Alternatively, in a mall the user may pull up a guide application and request directions to a specific store. The retailer or mall's physical location may be outfitted with an indoor positioning system. The phone is able to ascertain its location in the store. The phone can switch to an augmented reality mode and display a path to the item on the shelf, or a path through the mall to a store based on receiving a route or other information from a server associated with the retailer or mall.

In forms of the invention, an application may switch between different display modes based on a user's action. For purposes of illustration and without limitation, the device may annotate the night sky in an augmented reality mode. When the user pinches or stretches the screen to zoom the viewpoint, the device may switch from an augmented reality mode (See e.g., FIGS. 18C and D) to a normal mode where augmented reality is simulated using a camera and a screen (See e.g., FIGS. 18A and B). Other activities or ways of switching display modes are also possible using different heuristics (e.g., with reference to FIG. 15, raising the phone to positions 1522, 1524, 1510, 1512, or 1514 to switch to an augmented reality mode and lowering the phone to positions 1520, 1538, 1536 with respect to user 1500 to place the phone in a normal display mode) or user interface elements.

In forms of the invention, applications may utilize the multi-mode display to switch between display modes. For purposes of illustration and without limitation, a location-based augmented-reality video game on a device may have the premise that the user must hunt or collect ghosts that are present in the real world. You are the protagonist of the game, but can only see the ghosts in the real world when you look through your device when it is in augmented reality mode. The game may alert the user when they are near a ghost game character that is in the real world. When the user has the game open, the game may initially operate in a normal display mode when the user is in the menu system of the game, but when the game is in a state where the user is supposed to look for ghosts, the display mode may be programmatically changed to an augmented reality display mode. Alternatively, the display mode may change based on heuristics or a user interface object as discussed above.

Again, as noted throughout, the headings and examples are not limiting. Thus, the functionality described above with respect to any heading or example used to describe an application (i.e., vehicular, gaming, sporting, hiking, astronomy, etc.) is not limited to those types of applications and may generally be used with any application and any appropriate display device.

VII.D Messaging—Sharing Specialized Sensor Data.

Users that have specialized sensors or cameras (whether part of a mobile device or standalone) sometimes have a tough time sharing the data easily through a messaging application. For example, a user with a 360 or spherical camera must install a specialized application to use the camera to both take photos and view the resulting spherical image. Someone without the camera cannot view the image as an image sphere. A 2D representation may be sent of the image to other people through a messaging or email application, but the image will look distorted. To properly view the image, the recipient needs to download the distorted image and input it into a specialized viewing application.

In forms of the invention, mechanisms exist to facilitate sharing of specialized content such as spherical images. When the user wishes to share a spherical image that has been taken (or other specialized content that has been obtained), the data is uploaded to a server and a data URL is obtained. The user's device then generates a viewing URL by to a web-based viewing application for the specialized data. As part of the viewing URL to the viewing application, a parameter including at least a portion of the data URL. The viewing URL may be shortened into a short URL and then inserted into a message. The webpage associated with the viewing URL may contain metadata that allows the messaging app to show a preview of the information. A recipient of the short URL or viewing URL will be able to view the specialized data in a web browser in a format that is more understandable than looking at the data URL. In addition, a preview of the information may allow the recipient to touch the preview in a specific location of the preview image to jump to a specific viewing angle in the resulting viewer application. For example, with a spherical image, the preview may be the distorted 2D version of the image. The recipient may press on a particular person in the preview to launch the viewing URL with parameters that orient the resulting initial view at the particular person.

VII.E Messaging—Intelligent Group Chat Notifications.

In modern messaging applications such as iMessage on Apple brand devices, group messaging is possible whereby many people can send and receive text messages from a shared conversation thread. One problem with group messaging is that a subset of the group may have a conversation that isn't immediately relevant to every member of the group. Those group message participants that are not involved in a specific conversation occurring in a group message session are bombarded with notification after notification as each message is received.

Apple with iOS8 allows people to remove themselves from group texts. However, sometimes a user may only want to silence the alerts while remaining part of the conversation until it is relevant to the user again. In some instances, group messaging applications have a "do not disturb mode" that silences notifications from the conversation, but it can result in missed messages to the user if the user does not continue to monitor the thread. There needs to be a more intelligent way of notifying group chat members as to prevent excessive irrelevant notifications.

The invention is to allow group text recipients to "snooze" alerts on the group until someone sends a message in the group text with the name of the person or a nickname of the person in the body of the message. The user's phone can then make an available tactile or other signal to alert the user that the group text may once again be relevant.

For example, a family creates a group text with four members (mother, father, brother and sister). Three of the members are discussing an issue that is not relevant to the fourth member of the group. As an example, the brother is talking to the mother and father about an event he is going to. The sister can snooze the conversation to stop receiving text message alerts (but continues to receive the messages themselves).

After snoozing the father types a message with the sister's name, initials, or nickname, noun of direct address, or relationship to the group in the body of a message: "What does your sister think," "What does Maddy think," "Maddy," etc. The application or messaging server will then cause the sister to get a notification that her name was mentioned.

The "snooze" mode may also time out after a period of inactivity on the group message such that once the sub-conversation is done for a period of time (lull period) snooze will be removed from the sister's phone and any subsequent message including a general message will be notified to the whole group. For example, the lull period length may be determined based on a set period, or an average period between messages of a sub conversation, a clustering algorithm, or a neural network trained to determine clusters of conversations. As one example, if the sub conversation on average had messages every 30 seconds, then a time period longer than 30 seconds may be chosen as a snooze reset time for that conversation. A statistical analysis of the time between each message in a sub conversation can be done and only when there is a statistically considerable time delay between messages (e.g., 2 or 3 standard deviations) might the snooze be reset.

As another example, on a group chat with an extended family, a cousin may announce that a television show that they have been working on is going to air during the week. Others may respond to the cousin asking about some particulars with respect to the show. Group chat participants that are not immediately responding may elect to snooze notifications until a later time so that they can review the messages later but not be interrupted as the messages are received.

For purposes of illustration and without limitation, there is a group chat with five members, Alfred, Betty, Curtis, David and Emily. Alfred sends message & everyone notified that Alfred sent message to the group chat. Betty responds to Alfred in the group chat. In one form of the invention everyone is notified. In another form of the invention, because Betty responded within a brief time to Alfred, only Alfred is notified but everyone in the group chat is able to see the response. In yet another form of the invention, Betty uses a noun of direct address that is mapped to Alfred, and because the message was directed to Alfred only Alfred receives a notification even though it was sent to the group message thread.

For purposes of illustration and without limitation, in forms of the invention, while there is an active conversation the non-participants are notified after a time delay that several people are chatting. In forms of the invention, non-participants are not notified unless mentioned by name. For example, Alfred & Betty are chatting, and Betty mentions Curtis using a noun of direct address associated with Curtis; as a result, Curtis will receive a notification.

Still further, the group messaging application may automatically determine that a "snooze" mode should be enacted based on the behavior of the user. For purposes of illustration and without limitation, the messaging application may detect that the user viewed the group message thread or the notification of a message from the group thread and then changed the focus to a different application or ignored the notification. Based on the implicit disinterest, the messaging application can snooze notifications until a new conversation starts (after a lull in the conversation) or until the recipient is referred to by a noun of direct address associated with the recipient (i.e., "I wonder what David thinks about all of this?").

Furthermore, messaging applications are used more and more while people go about their daily lives. Often, people receive messages while they are busy and even when they are driving. Pressure to respond promptly may encourage people to make poor decisions about texting while they are busy. Increased transparency into the current activity of a potential message recipient may encourage message senders to refrain from sending messages until a recipient is free. Furthermore, messaging applications can intelligently suppress messages received while a user is busy until a user is able to safely turn their attention to responding to a message.

Using a motion processor chip, accelerometer, inertial measurement unit, and APIs such as Core Motion to integrate with a messaging application (e.g., iMessage, Hangouts, etc.), a current activity indicator can be associated with a user's account or phone number. The motion activity is shared with contacts either directly or through a central server, for example. Any method of information transfer may be used. For purposes of illustration and without limitation, contact names may have an indicator such as an emoji for walking, stationary, driving, driving (but stationary—at stop light, drive through, parking space), biking, biking (but stationary), etc. displayed adjacent to the contact name in a contact list or messaging application. A message sender can then decide whether to send a message based on the current activity reported by a recipient's device.

In some forms of the invention, the motion activity of the recipient may change the behavior of the sending device. For example: (1) if the recipient is walking, stationary, or driving (but stopped) the sender messaging app may behave as normal; (2) if the recipient is driving, the sender messaging app may prominently suggest calling, and/or warn that the user may not see the message until later; (3) alternatively, if the recipient is driving, the sender messaging app may queue the message for sending once the recipient messaging app indicates that the recipient is not driving (or is driving but stopped); (4) if the recipient is biking, the sender messaging app may behave as normal, or it may warn the sender that the recipient may not see the message until later. Any combination of the above states with the above actions may be implemented.

In some forms of the invention, the motion activity of the recipient may change the behavior of the receiving phone as well. For example: (1) if the recipient is walking, stationary, or driving (but stopped) the recipient messaging app may behave as normal; (2) if the recipient is driving, the recipient messaging app may defer a notification of a new message until the recipient is driving (but stopped), stationary, or walking, or generally not driving; (3) if the recipient is biking, the recipient messaging app may behave as normal, or it may defer a notification of a new message until the user is biking (but stopped stationary), stationary, or walking. Any combination of the above states with the above actions may be implemented.

VII.F Messaging—Sharing References to Content Encountered in the Real World.

On occasion, users of mobile devices encounter compelling content in the real world such as a song playing on the radio, or a video clip of the news or a funny segment from a broadcast television show. In some instances, the user would like to share the content with a friend or family member, but it is too time consuming for the user to track down a reference to the content. The user may message the friend or family member that they saw something that was relevant to the friend, but the friend may not be able to see the content due to the difficulty and uncertainty of being able to find the content based on the user's description. Content producers miss out on the opportunity to obtain more viewers or listeners for their content.

To solve this problem, content may be embedded with sub-audible tones or visual identifying symbols to facilitate sharing of the content. For example, music or video content may have a sub-audible tone that is detectable by a mobile device but that cannot be heard by humans. The sub-audible tone encodes an identifier of the content, and that changed for: each song that is played, scene of a TV show, news story on a news broadcast, etc. Alternatively, video news segments may include a QR code in the bottom of the screen that changes by the segment and links to the broadcasted segment on an internet accessible website or video sharing site (e.g., YouTube). The tone, QR code, or other identifier may encode a URL, or a reference number, string, hash or other identifier that can be used to obtain the URL or other address of the content.

In addition, metadata associated with the content (e.g., Source: TV, Radio, Movie, etc.; Author Name; Show Title, Channel, Subject, Category, Duration, Date, Time, Keywords, Segment or Clip Name, Tags, Hashtags, etc.) may be included in the sub-audible information, QR code, or may be accessible from a remote server using the information in the reference identifier. The metadata may be used by a messaging application to intelligently present the identifier for sharing based on the subject matter of the conversation.

For purposes of illustration and without limitation, the device determines a digital reference to the content the user is exposed to in the real world. First, the device may detect a sub-audible tone while the user is watching a television show. Alternatively, while watching TV, a user can aim the camera at the TV to detect a QR or other visual code. As another alternative, the phone may determine the reference to the content based a visual or audible fingerprint of the information or an artificial intelligence algorithm. Next, when the user is sending a message, the messaging application can access the stored data relating to real-world content to which the user has been exposed. The messaging application may have a content linking menu (e.g., a user interface similar to either an emoji keyboard, address book listing, or autocorrect menu that appears above the keyboard, etc.) that shows all current and recent content that the user has been exposed to. The listing may include a screenshot or animation of the video clip or a preview of a song reference. The application may also suggest the current or most recently detected content based on an analysis of a typed message. For example, if a user starts to draft a message and types "Turn on channel 15 . . . " "On the news . . . " the messaging application may suggest a list of recent content that was detected or may suggest a filtered list of recent content that was detected where the filtering is applied to limit the recent content references to those that relate to news programs or programs on channel 15. In addition, the device may also keep a history of content the user has been exposed to in the real world. This can be searched based a longer history of the content of a message and the reference suggested as the message is typed. To the extent, a mother creates a text message for her son and types "last week on Dr. Oz . . . ," the mother's phone is able to bring up a listing of the segments she was exposed to based on the name of the show and the date "last week." As the mom continues typing "last week on Dr. Oz he said something about low carb . . . " the lists is further filtered to limit the list to segments that relate to diet or carbohydrates. This filtering can be assisted with artificial intelligence and natural language processing algorithms. Once she sees the appropriate segment information, the mother selects the appropriate segment which is then inserted as an attachment or this link associated with the message. Instead of receiving a vague description with no way to easily view the content that is being discussed, the son is able to simply click the link to see the information his mother wanted to share.

In some forms of the invention, when the description in a text message is sufficiently detailed for the matching algorithm the device may automatically hyperlink the message. For example, if the mother wrote a message referring to a Cooking Segment on the Today Show with Hoda during the Last Hour of the show, the phone may automatically hyperlink the segment in the text message thread without mother having to select it from a contextual menu. The mother could choose to remove the hyperlink before sending by selecting a user interface element on the preview image that is inserted into the message.

Further, in some forms of the invention, a user can reveal a keyboard and have an option to insert a link or reference to the segment that is currently detected on a nearby TV, and the past segments that were aired on that show. Thus, a user that missed a segment of the show could go back and watch that segment, or if the user watched the segment but the phone did not detect a code then the user could still share the prior segment.

In some forms of the invention, a user can aim camera at QR or other visual code on TV to get a menu to appear with a list of current and prior segments that were associated with the airing of the show, so she can link to a past segment in a text message without having to try to find it on a web site.

In some forms of the invention, a menu on the device is able to continue watching a segment on their mobile device when they have to leave the viscinity of a television. For example, a user is sitting at table watching TV. TV broadcast has sub audible tone encoding an identifier or an address. The phone detects a sub-audible tone and determines address for the content. The phone then is able to display in a contextual menu that can be revealed or that presents itself. The user may pull up or down from an edge of the device to reveal the menu, or the menu may only appear during the period of time the sub-audible tone is being received from the phone. In some forms of the invention, the contextual menu may appear after detecting the sub-audible tone identifying a television show and there is a detected motion of the device from a motion processor. For purposes of illustration and without limitation, a user is sitting in front of a television watching a show that contains a sub-audible tone encoding an identifier or an address. The user's device detects the sub-audible tone and determines address for the content. When the user gets up leave, the device may display a message asking if the user wishes to "continue watching [content title] . . . " or "add the content to a continue watching list."

As those skilled in the art will appreciate, many aspects of the invention, and the various forms of the invention, can beneficially be practiced alone and need not be coupled together. Unless specifically stated otherwise, no aspect of the invention should be construed as requiring combination with another aspect of the invention in practice. However, those skilled in the art will also appreciate that the aspects of the invention may be combined in any way imaginable to yield one of the various forms of this invention. For purposes of illustration and without limitation, one form of the invention may consist only of display elements, while another form of the invention may comprise many display elements operating in different display states or modes, while another form of the invention may relate to a form factor and device configuration but not necessarily the display elements or applications, while another form of the invention may relate to an application that runs on a device, while yet another form of the invention includes any one or more of the features discussed above.

I claim:
1. A multi-mode dual-sided display element comprising:
a) a first active shutter;
b) a transparent display pixel; and,
c) a second active shutter;
wherein the first active shutter is independently electrically operable to transition between a substantially transparent state and a substantially opaque state,
wherein the second active shutter is independently electrically operable to transition between a substantially transparent state and a substantially opaque state,
wherein the transparent display pixel is substantially transparent and is independently electrically operable to transition between a state in which the pixel generates light and a state in which the pixel does not generate light, and wherein the first active shutter is placed on one side of the transparent display pixel and the second active shutter is placed on the opposite side of the transparent display pixel.

2. The multi-mode display element of claim 1, further comprising:
   a) an interface to a display controller configured to:
      i. instruct the first active shutter to transition to or maintain a substantially opaque state;
      ii. instruct the second active shutter to transition to or maintain a substantially transparent state; and,
      iii. instruct the transparent display pixel to generate light corresponding with an image that is to be displayed in the direction of the second active shutter.

3. The multi-mode display element of claim 1, further comprising:
   a) an interface to a display controller configured to:
      i. instruct the first active shutter to transition to or maintain a substantially transparent state;
      ii. instruct the second active shutter to transition to or maintain a substantially transparent state; and,
      iii. instruct the transparent display pixel to generate light corresponding with an image that is to be displayed in the direction of the first active shutter.

4. The multi-mode display element of claim 1, further comprising:
   a) an interface to a display controller configured to:
      i. instruct the first active shutter to transition to or maintain a substantially transparent state;
      ii. instruct the second active shutter to transition to or maintain a substantially transparent state; and,
      iii. instruct the transparent display pixel to transition to or maintain a state in which the transparent display pixel is not generating light.

5. The multi-mode display element of claim 1, further comprising:
   a) an interface to a display controller configured to:
      i. instruct the first active shutter to transition to or maintain a substantially opaque state;
      ii. instruct the second active shutter to transition to or maintain a substantially transparent state; and,
      iii. instruct the transparent display pixel to generate light corresponding with an image that is to be displayed in the direction of the second active shutter;
   b) the interface to the display controller configured to subsequently:
      i. instruct the first active shutter to transition to or maintain a substantially transparent state;
      ii. instruct the second active shutter to transition to or maintain a substantially opaque state; and,
      iii. instruct the transparent display pixel to generate light corresponding with an image that is to be displayed in the direction of the first active shutter.

6. The multi-mode display element of claim 1, further comprising:
   a) an interface to a display controller configured to:
      i. instruct the first active shutter to transition to or maintain a substantially opaque state;
      ii. instruct the second active shutter to transition to or maintain a substantially transparent state; and,
      iii. instruct the transparent display pixel to generate light corresponding with an image that is to be displayed in the direction of the second active shutter;
   b) the interface to the display controller configured to subsequently:
      i. instruct the first active shutter to transition to or maintain a substantially transparent state;
      ii. instruct the second active shutter to transition to or maintain a substantially transparent state; and,
      iii. instruct the transparent display pixel to transition to or maintain a state in which the transparent display pixel is not generating light.

7. The multi-mode display element of claim 1, further comprising:
   a) an interface to a display controller configured to:
      i. instruct the first active shutter to transition to or maintain a substantially opaque state;
      ii. instruct the second active shutter to transition to or maintain a substantially transparent state; and,
      iii. instruct the transparent display pixel to generate light corresponding with an image that is to be displayed in the direction of the second active shutter;
   b) the interface to the display controller configured to subsequently:
      i. instruct the first active shutter to transition to or maintain a substantially transparent state;
      ii. instruct the second active shutter to transition to or maintain a substantially transparent state; and,
      iii. instruct the transparent display pixel to transition to or maintain a state in which the transparent display pixel is not generating light;
   c) the interface to the display controller configured to subsequently:
      i. instruct the first active shutter to transition to or maintain a substantially transparent state;
      ii. instruct the second active shutter to transition to or maintain a substantially opaque state; and,
      iii. instruct the transparent display pixel to generate light corresponding with an image that is to be displayed in the direction of the first active shutter.

8. The multi-mode display element of claim 1, further comprising: an interface to a display controller of a folding mobile device that is configured to determine that the device is in a folded state based on a sensor input;
   wherein the face of the first active shutter faces outward from the device in the folded state, and the face of the second active shutter is contained within the device in the folded state;
   wherein, based at least in part on the display controller's determination that the folding mobile device is in the folded state:
      the first active shutter is configured to transition to or maintain a substantially transparent state;
      the second active shutter is configured to transition to or maintain a substantially opaque state; and,
      the transparent display pixel is configured to generate light corresponding with an image that is to be displayed in the direction of the first active shutter.

9. The multi-mode display element of claim 1, further comprising: an interface to a display controller of a folding mobile device that is configured to determine that the device is in an unfolded state based on a sensor input;
   wherein the face of the first active shutter faces outward from the device in the folded state, and the face of the second active shutter is contained within the device in the folded state;
   wherein, based at least in part on the display controller's determination that the folding mobile device is in the unfolded state:

the first active shutter is configured to transition to or maintain a substantially opaque state;
the second active shutter is configured to transition to or maintain a substantially transparent state; and,
the transparent display pixel is configured to generate light corresponding with an image that is to be displayed in the direction of the second active shutter.

10. A multi-mode dual-sided display element comprising:
a) a first transparent display pixel;
b) an active shutter; and,
c) a second transparent display pixel;
wherein the active shutter is independently electrically operable to transition between a substantially transparent state and a substantially opaque state,
wherein the first transparent display pixel is substantially transparent and is independently electrically operable to transition between a state in which the first pixel generates light and a state in which the first pixel does not generate light,
wherein the second transparent display pixel is substantially transparent and is independently electrically operable to transition between a state in which the second pixel generates light and a state in which the second pixel does not generate light, and
wherein the active shutter is placed in between the first and second transparent display pixels.

11. The multi-mode display element of claim 10, further comprising: an interface to a display controller of a folding mobile device that is configured to determine that the device is in an unfolded state based on a sensor input;
wherein the face of the first transparent display pixel faces outward from the device in the folded state, and the face of the second transparent display pixel is contained within the device in the folded state;
wherein, based at least in part on the display controller's determination that the folding mobile device is in the unfolded state:
the second transparent display pixel is configured to generate light corresponding with an image that is to be displayed in the direction away from the active shutter relative to the second transparent display pixel;
the active shutter is configured to transition to or maintain a substantially opaque state; and,
the first transparent display pixel is configured to transition to or maintain a state in which the first transparent display pixel is not generating light.

12. The multi-mode display element of claim 10, further comprising: an interface to a display controller of a folding mobile device that is configured to determine whether the device is in a folded state based on a sensor input;
wherein the face of the first transparent display pixel faces outward from the device in the folded state, and the face of the second transparent display pixel is contained within the device in the folded state;
wherein, based at least in part on the display controller's determination that the folding mobile device is in the folded state:
the first transparent display pixel is configured to generate light corresponding with an image that is to be displayed in the direction away from the active shutter relative to the first transparent display pixel.

13. The multi-mode display element of claim 10, further comprising:
a) an interface to a display controller configured to:
i. instruct the first transparent display pixel to generate light corresponding with an image that is to be displayed in the direction away from the active shutter relative to the first transparent display pixel;
ii. instruct the active shutter to transition to or maintain a substantially opaque state; and,
iii. instruct the second transparent display pixel to transition to or maintain a state in which the second transparent display pixel is not generating light.

14. The multi-mode display element of claim 10, further comprising:
a) an interface to a display controller configured to:
i. instruct the first transparent display pixel to generate light corresponding with an image that is to be displayed in the direction away from the active shutter relative to the first transparent display pixel;
ii. instruct the active shutter to transition to or maintain a substantially opaque state; and,
iii. instruct the second transparent display pixel to generate light corresponding with an image that is to be displayed in the direction away from the active shutter relative to the second transparent display pixel.

15. The multi-mode display element of claim 10, further comprising:
a) an interface to a display controller configured to:
i. instruct the first transparent display pixel to transition to or maintain a state in which the first transparent display pixel is not generating light;
ii. instruct the active shutter to transition to or maintain a substantially transparent state; and,
iii. instruct the second transparent display pixel to transition to or maintain a state in which the second transparent display pixel is not generating light.

16. The multi-mode display element of claim 10, further comprising:
a) an interface to a display controller configured to:
i. instruct the first transparent display pixel to generate light corresponding with a foreground image that is to be displayed in the direction away from the active shutter relative to the first transparent display pixel;
ii. instruct the active shutter to transition to or maintain a substantially transparent state; and,
iii. instruct the second transparent display pixel to generate light corresponding with a background image that is to be displayed in the direction towards the active shutter relative to the second transparent display pixel.

17. The multi-mode display element of claim 10, further comprising:
a) an interface to a display controller configured to:
i. instruct the first transparent display pixel to generate light corresponding with an image that is to be displayed in the direction away from the active shutter relative to the first transparent display pixel;
ii. instruct the active shutter to transition to or maintain a substantially opaque state; and,
iii. instruct the second transparent display pixel to transition to or maintain a state in which the second transparent display pixel is not generating light;
b) the interface to the display controller configured to subsequently:
i. instruct the first transparent display pixel to transition to or maintain a state in which the first transparent display pixel is not generating light;
ii. instruct the active shutter to transition to or maintain a substantially transparent state; and,
iii. instruct the second transparent display pixel to transition to or maintain a state in which the second transparent display pixel is not generating light.

18. The multi-mode display element of claim 10, further comprising:
   a) an interface to a display controller configured to:
      i. instruct the first transparent display pixel to generate light corresponding with an image that is to be displayed in the direction away from the active shutter relative to the first transparent display pixel;
      ii. instruct the active shutter to transition to or maintain a substantially opaque state; and,
      iii. instruct the second transparent display pixel to generate light corresponding with an image that is to be displayed in the direction away from the active shutter relative to the second transparent display pixel;
   b) the interface to the display controller configured to subsequently:
      i. instruct the first transparent display pixel to transition to or maintain a state in which the first transparent display pixel is not generating light;
      ii. instruct the active shutter to transition to or maintain a substantially transparent state; and,
      iii. instruct the second transparent display pixel to transition to or maintain a state in which the second transparent display pixel is not generating light.

19. The multi-mode display element of claim 10, further comprising:
   a) an interface to a display controller configured to:
      i. instruct the second transparent display pixel to generate light corresponding with an image that is to be displayed in the direction away from the active shutter relative to the second transparent display pixel;
      ii. instruct the active shutter to transition to or maintain a substantially opaque state; and,
      iii. instruct the first transparent display pixel to transition to or maintain a state in which the first transparent display pixel is not generating light;
   b) the interface to the display controller configured to subsequently:
      i. instruct the first transparent display pixel to transition to or maintain a state in which the first transparent display pixel is not generating light;
      ii. instruct the active shutter to transition to or maintain a substantially transparent state; and,
      iii. instruct the second transparent display pixel to transition to or maintain a state in which the second transparent display pixel is not generating light;
   c) the interface to the display controller configured to subsequently:
      i. instruct the first transparent display pixel to generate light corresponding with an image that is to be displayed in the direction away from the active shutter relative to the first transparent display pixel;
      ii. instruct the active shutter to transition to or maintain a substantially opaque state; and,
      iii. instruct the second transparent display pixel to transition to or maintain a state in which the second transparent display pixel is not generating light.

\* \* \* \* \*